United States Patent
Misaka

(10) Patent No.: US 7,449,285 B2
(45) Date of Patent: Nov. 11, 2008

(54) METHOD FOR FORMING PATTERN

(75) Inventor: Akio Misaka, Suita (JP)

(73) Assignee: Panasonic Corporation, Osaka (JP)

( * ) Notice: Subject to any disclaimer, the term of this patent is extended or adjusted under 35 U.S.C. 154(b) by 443 days.

(21) Appl. No.: 11/402,064

(22) Filed: Apr. 12, 2006

(65) Prior Publication Data

US 2006/0183033 A1    Aug. 17, 2006

Related U.S. Application Data

(62) Division of application No. 10/474,336, filed as application No. PCT/JP02/13466 on Dec. 24, 2002, now Pat. No. 7,060,398.

(30) Foreign Application Priority Data

Dec. 26, 2001    (JP)    ............................ 2001-393289

(51) Int. Cl.
    *G03C 5/00*    (2006.01)
(52) U.S. Cl. ...................... 430/322; 430/323
(58) Field of Classification Search ............ 430/5, 430/322, 323, 324, 394
    See application file for complete search history.

(56) References Cited

U.S. PATENT DOCUMENTS

| | | | |
|---|---|---|---|
| 5,302,477 A | 4/1994 | Dao et al. | |
| 5,429,896 A | 7/1995 | Hasegawa et al. | |
| 6,326,107 B1 | 12/2001 | Watanabe | |
| 6,593,033 B1 | 7/2003 | Ma et al. | |
| 6,803,155 B2 | 10/2004 | Dulman et al. | |

| | | |
|---|---|---|
| 2002/0177050 A1 | 11/2002 | Tanaka |

FOREIGN PATENT DOCUMENTS

| | | |
|---|---|---|
| GB | 2 269 915 A | 2/1994 |
| JP | 3-15845 A | 1/1991 |
| JP | 5-197130 | 8/1993 |
| JP | 6-289594 A | 10/1994 |
| JP | 9-269590 A | 10/1997 |
| JP | 10-48806 A | 2/1998 |
| JP | 2000-19710 A | 1/2000 |
| JP | 2000-267255 A | 9/2000 |
| TW | 454255 A | 9/2001 |
| WO | WO 03/062923 A1 | 7/2003 |

OTHER PUBLICATIONS

Japanese Office Action issued in corresponding Japanese Patent Application No. JP 2005-348362, dated Mar. 13, 2007.
Japanese Office Action issued in corresponding Japanese Patent Application No. JP 2005-347649, dated Mar. 13, 2007.
Hua-Yu Liu et al., "The Application of Alternating Phase-shifting Masks to 140 nm Gate Patterning (II): Mask Design and Manufacturing Tolerances", Optical Microlithography XI, SPIE-The International Society for Optical Engineering, vol. 3334, pp. 1-14, Feb. 25-27, 1998.

*Primary Examiner*—Stephen Rosasco
(74) *Attorney, Agent, or Firm*—McDermott Will & Emery LLP

(57) ABSTRACT

A mask pattern to be provided on a transparent substrate 2 includes a semi-light-shielding portion 3 which transmits exposure light in the same phase as that of the light-transmitting portion 4 and a phase shifter 5 which transmits exposure light in a phase opposite to that of the light-transmitting portion 4. The semi-light-shielding portion 3 has a transmittance which allows exposure light to be partially transmitted. The phase shifter 5 is provided in a region of the mask pattern in which light transmitted through the phase shifter 5 can cancel part of the light transmitted through the light-transmitting portion 4 and the semi-light-transmitting portion 3.

40 Claims, 30 Drawing Sheets

Fig. 2(a)
Semi-light-shielding portion
Opening
Fig. 2(b)
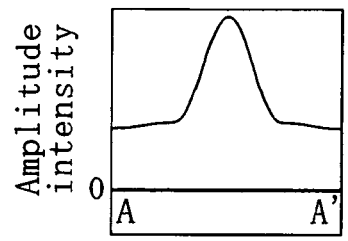
Fig. 2(c)
Complete-light-shielding portion
Phase shifter
Fig. 2(d)
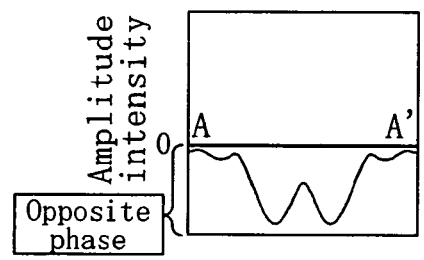
Opposite phase
Fig. 2(e)
Semi-light-shielding portion
Opening
Phase shifter
Fig. 2(f)
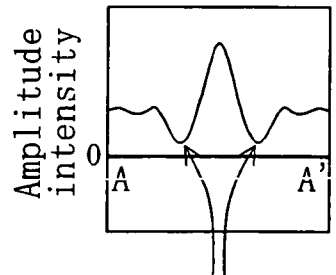
Cancellation of light by opposite phase light
Fig. 2(g)
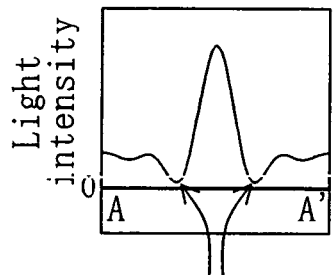
Dark portion generated by non-transparent function of phase shifter

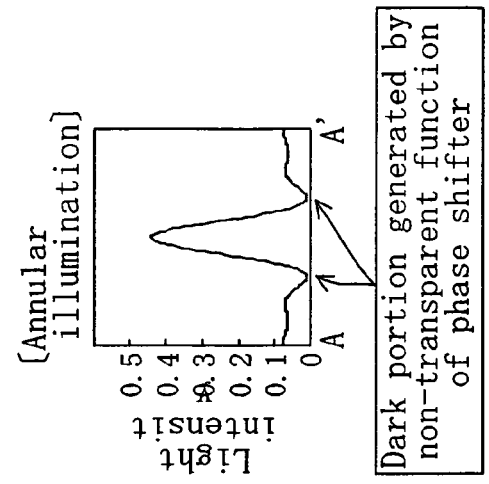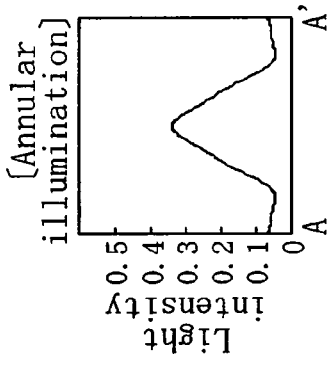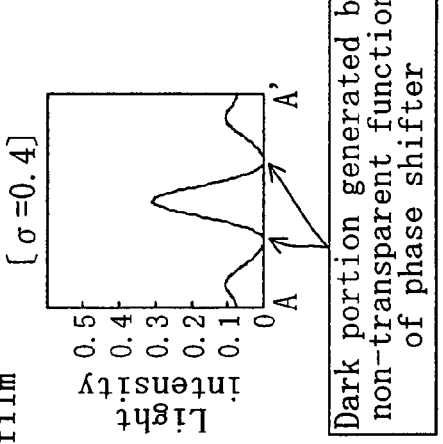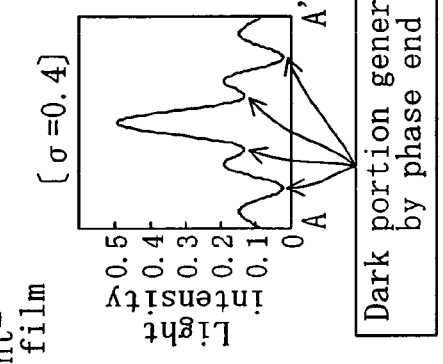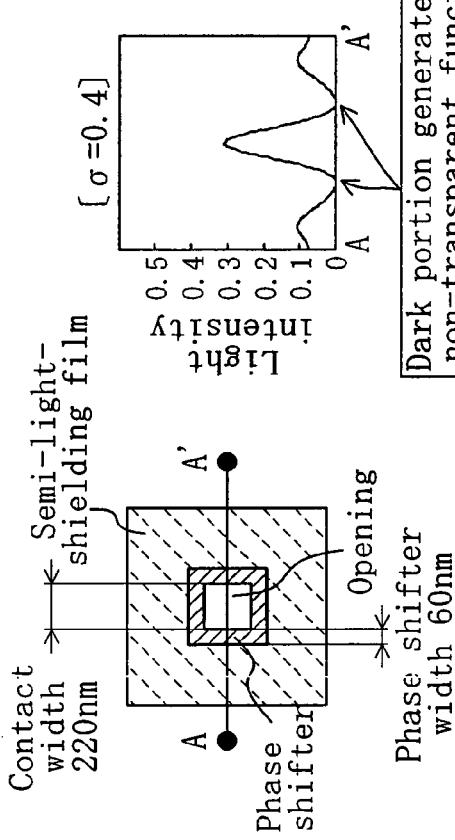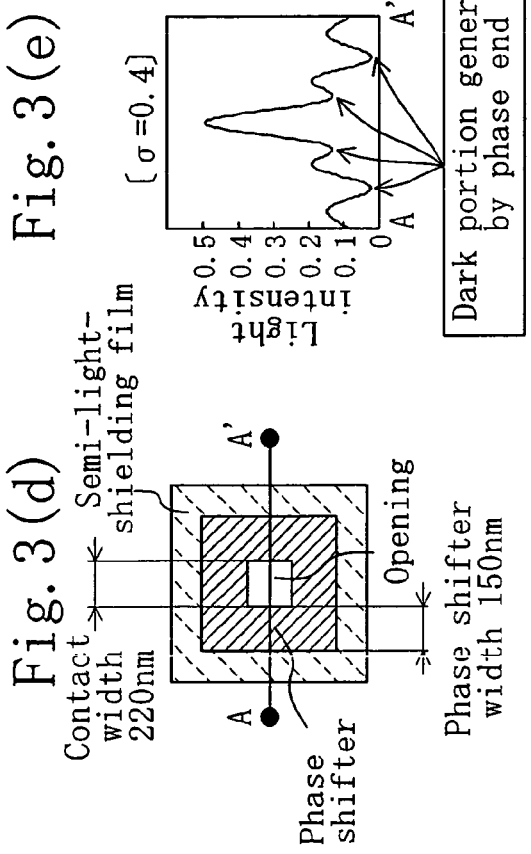

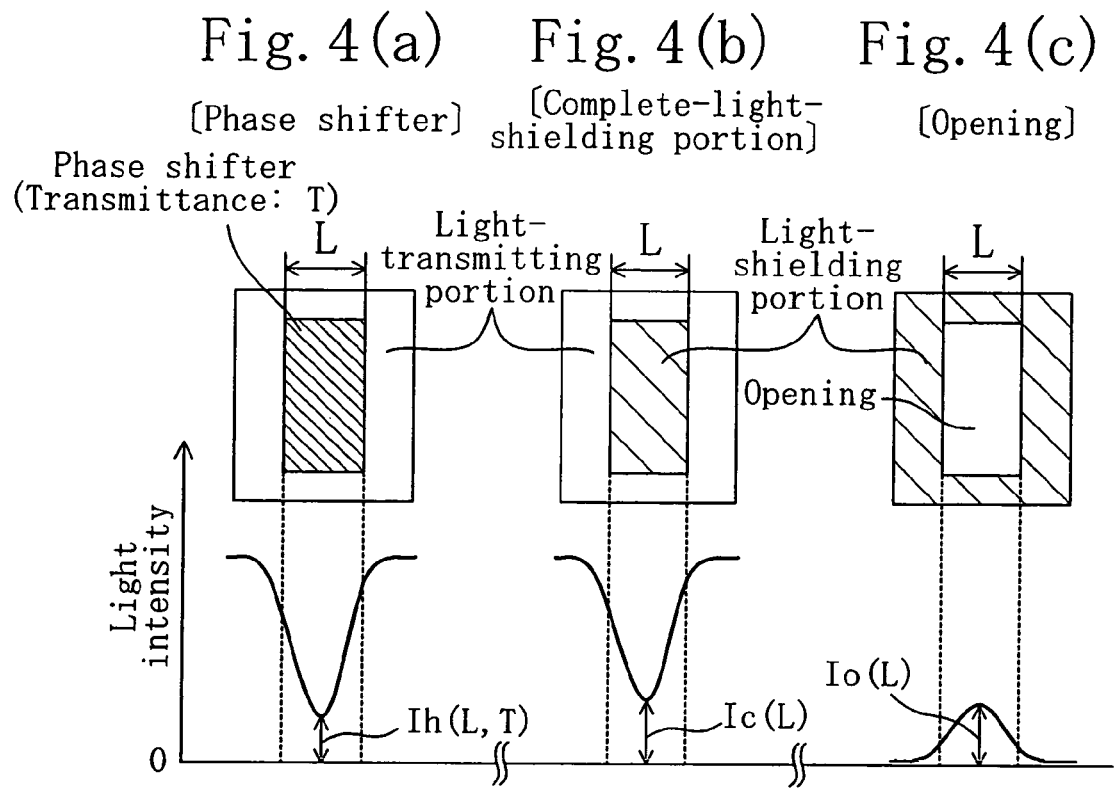
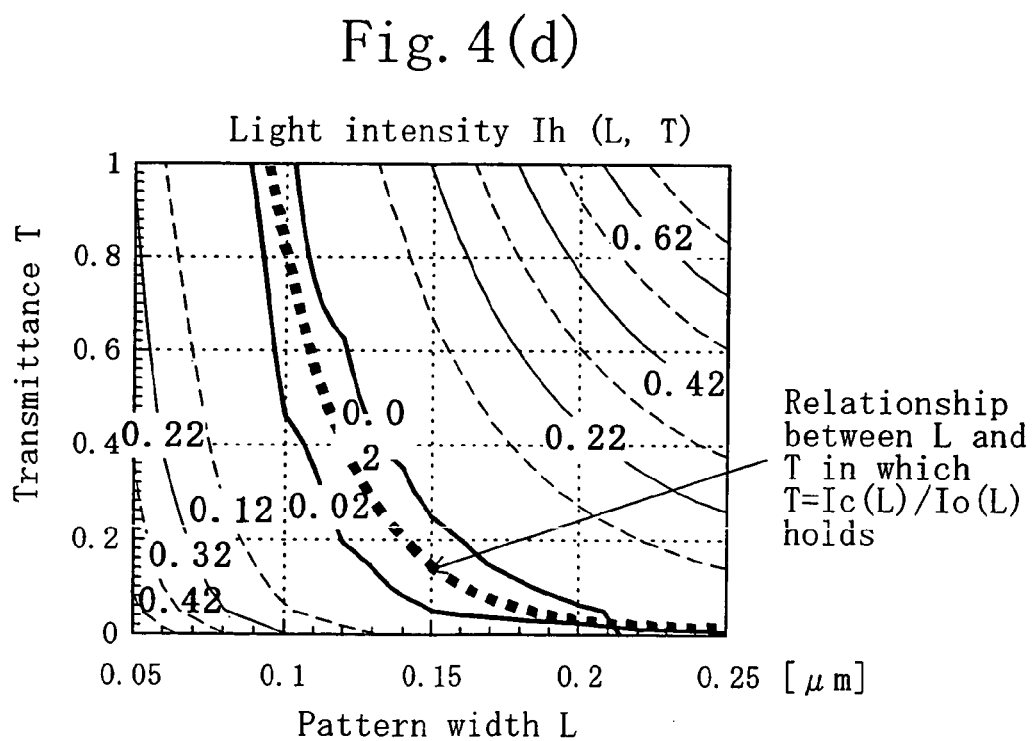

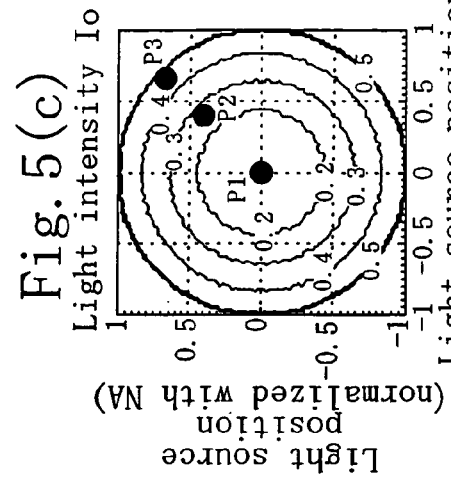
Fig. 5(a)
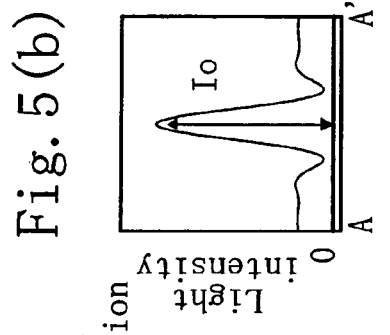
Fig. 5(b)
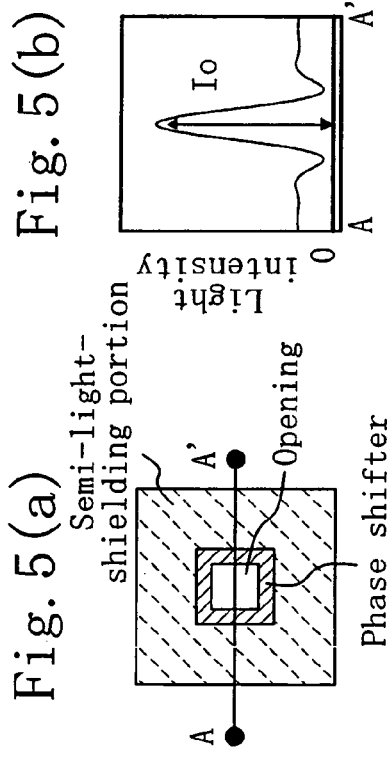
Fig. 5(c) Light intensity Io
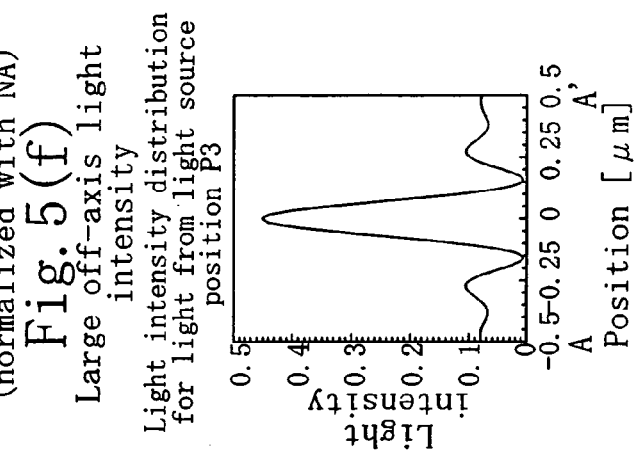
Fig. 5(d) Vertical light incidence
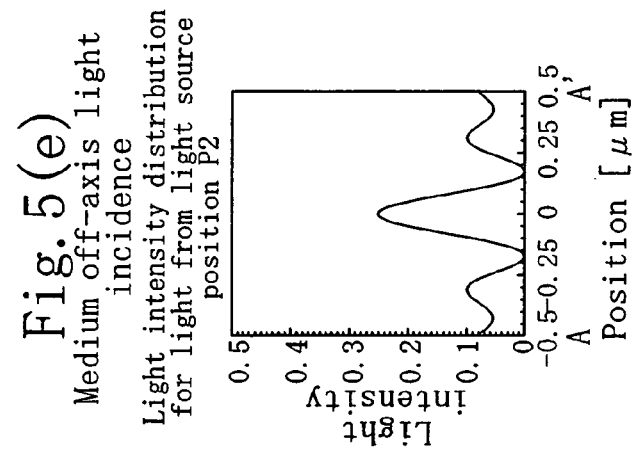
Fig. 5(e) Medium off-axis light incidence
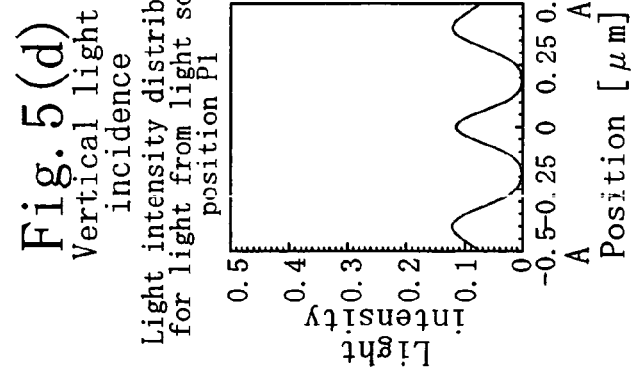
Fig. 5(f) Large off-axis light intensity

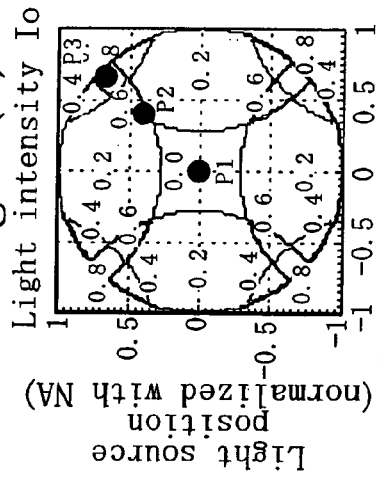
Fig. 6(a)
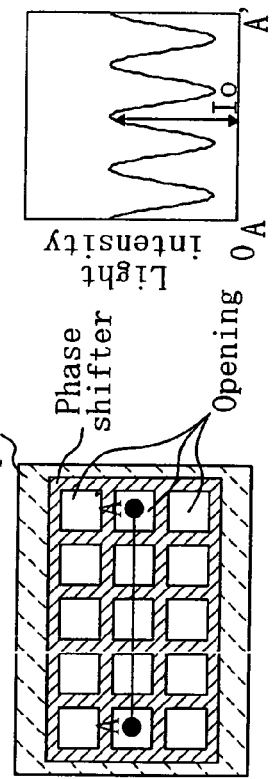
Fig. 6(b)
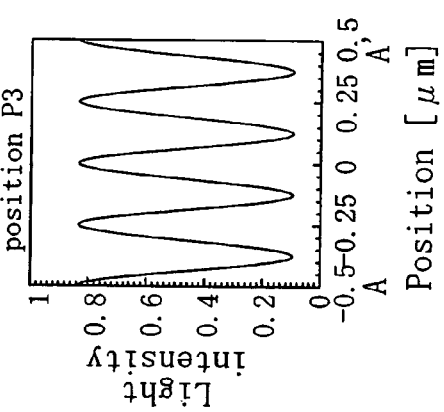
Fig. 6(c)
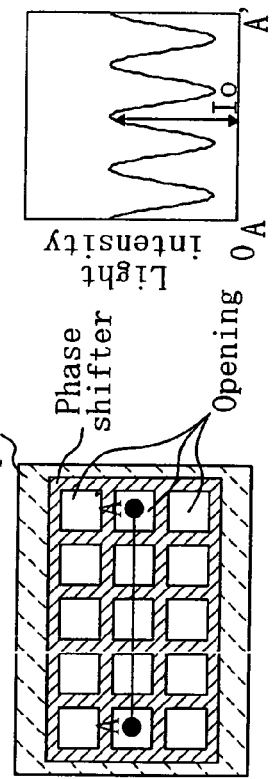
Fig. 6(d) Vertical light incidence
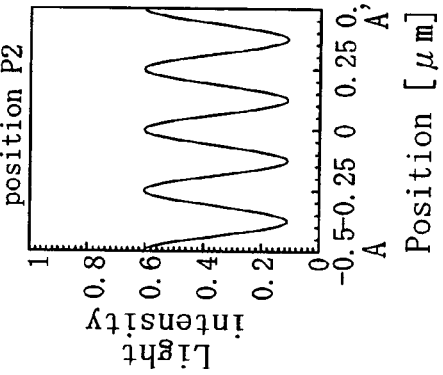
Fig. 6(e) Medium off-axis light incidence
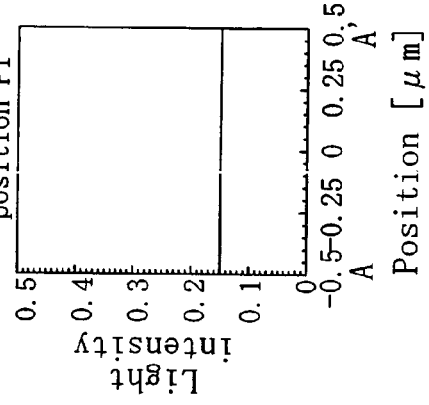
Fig. 6(f) Large off-axis light incidence

[Outline enhancement mask]

[Chromium mask]

[Half-tone mask]

[Half-tone phase-shifting mask]

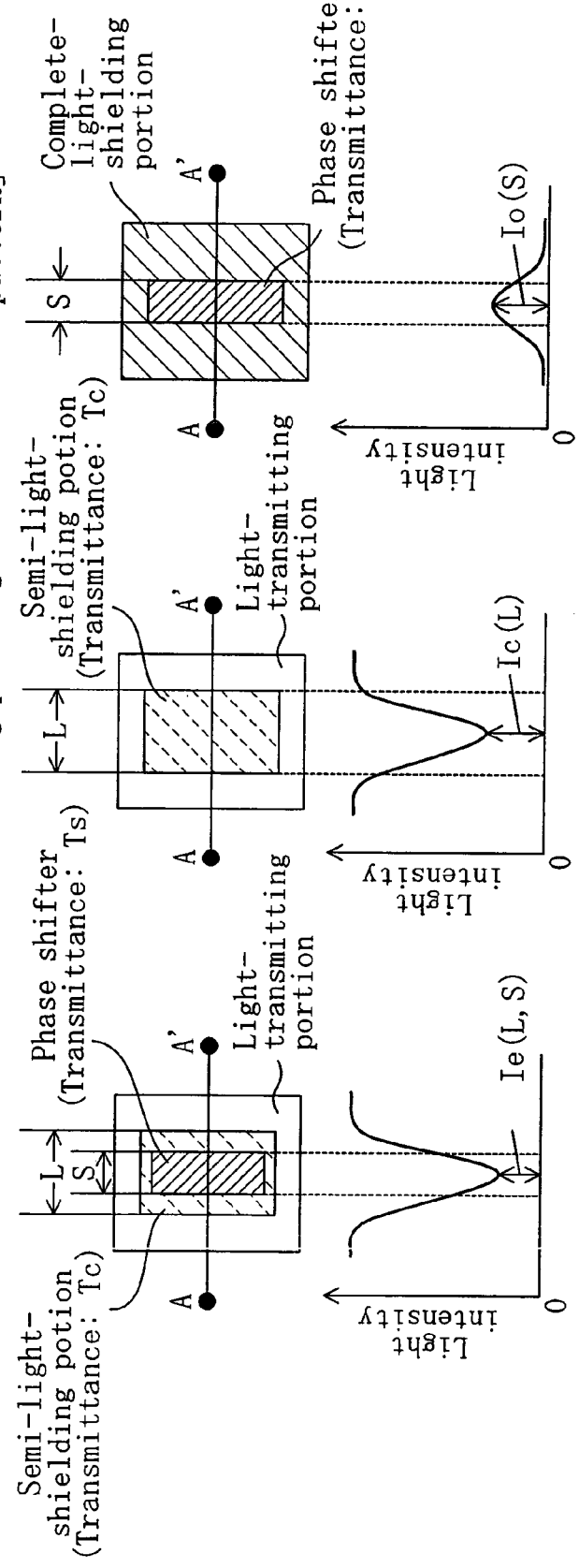

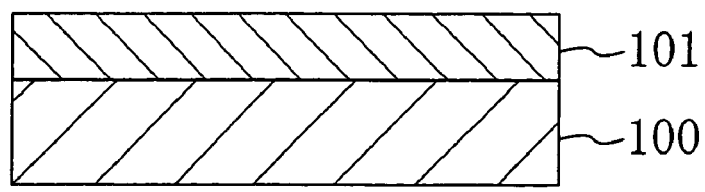
Fig. 25(a)
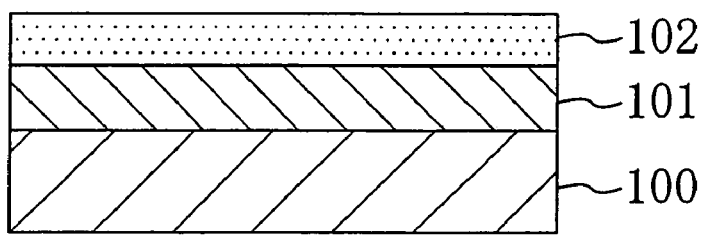
Fig. 25(b)
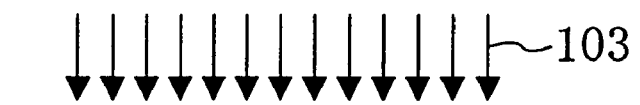
Fig. 25(c)
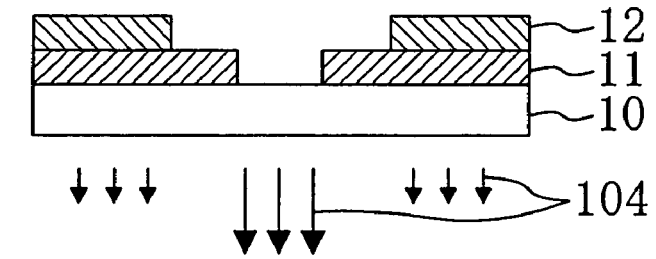
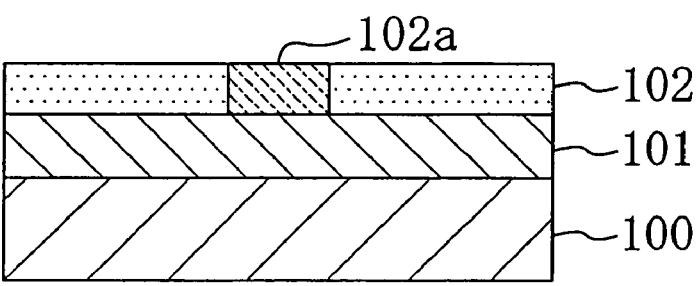
Fig. 25(d)
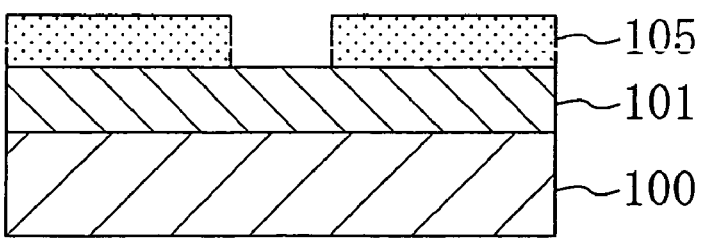

[Pattern shape] [Phase shifter arrangement]
Fig. 26(a)
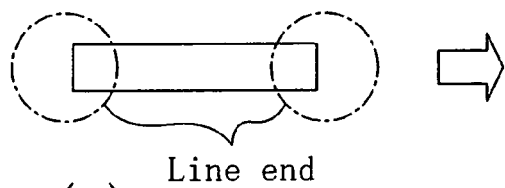
Line end
Fig. 26(b)
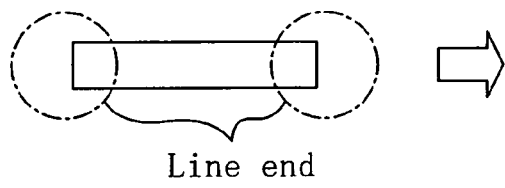
Line end
Fig. 26(c)
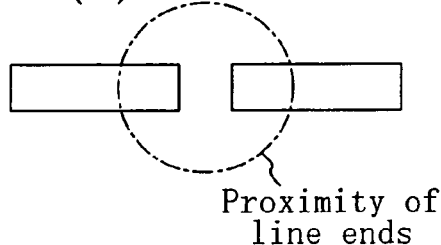
Proximity of line ends
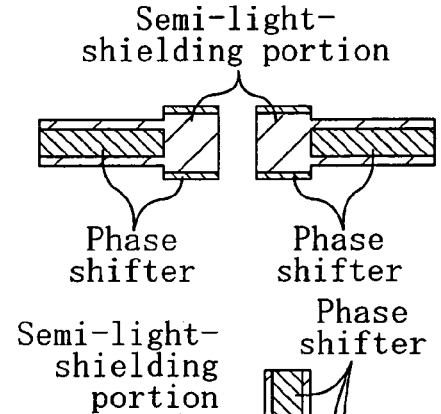
Fig. 26(d)
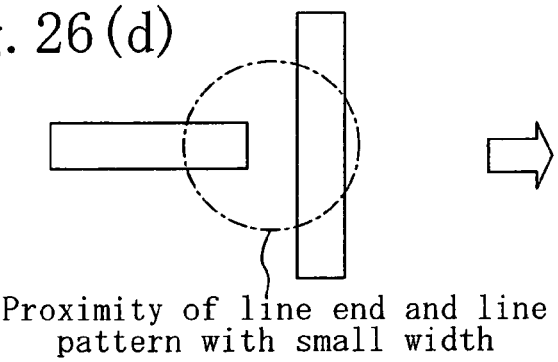
Proximity of line end and line pattern with small width
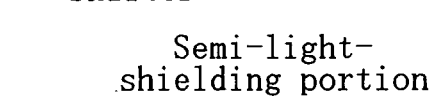
Fig. 26(e)
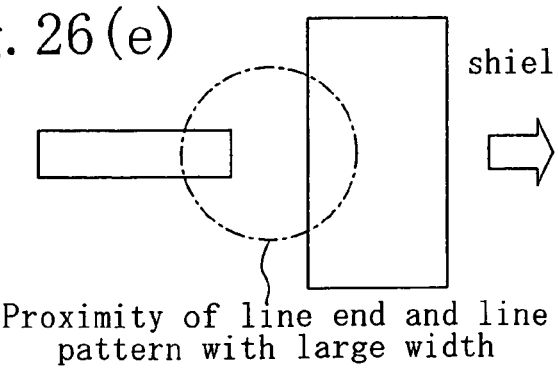
Proximity of line end and line pattern with large width
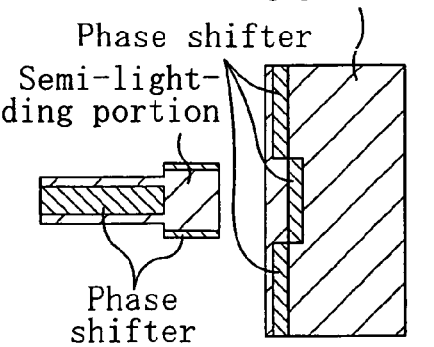

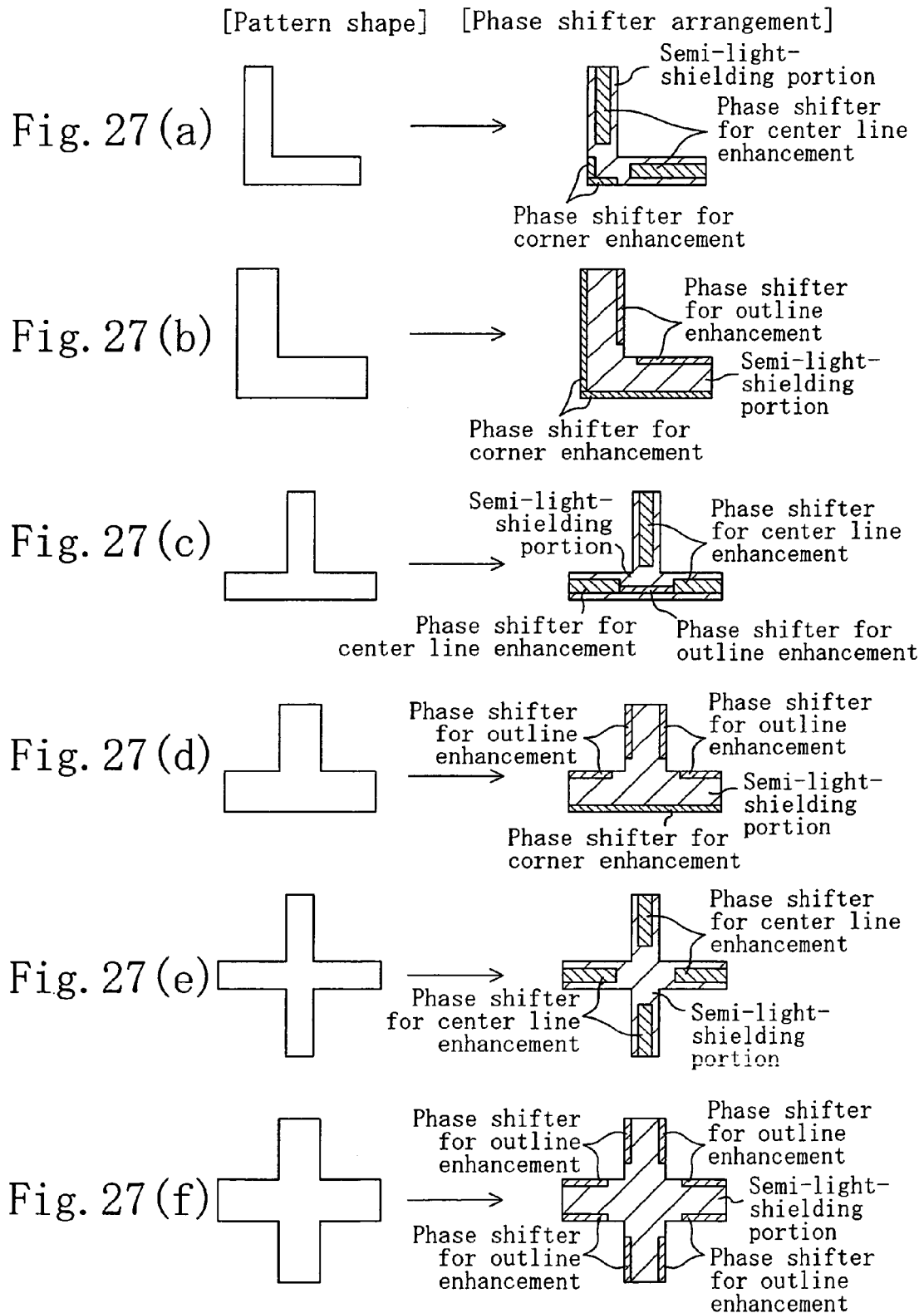

[Regular exposure light source]

[Annular exposure light source]

[Quadrupole exposure light source]

METHOD FOR FORMING PATTERN

RELATED APPLICATIONS

This application is a divisional of U.S. application No. 10/474,336, filed on Oct. 8, 2003 now U.S. Pat. No. 7,060,398, which is the U.S. National Phase under 35 U.S.C.§ 371 of International Application No. PCT/JP02/13466, filed on Dec.24, 2002, which in turn claims the benefit of Japanese Application No.2001-393289, filed on Dec.26, 2001, the disclosures of which Applications are incorporated by reference herein.

TECHNICAL FIELD

The present invention relates to a photomask for forming a small pattern used for producing a semiconductor integrated circuit device, a method for producing the photomask and a method for forming a pattern using the photomask.

BACKGROUND ART

In recent years, it is increasingly necessary to reduce the size of circuit patterns for high integration of a large-scale integrated circuit device (hereinafter, referred to as "LSI") that can be achieved with semiconductors. As a result, reduction of the width of a line for wiring patterns constituting a circuit or reduction of the size of contact hole patterns (hereinafter, referred to as "contact patterns") that connect between layered wirings formed with an insulating layer therebetween have become very important.

Hereinafter, reduction of the size of wiring patterns and contact patterns with a conventional light-exposure system will be described by using a positive resist process as an example. In a positive resist process, a line pattern refers to part of a resist film (resist pattern) which is not exposed with exposure light, i.e., part thereof which is left after development. A space pattern refers to part of a resist film which is exposed with exposure light, i.e., an opening portion which is formed by removing part of a resist film by development (resist-removed pattern). A contact pattern refers to a hole-like opening which is formed by removing part of a resist film by development and can be regarded as a small space pattern of the space patterns. When using a negative resist process instead of a positive resist process, the definition of the line pattern and the definition of the space pattern are replaced by each other.

First Conventional Example

As a conventional method for forming a thin line pattern, a method for forming a line pattern with a very small width by enhancing, using a phase shifter, a contrast of a light-intensity distribution generated by a mask pattern has been proposed (e.g., H. Y. Liu et al., Proc. SPIE, Vol. 3334, P. 2 (1998)).

Hereinafter, a conventional method for forming a line pattern using a phase shifter will be described with reference to the accompanying drawings.

FIG. 28(a) illustrates an exemplary layout for a desired pattern (resist pattern) to be formed. As shown in FIG. 28(a), a pattern 800 includes a partial pattern 800a having a predetermined dimension or less.

FIGS. 28(b) and 28(c) are plan views of two conventional photomasks used for forming the pattern shown in FIG. 28(a), respectively. As shown in FIG. 28(b), in a first photo mask 810, a complete-light-shielding film 812 (having a transmittance of about 0% with respect to exposure light) is formed on a transparent substrate 811. Moreover, a first opening 813 which is to be a light-transmitting portion and a second opening portion 814 which is to be a phase shifter are provided on the complete-light-shielding film 812 with a light-shielding pattern 812a for forming the partial pattern 800a interposed between the first and second openings 813 and 814. The second opening 814 which is to be a phase shifter transmits exposure light to generate a phase difference of 180 degrees with respect to the first opening 813 which is to be a light-transmitting portion. As shown in FIG. 28(c), in a second photomask 820, a light-shielding pattern 822 for forming the desired pattern 800 (see FIG. 28(a)) by combination with a light-shielding pattern 812a of the first photomask 810 is formed on a transparent substrate 821.

A method for forming a pattern using the two photomasks shown in FIGS. 28(a) and 28(b) is as follows. First, using the first photomask 810, a substrate to which a resist film made of a positive resist is applied is exposed with exposure light. Thereafter, alignment of the second photomask 820 is performed so that the pattern 800 of FIG. 28(a) is formed, and then the substrate is exposed with light using the second photomask 820. Thereafter, the resist film is developed, thereby forming a resist pattern shown in FIG. 28(a). In this case, an excess pattern (i.e., patterns other than the pattern 800) which is to be left when exposure is performed using only the first photomask 810 can be removed by the exposure using the second photomask 820. Accordingly, the partial pattern 800a which has a very small width and can not be formed only by exposure process using only the second photomask 820 can be formed.

In this method, if a light-transmitting portion and a phase shifter are disposed with a pattern (i.e., a light-shielding pattern) made of a complete-light-shielding film having a predetermined dimension or less interposed therebetween, lights transmitted through the light-transmitting portion (opening) and the phase shifter, respectively, and diffracted at the back side of the light-shielding pattern are cancelled with each other, improving light-shielding properties of the light-shielding pattern. Thus, a line pattern with a predetermined dimension or less can be formed.

Second Conventional Example

As a method for forming a conventional small contact pattern, a method in which a half-tone phase-shifting mask is used has been proposed. In the half-tone phase-shifting mask, a light-transmitting portion (i.e., an opening in a phase shifter) corresponding to a contact pattern is provided. Moreover, as the light-shielding portion, provided is a phase shifter which has a low transmittance (of about 3% -6%) with respect to exposure light and transmits exposure light with a phase inversion of 180 degree with respect to exposure light transmitted through the opening.

Hereinafter, a principle of a pattern forming method using the half-tone phase-shifting mask will be described with reference to FIGS. 29(a) through 29(g).

FIG. 29(a) is a plan view of a photomask in which an opening corresponding to a contact pattern is provided in a chromium film which is to be a complete-light-shielding portion provided on the surface of the mask. FIG. 29(b) shows the amplitude intensity of light transmitted through the photomask of FIG. 29(a) and transferred onto a position corresponding to the line AA' on a material to be exposed. FIG. 29(c) is a plan view of a photomask in which the chromium film corresponding to a contact pattern is provided as a complete-light-shielding portion in a phase shifter provided on the surface of the mask. FIG. 29(d) shows the amplitude intensity of light transmitted through the photomask of FIG. 29(c) and transferred onto a position corresponding to the line AA' on a material to be exposed. FIG. 29(e) is a plan view of a photomask (i.e., half-tone phase-shifting mask) in which an opening corresponding to a contact pattern is provided in a phase shifter which is to be a light shielding portion provided on the surface of the mask. FIGS. 29(f) and 29(g) show the amplitude intensity and light intensity of light transmitted through the photomask of FIG. 29(e) and transferred onto a position corresponding to the line AA' on a material to be exposed.

As shown in FIGS. 29(b), 29(d) and 29(f), the amplitude intensity of light transmitted through the half-tone phase-shifting mask of FIG. 29(e) is the sum of the amplitude intensities of lights transmitted through the respective photomasks of FIGS. 29(a) and 29(c). More specifically, in the half-tone phase-shifting mask of FIG. 29(e), the phase shifter which is to be a light-shielding portion is configured so as to not only transmit part of exposure light but also provide a phase difference of 180 degrees, with respect to light transmitted through the opening, to light transmitted through the phase shifter. Therefore, as shown in FIGS. 29(b) and 29(d), the light transmitted through the phase shifter has an amplitude intensity distribution with a phase opposite to that of the light transmitted through the opening. Thus, when the amplitude intensity distribution shown in FIG. 29(b) and the amplitude intensity distribution shown in FIG. 29(d) are synthesized, a phase boundary in which the amplitude intensity is turned to 0 by a phase change is generated, as shown in FIG. 29(f). As a result, as shown in FIG. 29(g), in the end of the opening that is to be the phase boundary (hereinafter, referred to as a "phase end"), the light intensity, which is represented by a square of the amplitude intensity, becomes 0, and a significantly dark portion is formed. Accordingly, in an image of the light transmitted through the half-tone phase-shifting mask shown in FIG. 29(e), a strong contrast is realized in the periphery of the opening. Therefore, a small contact pattern can be formed.

A light source used for exposure herein will be described. FIGS. 30(a) through 30(c) are illustrations showing shapes of light sources which have been conventionally used for exposure. In contrast with a regular exposure light source shown in FIG. 30(a), off-axis exposure light source is a light source shown in FIGS. 30(b) and 30(c) in which a light element entering vertically to part of a photomask corresponding to the light source center is removed. Typical off-axis exposure light sources includes an annular exposure light source shown in FIG. 30(b) and a quadrupole exposure light source shown in FIG. 30(c). Although it slightly depends on a desired pattern, in general, quadrupole exposure light sources are more advantageous in enhancement of the contrast and enlargement of the DOF (depth of focus) than annular exposure light sources.

However, the pattern forming method of the first conventional example has had the following problems. (1) When a light-shielding pattern is interposed between a light-transmitting portion and a phase shifter to improve the contrast of an image corresponding to the light-shielding pattern, the light-transmitting portion and the phase shifter have to adjoin each other with a distance of a predetermined dimension or less therebetween. On the other hand, when the light-transmitting portion and the phase shifter are disposed with no light-shielding pattern interposed therebetween on a photomask, an image corresponding to the boundary between the light-transmitting portion and the phase shifter is formed. Accordingly, if only the first photomask shown in FIG. 28(b) is used, a pattern having an arbitrary shape can not be formed. Therefore, in order to form a pattern having a complicated shape such as a pattern layout of a regular LSI, it is necessary to perform exposure using not only a first photomask shown in FIG. 28(b) but also a second photomask shown in FIG. 28(c). As a result, costs for masks are increased and also the number of process steps in a lithograph process is increased to cause reduction in throughput or increase in production costs.

(2) When a desired (resist) pattern has a complicated shape (e.g., a T-shaped having a predetermined dimension or less) is intended to be formed, a whole light-shielding pattern can not be provided only between a light-transmitting portion and a phase shifter having phases opposite to each other. Thus, light-shielding properties of a T-shaped light-shielding pattern, for example, can not be improved. Therefore, a pattern layout with which effects of the phase shifter can be utilized is limited.

Moreover, the pattern forming method of the second conventional example has had the following problems.

(3) Depending on a half-tone phase-shifting mask, it is difficult to simultaneously form an isolated contact pattern in which contacts are arranged so as to be isolated from each other and a densely arranged contact pattern in which contacts are densely arranged by exposure using the same light source and with sufficient finishing quality. In the same manner, it is difficult to simultaneously form an isolated line pattern in which lines are arranged so as to be isolated from each other and a densely arranged line pattern in which lines are densely arranged by exposure using the same light source and with sufficient finishing quality. More specifically, assume that the isolated contact pattern is formed. If vertical incident exposure is performed with the same small light source having a low coherence degree of about 0.5 or less (see FIG. 30(a)) and being used for illumination by only vertical incident components that enter vertically to a mask, an improved contrast and increased depth of focus can be achieved. However, if vertical incident exposure is used to form the densely arranged contact pattern, the contrast and the depth of focus are significantly deteriorated. On the other hand, assume that the densely arranged contact pattern is formed. If off-axis illumination (oblique incident exposure) is performed using a light source being used for illumination by only off-axis components that enter obliquely to a mask, e.g., a light source for annular illumination in which vertical incident components (illumination components from the light source center) are removed (see FIG. 30(b)), an improved contrast and increased depth of focus can be achieved. However, if off-axis exposure is used to form the isolated line pattern, the contrast and the depth of focus are significantly deteriorated.

(4) Depending on the half-tone phase-shifting mask, it is difficult to simultaneously form an isolated space pattern and an isolated line pattern with sufficient finishing quality. More specifically, when the isolated space pattern is formed, an improved contrast and increased depth of focus can be achieved by performing vertical incident exposure. However, if vertical incident exposure is used to form the isolated line pattern, the contrast and the depth of focus are significantly deteriorated. On the other hand, when the isolated line pattern is formed, an improved contrast and increased depth of focus can be achieved by performing off-axis exposure. However, if off-axis exposure is used to form the isolated space pattern, the contrast and the depth of focus are significantly deteriorated. As has been described, when the half-tone phase-shifting mask is used, optimal illumination conditions for isolated space patterns (including an isolated contact pattern) and optimal illumination conditions for densely arranged space patterns (including a densely arranged contact pattern) or isolated line patterns have a contradictory relationship. Therefore, it is difficult to form an isolated space pattern simultaneously with an isolated line pattern or a densely arranged space pattern under the same illumination conditions and with optimal finishing quality.

DISCLOSURE OF INVENTION

With the foregoing in mind, an object of the present invention is to provide a photomask which makes it possible to form a small pattern under the same exposure conditions without depending on the shape and the density of the pattern, a method for forming the photomask, and a method for forming a pattern by using the photomask.

In order to achieve the object, a photomask in accordance with the present invention is assumed to be a photomask in which, on a transparent substrate having light transmitting properties with respect to exposure light, a mask pattern having light-shielding properties with respect to the exposure light and a light-transmitting portion of the transparent substrate where the mask pattern is not located are provided, the mask pattern includes: a semi-light-shielding portion which transmits the exposure light in the same phase as that of the light-transmitting portion; and a phase shifter which transmits the exposure light in a phase opposite to that of the light-transmitting portion, the semi-light-shielding portion has a transmittance which allows the exposure light to be partially transmitted, and the phase shifter is provided in a region of the mask pattern in which light transmitted through the phase shifter can cancel part of light transmitted through the light-transmitting portion and the semi-light-transmitting portion.

In a photomask in accordance with the present invention, a mask pattern includes a semi-light-shielding portion and a phase shifter, and a phase shifter is disposed so that light transmitted through the phase shifter can cancel part of light transmitted through the light-transmitting portion and the semi-light-shielding portion. Thus, the contrast of a light intensity distribution in a light shielded image corresponding to the mask pattern can be enhanced. Therefore, without depending on the shape or the density of a pattern, a small pattern can be formed under the same exposure conditions.

In the photomask of the present invention, it is preferable that the transmittance of the semi-light-transmitting portion with respect to the exposure light is 15% or less.

Thus, prevention of reduction in the thickness of the resist film during pattern formation or optimization of the resist sensitivity can be achieved. More specifically, if the transmittance of the semi-light-shielding portion with respect to exposure light is 6% or more and 15% or less, it is possible to improve DOF (depth of focus) or the contrast and at the same time to prevent reduction in the thickness of a resist film during pattern formation or optimize the resist sensitivity.

In the photomask of the present invention, the semi-light-shielding portion may transmit the exposure light with a phase difference of (−30+360×n) degrees or more and (30+360×n) degrees or less (where n=an integer) with respect to light transmitted through the light-transmitting portion and the phase shifter may transmit the exposure light with a phase difference of (150+360×n) degrees or more and (210+360×n) degrees or less (where n=an integer) with respect to light transmitted through the light-transmitting portion. That it to say, herein, a phase difference of (−30+360×n) degrees or more and (30+360×n) degrees or less (where n=an integer) is assumed to be the same phase and a phase difference of (150+360×n) degrees or more and (210+360×n) degrees or less (where n=an integer) is assumed to be an opposite phase.

In the photomask of the present invention, it is preferable that the phase shifter is disposed in a region of the mask pattern extending from the boundary with the light-transmitting portion by a distance of (0.8×λ/NA)×M or less (where λ is the wavelength of the exposure light, and NA and M are the numerical aperture and reduction ratio of a reduction projection optical system of an exposure apparatus, respectively).

Thus, an exposure margin in pattern formation is improved.

In the photomask of the present invention, when the mask pattern is provided so as to surround the light-transmitting portion and the phase shifter is provided in the vicinity of the light-transmitting portion of the mask pattern, it is preferable that the width of the phase shifter is (0.3×λ/NA)×M or less (where λ is the wavelength of the exposure light, and NA and M are the numerical aperture and reduction ratio of a reduction projection optical system of an exposure apparatus, respectively).

Thus, a focus margin in pattern formation is improved. However, it is preferable that the width of the phase shifter is a width with which optical effects as a phase shifter are obtained, i.e., (0.1×λ/NA)×M or more.

In the photomask of the present invention, it is preferable that the mask pattern is provided so as to surround the light-transmitting portion and the phase shifter is provided in the vicinity of the light-transmitting portion of the mask pattern so as to be interposed between the semi-light-transmitting portion and the light-transmitting portion.

Thus, the contrast of a light intensity distribution in the periphery of an image of light transmitted through the light-transmitting portion can be enhanced.

In the photomask of the present invention, it is preferable that the mask pattern is provided so as to surround the light-transmitting portion and the phase shifter is provided in the vicinity of the light-transmitting portion of the mask pattern so as to be surrounded by the semi-light-transmitting portion.

Thus, the contrast of a light intensity distribution in the periphery of an image of light transmitted through the light-transmitting portion can be enhanced and the light intensity distribution is hardly influenced by a mask size error.

In the photomask of the present invention, it is preferable that the mask pattern is surrounded by the light-transmitting portion and the phase shifter is surrounded by the semi-light-transmitting portion.

Thus, the contrast of a light intensity distribution in a center portion of a light shielded image corresponding to the mask pattern can be enhanced. Moreover, in this case, if the width of the mask pattern is (0.8×λ/NA)×M or less (where λ is the wavelength of the exposure light, and NA and M are the numerical aperture and reduction ratio of a reduction projection optical system of an exposure apparatus, respectively), the above-described effects can be reliably obtained. Also, in this case, if the width of the phase shifter is (0.4×λ/NA)×M or less, the exposure margin in pattern formation is further improved. Furthermore, in this case, if the width of the phase shifter is (0.1×λ/NA)×M or more and (0.4×λ/NA) or less, the exposure margin and DOF are improved at the same time.

In the photomask of the present invention, it is preferable that the mask pattern is a line-shaped pattern surrounded by the light-transmitting portion and the phase shifter is provided in a center portion of the mask pattern in the line width direction so as to be interposed between parts of the semi-light-shielding portion.

Thus, the contrast of a light intensity distribution in a center portion of a line-shaped, light-shielded image corresponding to the mask pattern can be enhanced. Moreover, in this case, if the width of the mask pattern is (0.8×λ/NA)×M or less (where λ is the wavelength of the exposure light, and NA and M are the numerical aperture and reduction ratio of a reduction projection optical system of an exposure apparatus, respectively), the above-described effects can be reliably obtained. Also, in this case, if the width of the phase shifter is $(0.4 \times \lambda/NA) \times M$ or less, the exposure margin in pattern formation is further improved. Furthermore, in this case, if the width of the phase shifter is $(0.1 \times \lambda/NA) \times M$ or more and $(0.4 \times \lambda/NA) \times M$ or less, the exposure margin and DOF are improved at the same time.

In the photomask of the present invention, it is preferable that the mask pattern is a line-shaped pattern surrounded by the light-transmitting portion and the phase shifter is provided at least in each of both end portions of the mask pattern in the line width direction so that the semi-light-shielding portion is interposed between phase shifters.

Thus, the contrast of a light intensity distribution in an outline portion of a light shielded image corresponding to the mask pattern can be enhanced.

In the photomask of the present invention, it is preferable that the mask pattern is a line-shaped pattern surrounded by the light-transmitting portion and the phase shifter is provided in each of both end portions and center portion of the mask pattern in the line width direction so that the semi-light-shielding portion is interposed between phase shifters.

Thus, the contrast of a light intensity distribution in an outline portion of a light shielded image corresponding to the mask pattern can be enhanced. Moreover, it is also possible to prevent the generation of a side lobe in a center portion of the light shielded image due to using the semi-light-shielding portion. Also, in this case, if the width of the mask pattern is $(\lambda/NA) \times M$ or less (where λ is the wavelength of the exposure light, and NA and M are the numerical aperture and reduction ratio of a reduction projection optical system of an exposure apparatus, respectively), the above-described effects can be reliably obtained. Furthermore, in this case, if the width of the phase shifter is $(0.3 \times \lambda/NA) \times M$ or less, a focus margin in pattern formation is further improved.

In the photomask of the present invention, it is preferable that the mask pattern is a line-shaped pattern surrounded by the light-transmitting portion and the phase shifter is provided in each of both end portions of the mask pattern in the line width direction so as to be surrounded by the semi-light-shielding portion.

Thus, the contrast of a light intensity distribution in an outline portion of a light shielded image corresponding to the mask pattern can be enhanced and also the light intensity distribution is hardly influenced by a mask size error.

In the photomask of the present invention, it is preferable that the mask pattern is a line-shaped pattern surrounded by the light-transmitting portion and the phase shifter is provided in each of both end portions and center portion of the mask pattern in the line width direction so as to be surrounded by the semi-light-shielding portion.

Thus, the contrast of a light intensity distribution in an outline portion of a light shielded image corresponding to the mask pattern can be enhanced and also the light intensity distribution is hardly influenced by a mask size error. Moreover, it is also possible to prevent the generation of a side lobe in a center portion of the light shielded image due to using the semi-light-shielding portion.

In the photomask of the present invention, it is preferable that the light-transmitting portion includes a first light-transmitting portion and a second light-transmitting portion, the mask pattern is provided so as to surround the first light-transmitting portion and the second light-transmitting portion, the phase shifter is provided in a center portion of the mask pattern located between the first light-transmitting portion and the second light-transmitting portion and the semi-light shielding portion is provided in each of both sides of the phase shifter.

Thus, the contrast of an light intensity distribution in a center portion of a light shielded image corresponding to part of the mask pattern interposed between a pair of light-transmitting portions can be enhanced. Moreover, in this case, if the space between the first light-transmitting portion and the second light-transmitting portion is $(0.8 \times \lambda/NA) \times M$ or less (where λ is the wavelength of the exposure light, and NA and M are the numerical aperture and reduction ratio of a reduction projection optical system of an exposure apparatus, respectively), the above-described effects can be reliably obtained. Also, in this case, if the width of the phase shifter is $(0.4 \times \lambda/NA) \times M$ or less, an exposure margin in pattern formation is improved. Furthermore, in this case, if the width of the phase shifter is $(0.1 \times \lambda/NA) \times M$ or more and $(0.4 \times \lambda/NA) \times M$ or less, an exposure margin and DOF are improved at the same time.

A method for forming a pattern according to the present invention is assumed to be a method for forming a pattern using the photomask of the present invention and includes the steps of: forming a resist film on a substrate; irradiating the resist film with the exposure light through the photomask; and developing the resist film which has been irradiated with the exposure light to form a resist pattern.

With the method for forming a pattern, the same effects as those of the photomask of the present invention can be obtained. Moreover, in the pattern formation method of the present invention, it is preferable that in the step of irradiating the exposure light, an off-axis illumination method is used. Thus, in a light intensity distribution of light transmitted through a photomask, the contrast between respective parts of the light intensity distribution corresponding to a mask pattern and a light-transmitting portion is improved. Focus characteristics are also improved. Accordingly, an exposure margin and a focus margin in pattern formation are improved.

A first method for generating mask data in accordance with the present invention is assumed to be a method for generating mask data for the photomask of the present invention and includes: a first step of determining the shape of the mask pattern based on a pattern to be formed using the photomask and setting the transmittance of the semi-light-shielding portion; a second step, after the first step, of extracting a region of the mask pattern having a predetermined dimension or less and interposed between parts of the light-transmitting portion; and a third step, after the second step, of inserting the phase shifter in each of the extracted region and part of the mask pattern located in the vicinity of the light-transmitting portion.

With the first method for generating mask data, a photomask which allows enhancement of the contrast of a light intensity distribution in a peripheral portion of an image of light transmitted through a light-transmitting portion and prevention of the generation of a side lobe in a center portion of a light shielded image can be obtained.

It is preferable that the first mask data generation method further includes after the third step, the step of inserting the semi-light-shielding portion having a predetermined dimension or less between the phase shifter and the light-transmitting portion.

Thus, a photomask which is hardly influenced by a mask size error can be obtained.

It is preferable that the first mask data generation method further includes after the third step, the step of inserting another phase shifter which transmits the exposure light in a phase opposite to that of the light-transmitting portion in a region of the mask pattern having a predetermined dimension or less and interposed between parts of the light-transmitting portion.

Thus, a photomask which allows prevention of the generation of a side lobe can be achieved. In this case, said another phase shifter may transmit the exposure light with a phase difference of (150+360×n) degrees or more and (210+360×n) degrees or less (where n=an integer) with respect to light transmitted through the light-transmitting portion.

It is preferable that the first mask data generation method further includes after the third step, the step of extracting an end portion of a line-shaped pattern having a width equal to or smaller than a predetermined dimension from the mask pattern and then inserting another phase shifter in the periphery of the extracted end portion extending in parallel to the line direction.

Thus, a photomask which can prevent regression of an end portion of a line pattern can be achieved. Moreover, when a line pattern is provided so as to be close to another pattern, a photomask which can prevent the patterns from being bridged can be achieved.

It is preferable that the first mask data generation method further includes after the third step, the step of extracting a corner from the mask pattern and then, if the phase shifter is disposed in a region of the mask pattern extending from a bent point of the extracted corner by a predetermined dimension or less, replacing the phase shifter with the semi-light-shielding portion or reducing a dimension of the phase shifter.

Thus, a photomask which allows formation of a pattern corner portion having a desired shape can be achieved.

It is preferable that the first mask data generation method further includes after the third step, the step of correcting a dimension of the semi-light-shielding portion with a dimension of the phase shifter fixed so that the pattern to be formed using the photomask has a desired dimension.

Thus, a photomask which allows formation of a pattern (resist pattern) with a small amount of size variation according to mask size change, i.e., formation of a pattern with a desired dimension can be achieved.

A second mask data generation method is assumed to be a method for generating mask data for the photomask of the present invention and includes: a first step of determining the shape of a mask pattern based on a pattern to be formed using the photomask and setting the transmittance of the semi-light-shielding portion; a second step, after the first step, of extracting a region of the mask pattern having a width equal to or less than a predetermined dimension; and a third step, after the second step, of inserting the phase shifter in each of the extracted region and the periphery of a region of the mask pattern having a larger width than the predetermined dimension.

With the second mask data generation method, it is possible to achieve a photomask which allows enhancement of the contrast of a light intensity distribution in each of a center portion of a light shielded image corresponding to part of a mask pattern having a small width and an outline portion of the light shielded image corresponding to part of the mask pattern having a large width.

It is preferable that the second mask data generation method further includes after the third step, the step of inserting the semi-light-shielding portion having a predetermined dimension or less between the phase shifter and the light-transmitting portion.

Thus, a photomask which is hardly influenced by a mask size error can be achieved.

It is preferable that the second mask data generation method further includes after the third step, the step of inserting another phase shifter which transmits the exposure light in a phase opposite to that of the light-transmitting portion in a region of the mask pattern having a larger width than a predetermined dimension.

Thus, a photomask which allows prevention of the generation of a side lobe can be achieved. In this case, said another phase shifter may transmit the exposure light with a phase difference of (150+360×n) degrees or more and (210+360×n) degrees or less (where n=an integer) with respect to light transmitted through the light-transmitting portion.

It is preferable that the second mask data generation method further includes after the third step, the step of extracting an end portion of a line-shaped pattern having a width equal to or smaller than a predetermined dimension from the mask pattern and then inserting another phase shifter in part of the periphery of the extracted end portion extending in parallel to the line direction.

Thus, a photomask which allows can prevent regression of an end portion of a line pattern can be achieved. Moreover, when a line pattern is provided so as to be close to another pattern, a photomask which can prevent the patterns from being bridged can be achieved.

It is preferable that the second mask data generation method further includes after the third step, the step of extracting a corner from the mask pattern and then, if the phase shifter is disposed in a region of the mask pattern extending from a bent point of the extracted corner by a predetermined dimension or less, replacing the phase shifter with the semi-light-shielding portion or reducing a dimension of the phase shifter.

Thus, a photomask which allows formation of a pattern corner portion having a desired shape can be achieved.

It is preferable that the second mask data generation method further includes after the third step, the step of correcting a dimension of the semi-light-shielding portion with a dimension of the phase shifter fixed so that the pattern to be formed using the photomask has a desired dimension.

Thus, a photomask which allows formation of a pattern (resist pattern) with a small amount of size variation according to mask size change, i.e., formation of a pattern with a desired dimension can be achieved.

BRIEF DESCRIPTION OF DRAWINGS

FIGS. 2(a) through 2(g) are plan views and graphs showing the principle of the outline enhancement method of the present invention.

FIGS. 3(a) through 3(f) are plan views and graphs showing a limit for a dimension of a phase shifter in the outline enhancement of the present invention.

FIGS. 4(a) through 4(d) are plan views and graphs showing a limit for a dimension of a phase shifter in the outline enhancement of the present invention.

FIGS. 5(a) through 5(f) are a plan view and graphs showing change in the contrast of a light intensity distribution when an isolated pattern is formed by performing exposure from a point light source in various positions to an outline enhancement mask in accordance with the present invention.

FIGS. 6(a) through 6(f) are a plan view and graphs showing change in the contrast of a light intensity distribution when densely arranged patterns are formed by performing exposure from a point light source in various positions to an outline enhancement mask in accordance with the present invention.

FIGS. 13(a) through 13(c) are plan views and graphs showing the principle of the center line enhancement method of the present invention.

FIGS. 25(a) through 25(d) are cross-sectional views illustrating respective process steps for forming a pattern in accordance with a fifth embodiment of the present invention.

FIGS. 26(a) through 26(e) are illustrations showing a deformation compensation method for a line end portion in the mask data generation method in accordance with a sixth embodiment of the present invention.

FIGS. 27(a) through 27(f) are illustrations showing a deformation compensation method for a corner portion in the mask data generation method in accordance with the sixth embodiment of the present invention.

BEST MODE FOR CARRYING OUT THE INVENTION

FIRST EMBODIMENT

First, a method for improving resolution with a photomask invented by the inventor of the present application to achieve the present invention, and, more specifically, an "outline enhancement method" to improve the resolution of an isolated space pattern will be described.

Figure 1:
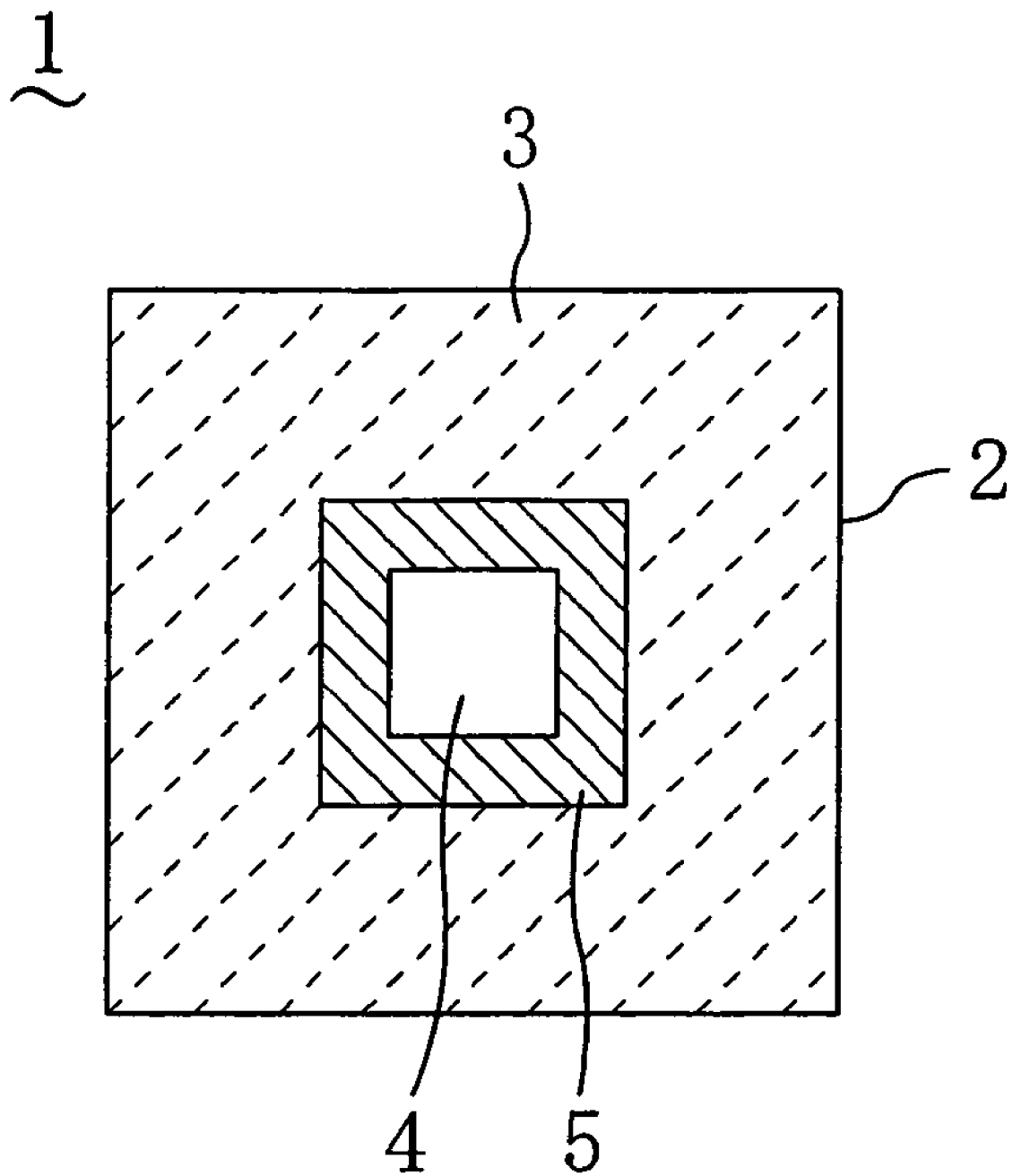
FIG. 1 is a plan view of a photomask using an outline enhancement method in accordance with a first embodiment of the present invention.

FIG. 1 is a plan view of a photomask using an outline enhancement method in accordance with a first embodiment of the present invention (hereinafter, referred to as an "outline enhancement mask"). More specifically, FIG. 1 shows a plan view of an outline enhancement mask in which a light-transmitting portion corresponding to an isolated contact pattern is provided.

As shown in FIG. 1, an outline enhancement mask 1 includes a transparent substrate 2 having light-transmitting properties with respect to exposure light- a semi-light-shielding portion 3 formed on the principal surface of the transparent substrate 2 and having a transmittance which allows exposure light to be partially transmitted, a light-transmitting portion (opening) 4 formed on the principal surface of the transparent substrate 2 so as to be surrounded by the semi-light-transmitting portion 3 and correspond to an isolated contact pattern, and a ring-shaped phase shifter 5 formed on part of the principal surface of the transparent substrate 2 which is located between the semi-light-shielding portion 3 and the light transmitting portion 4 so as to surround the light-transmitting portion 4. In the outline enhancement mask 1, the semi-light-shielding portion 3 which transmits exposure light in the same phase as that of the light-transmitting portion 4 and the phase shifter 5 that transmits exposure light in a phase opposite to that of the light-transmitting portion 4 together form a mask pattern.

Note that herein, a phase difference of (−30+360×n) degrees or more and (30+360×n) degrees or less (where n=an integer) is assumed to be the "same phase" and a phase difference of (150+360×n) degrees or more and (210+360×n) degrees or less (where n=an integer) is assumed to be an "opposite phase".

Also, the transmittance of the semi-light shielding portion 3 is 15% or less with respect to exposure light. Preferably, the transmittance of the semi-light shielding portion 3 is 6% or more and 15% or less. As a material for the semi-light shielding portion 3, for example, a thin film (having a thickness of 50 nm or less) made of a metal such as Cr (chromium), Ta (tantalum), Zr (zirconium) and Mo (molybdenum) or an alloy including at least one of these metals can be used. As the alloy, more specifically, Ta—Cr alloy, Zr—Si alloy, Mo—Si alloy or the like can be used. Furthermore, when the thickness of the semi-light-shielding portion 3 is intended to be increased, a material containing an oxide such as ZrSiO, Cr—Al—O, TaSiO and MoSiO may be used.

Moreover, the transmittance of the phase shifter 5 with respect to exposure light is higher than that of the semi-light-shielding portion 3 and equal to or less than that of the light-transmitting portion 4.

<Principle of Outline Enhancement Method>

Next, an "outline enhancement method" for improving the resolution of isolated space patterns which is used in this embodiment will be described by taking formation of contact patterns by a positive resist process as an example. Herein, the "outline enhancement method" is a principle that can be used for any patterns, regardless of its shape, as long as the patterns are small space patterns in a positive resist process. Furthermore, the "outline enhancement method" can be applied to a negative resist process totally in the same manner, if the small space patterns (resist-removed patterns) in the positive resist process are replaced by small patterns (resist patterns).

FIGS. 2(a) through 2(g) are plan view and graphs illustrating the principle used for enhancement of transferred images of light in a region where contact patterns are formed.

FIG. 2(a) is a plan view of a photomask in which an opening corresponding to a contact pattern is formed in a semi-light-shielding portion formed on the surface of a transparent substrate and having a transmittance which allows part of exposure light to be transmitted. FIG. 2(b) shows the amplitude intensity of light transmitted through the photomask shown in FIG. 2(a) and transferred onto a position corresponding to the line AA' on a material to be exposed.

FIG. 2(c) is a plan view of a photomask in which a ring-shaped phase shifter is provided in a complete-light-shielding portion formed on the principal surface of the transparent substrate so as to correspond to a peripheral region of the opening shown in FIG. 2(a). FIG. 2(d) shows the amplitude intensity of light transmitted through the photomask shown in FIG. 2(c) and transferred onto the position corresponding to the. line AA' on the material to be exposed. The amplitude intensity of light shown in FIG. 2(d) is that of the light transmitted through the phase shifter, and therefore this amplitude intensity has an opposite phase to that of the amplitude intensity of light shown in FIG. 2(b).

FIG. 2(e) is a plan view of a photomask which is an exemplary outline enhancement mask in accordance with this embodiment and in which an opening corresponding to a contact pattern as in the photomask of FIG. 2(a) is provided in the semi-light-shielding portion formed on the principal surface of the transparent substrate and a ring-shaped phase shifter, as shown in the photomask of FIG. 2(c), is provided in an peripheral region of the opening. Moreover, FIGS. 2(f) and 2(g) show the amplitude intensity and light intensity (a square of the amplitude intensity of light) of light transmitted through the photomask shown in FIG. 2(e) and transferred onto the position corresponding to the line AA' on the material to be exposed.

Hereinafter, the principle of enhancement of a transferred image of light transmitted through the outline enhancement mask shown in FIG. 2(e) will be described. The structure of the photomask shown in FIG. 2(e) is a structure in which the semi-light-shielding portion of FIG. 2(a) and the phase shifter of FIG. 2(c) are overlapped each other on the transparent substrate. Moreover, as shown in FIGS. 2(b), 2(d), and 2(f), the amplitude intensity of light transmitted through the photomask shown in FIG. 2(e) has a distribution similar to that obtained by overlapping the amplitude intensities of the lights transmitted through the photomasks shown in FIGS. 2(a) and 2(c). As seen from FIG. 2(f), in the photomask shown in FIG. 2(e), light transmitted through the phase shifter disposed in the periphery of the opening can cancel part of light transmitted through the opening and the semi-light shielding portion. Therefore, in the photomask shown in FIG. 2(e), if the intensity of the light transmitted through the phase shifter is adjusted such that light in an outline portion surrounding the opening is canceled out, it is possible to form a light intensity distribution in which the light intensity corresponding to the periphery of the opening is reduced to nearly 0, as shown in FIG. 2(g).

Moreover, in the photomask shown in FIG. 2(e), the light transmitted through the phase shifter cancels the light in the periphery of the opening to a high degree but cancels the light in the vicinity of the center of the opening to a low degree. As a result, as shown in FIG. 2(g), there is another advantage that the slope of the profile of the light intensity distribution of the light transmitted through the photomask shown in FIG. 2(e) in which the light intensity changes from the center of the opening to the periphery of the opening is increased. Therefore, the light intensity distribution of the light transmitted through the photomask shown in FIG. 2(e) has a sharp profile, so that an image of the light intensity having a high contrast can be formed.

Above described is the principle used for enhancement of images of light intensity in the present invention. In other words, a phase shifter is disposed along an outline portion of an opening in a mask formed using a semi-light shielding portion having a transmittance which allows part of exposure light to be transmitted, so that it is possible to form a very dark portion corresponding to the outline portion of the opening in an image of a light intensity formed with the photomask shown in FIG. 2(a). Thus, a light intensity distribution in which the contrast between the light intensity in the opening and the light intensity in the outline portion of the opening is enhanced can be formed. Herein, a method by which image enhancement is performed based on this principle is referred to as the "outline enhancement method", and the photomask that realizes this principle is referred to as an "outline enhancement mask".

Hereinafter, the difference between the outline enhancement method which is the basic principle of the present invention and the principle of a conventional method using a half-tone phase-shifting mask will be described. The most important point of the principle of the outline enhancement mask is that light transmitted through the phase shifter can cancel part of light transmitted through the semi-light shielding portion and the opening, so that a dark portion is formed in the light intensity distribution, that is, that the phase shifter behaves as if to be a non-transparent pattern. Therefore, as shown in FIG. 2(f), a dark portion is formed by intensity change on the same phase side in the amplitude intensity of light transmitted through the outline enhancement mask. Only in this state, the contrast can be improved by off-axis exposure.

Figure 29A:
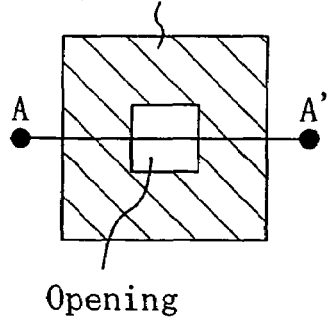
FIGS. 29(a) through 29(g) are plan views and graphs showing the principle of a pattern formation method using a conventional half-tone phase-shifting mask.
Figure 29B:
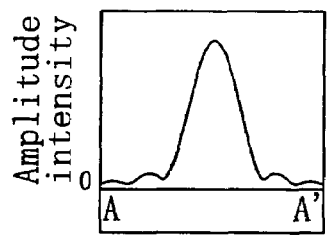
Figure 29C:
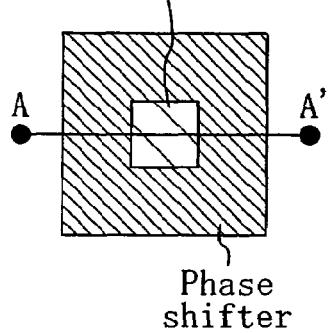
Figure 29D:
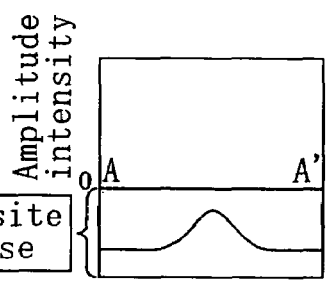
Figure 29E:
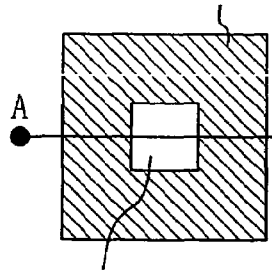
Figure 29F:
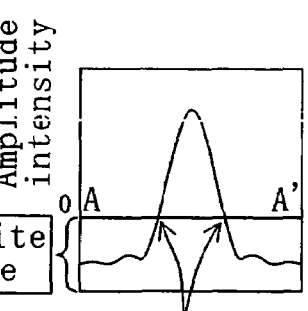
Figure 29G:
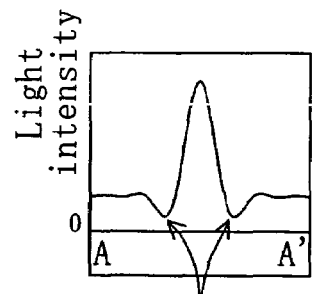

On the other hand, also in the light intensity distribution obtained by exposure with the conventional half-tone phase-shifting mask having an opening corresponding to a contact pattern, a very dark portion is formed in the periphery of the opening, as shown in FIG. 29(g). However, when FIG. 29(f) showing the amplitude intensity of the light obtained by exposure with the conventional half-tone phase-shifting mask is compared with FIG. 2(f) showing the amplitude intensity of the light obtained by exposure with the outline enhancement mask, the following difference is clearly present. That is, as shown in FIG. 29(f), in the amplitude intensity distribution obtained by exposure with the half-tone phase-shifting mask, a phase boundary is present. As shown in FIG. 29(g), a dark portion of the light intensity distribution is generated due to this phase boundary, i.e., a phase end, and thus image enhancement is realized. However, in order to form a dark portion due to the phase end to obtain the effect of enhancing the contract, a component of light entering vertically to the photomask is required. In other words, off-axis exposure can not provide a dark portion due to a phase end even if the phase boundary is generated, and consequently the contrast enhancement effect can not be obtained. This is the reason why the contrast enhancement effect can not be obtained when off-axis exposure is performed to the half-tone phase-shifting mask. Therefore, it is necessary to perform exposure to the half-tone phase-shifting mask using a small light source having a low coherence degree. In contrast, as shown in FIG. 2(f), a phase boundary is not generated in the amplitude intensity distribution obtained by exposure with the outline enhancement mask. Therefore, a transferred image of light necessary for forming a small isolated space pattern can be formed at a higher contrast even with off-axis exposure components.

<Optimization of Phase Shifter Width in Outline Enhancement Mask>

Next, before showing in detail the fact that a high contrast can be obtained with off-axis exposure components in the outline enhancement method, it will be described that even when the structure of the outline enhancement mask of FIG. 2(e) is used, the contrast enhancement effect can not be obtained with an excessively increased width of a phase shifter.

FIG. 3(a) is a plan view of an outline enhancement mask in which an opening corresponding to a contact pattern, and a phase shifter having a small width and located in a region of the mask surrounding the opening are formed in a semi-light-shielding portion formed on the principal surface of a transparent substrate and having a transmittance which allows part of exposure light to be transmitted. FIG. 3(b) shows calculation results of the light intensity distribution corresponding to the line AA' when exposure is performed to the outline enhancement mask shown in FIG. 3(a) using a small light source having a small coherence degree σ=0.4. FIG. 3(c) shows calculation results of the light intensity distribution corresponding to the line AA' when exposure is performed to the outline enhancement mask shown in FIG. 3(a) using annular illumination.

FIG. 3(d) is a plan view of an outline enhancement mask in which an opening corresponding to a contact pattern and a phase shifter having a large width and located in a region of the mask surrounding the opening are formed in a semi-light-shielding portion formed on the principal surface of a transparent substrate and having a transmittance which allows part of exposure light to be transmitted. FIG. 3(e) shows calculation results of the light intensity distribution corresponding to the line AA' when exposure is performed to the outline enhancement mask shown in FIG. 3(d) using a small light source having a small coherence degree σ=0.4. FIG. 3(f) shows calculation results of the light intensity distribution corresponding to the line AA' when exposure is performed to the outline enhancement mask shown in FIG. 3(d) using annular illumination.

Figure 30A:
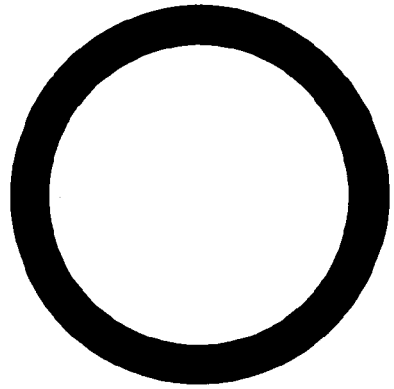
FIG. 30(a) is an illustration showing the shape of a regular exposure light source.
Figure 30B:
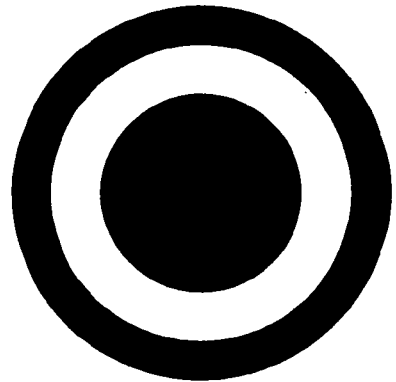
FIG. 30(b) is an illustration showing the shape of an annular exposure light source.

In this case, it is assumed that the width of the phase shifter in the outline enhancement mask shown in FIG. 3(d) is set to be too large to satisfy the principle of the outline enhancement method. More specifically, the sizes of the openings shown in FIGS. 3(a) and 3(d) are both 220 nm square, and the width of the phase shifter shown in FIG. 3(a) is 60 nm and the width of the phase shifter shown in FIG. 3(d) is 150 nm. In the annular illumination, an annular exposure light source shown in FIG. 30(b) is used. More specifically, what is called ⅔ annular exposure light source having an outer diameter σ of 0.75 and an inner diameter σ of 0.5 is used. For the exposure conditions, the light source wavelength λ is 193 nm (ArF light source) and the numerical aperture NA is 0.6. Furthermore, the transmittance of the phase shifter is 6%. Note that in the following description, the light intensity is shown by a relative light intensity when taking the light intensity of exposure light as 1, unless otherwise specified;

As shown in FIGS. 3(b) and 3(c), when the outline enhancement mask shown in FIG. 3(a) that satisfies the principle of the outline enhancement method is used, a dark portion due to a non-transparent function of the phase shifter appears regardless of the type of the light source and the contrast of the light intensity distribution is higher with the annular illumination.

On the other hand, when the outline enhancement mask shown in FIG. 3(d) with an excessively large phase shifter is used, the light transmitted through the phase shifter is too strong, so that in its amplitude intensity distribution, an amplitude intensity distribution having an opposite phase is formed. In this situation, the same principle as in the case of the half-tone phase-shifting mask acts. As a result, as shown in FIGS. 3(e) and 3(f), a dark portion due to a phase end is formed in the light intensity distribution obtained by exposure with a small light source and the contrast enhancement effect is provided, whereas no dark portion due to a phase end is formed in the light intensity distribution obtained by off-axis exposure, so that an image having very poor contrast is formed.

In other words, in order to realize the outline enhancement method, in the mask structure, it is necessary that not only the phase shifter is disposed in the periphery of the opening surrounded by the semi-light shielding portion, but also that light transmitted through the phase shifter is limited. According to the mechanism of the principle, the latter means that light transmitted through the phase shifter has an intensity that at least can cancel light transmitted through the semi-light shielding portion and the opening, and in its amplitude intensity distribution, the intensity distribution having an opposite phase with a predetermined intensity or more is not formed.

In order to actually limit light transmitted through the phase shifter, a condition (more specifically the upper limit) can be imposed on the width of the phase shifter, depending on the transmittance of the phase shifter. Hereinafter, this condition will be described with reference to the results from consideration of conditions under which the light from the periphery of the phase shifter is cancelled by the light transmitted through the phase shifter (see FIGS. 4(a) and 4(b)).

As shown in FIG. 4(a), in exposure with a photomask (phase shifting mask) in which a phase shifter having a transmittance T and a line width L is provided on a transparent substrate is used, light intensity generated in a portion of a material to be exposed corresponding to the center of the mask pattern is expressed as Ih (L, T). Moreover, as shown in FIG. 4(b), in exposure with a photomask (light-shielding mask) in which the phase shifter of the phase-shifting mask is replaced by a complete-light-shielding film is used, light intensity generated in a portion of a material to be exposed corresponding to the center of the mask pattern is expressed as Ic (L). Furthermore, as shown in FIG. 4(c), in exposure with a photomask (light-transmitting mask) in which the phase shifter of the phase-shifting mask is replaced by a regular light-transmitting portion (opening) and the light-transmitting portion of the phase-shifting mask is replaced by a light-shielding portion formed of a complete-light-shielding film is used, light intensity generated in a portion of a material to be exposed corresponding to the center of the mask pattern is expressed as Io (L).

FIG. 4(d) is a graph showing simulation results of the light intensity Ih (L, T) when the transmittance T of the phase shifter and line width L of the mask pattern are varied in exposure with the phase-shifting mask shown in FIG. 4(a), represented by contour lines of the light intensity with the transmittance T and the line width L in the vertical axis and the horizontal axis, respectively. In this graph, a graph indicating the relationship of T=Ic(L)/Io(L) is superimposed. For simulation conditions, the wavelength of the exposure light $\lambda$=0.193 pm (ArF light source), the numerical aperture NA of the projection optical system of the exposure apparatus =0.6, and the coherence degree $\sigma$ of the exposure light source =0.8 (regular light source) are used.

As shown in FIG. 4(d), the condition under which the light intensity Ih (L, T) becomes the smallest can be expressed by a relationship T=Ic(L)/Io(L). This physically represents a relationship in which T×Io(L) indicating the light intensity of light transmitted through the phase shifter is in equilibrium with Ic (L) indicating the light intensity of light transmitted outside the phase shifter. Therefore, the width L of the phase shifter that provides an amplitude intensity of an opposite phase in an amplitude intensity distribution because of excessive light transmitted through the phase shifter is a width L which allows T×Io(L) to be larger than Ic (L).

It is empirically obtained from various simulation results that the width L which allows light transmitted through the phase shifter having a transmittance of 1 to be in equilibrium with light transmitted outside the phase shifter is about 0.3×$\lambda$ (light source wavelength)/NA (numerical aperture) (about 100 nm in the case of FIG. 4(d)), although this may differ depending on the type of the light source. Furthermore, as seen from FIG. 4(d), in order to prevent too much light from being transmitted through the phase shifter having a transmittance of 6% or more, the width L should be not more than twice the width of the phase shifter having a transmittance of 1 (100%). That is to say, in order to prevent too much light from being transmitted through the phase shifter having a transmittance of 6% or more, the upper limit of the width L of the phase shifter should be 0.6×$\lambda$/NA or less.

Assume that the above-described findings are applied to the outline enhancement mask. As for light transmitted outside the phase shifter in the outline enhancement mask, significantly, only light on one side rather than both sides of the phase shifter is need to be taken into consideration. Thus, the upper limit of the width L of the phase shifter in the outline enhancement mask can a half of the upper limit in the above findings. Therefore, the upper limit of the width L of the phase shifter in the outline enhancement mask is 0.3×$\lambda$/NA or less when the transmittance of the phase shifter is 6% or more. However, this is not a sufficient condition, and the upper limit of the width L of the phase shifter should be smaller than 0.3×$\lambda$/NA when the transmittance of the phase shifter is over 6%. Furthermore, the width L of the phase shift is preferably a dimension with which optical effects as a phase shifter are obtained, i.e., 0.1×$\lambda$/NA or more.

Note that herein, unless otherwise specified, various dimensions for a mask size such as the width of a phase shifter are expressed by dimensions on an material to be exposed. The actual dimension for a mask size can be obtained easily by multiplying dimensions on an exposed material by the reduction ratio M of a reduction projection optical system of an exposure apparatus.

<Contrast Generated by Combination of Outline Enhancement Mask and Off-axis Exposure>

Next, the fact that image enhancement can be realized with off-axis exposure in the outline enhancement mask will be described in detail based on changes in the contrast of a light intensity distribution when exposure is performed to the outline enhancement mask from various light source positions.

FIG. 5(a) is a plan view of an exemplary outline enhancement mask. In this case, the transmittance of the semi-light-shielding portion is 7.5%, and the transmittance of the phase shifter and the opening is 100%. The size of the opening (size on an exposed wafer) is 200 nm square, and the width of the phase shifter is 50 nm.

FIG. 5(c) shows the results obtained by calculating by optical simulations the light intensity distribution corresponding to the line AA' of FIG. 5(a) when exposure is performed to the outline enhancement mask shown in FIG. 5(a) from a point light source in various positions normalized with the numerical aperture NA, reading the light intensity Io in a position corresponding to the center of the opening in the calculation results (e.g., the light intensity distribution shown in FIG. 5(b)) and plotting the light intensity Io against each light source position. The results shown in this plot are from the optical calculations that are performed assuming that the light source wavelength $\lambda$ is 193 nm (ArF light source) and the numerical aperture NA is 0.6. In the following description, unless otherwise specified, in the optical simulations, a calculation is performed under the conditions that the wavelength$\lambda$ is 193 nm (ArF light source) and the numerical aperture NA is 0.6.

As shown in FIG. 5(c), the light intensity Io in the center of the opening becomes larger, as exposure is performed with a point light source in a light position closer to the outmost position (as a light source position more apart from the origin in FIG. 5(c)). That is to say, as exposure is performed with a light source having a larger off-axis component, the contrast is larger. This will be described more specifically with reference to the drawings. FIGS. 5(d), 5(e), and 5(f) are graphs obtained by plotting the light intensity distribution corresponding to the line AA' of FIG. 5(a) in sample points P1, P2 and P3 of the point light sources shown in FIG. 5(c), respectively. As shown in FIGS. 5(d), 5(e), and 5(f), as the position of the point light source is closer to the outmost position, in other words, as the light source is in the position that provides larger off-axis light, an image of a higher contrast is formed.

As can be seen from the above-described results, the outline enhancement mask allows enhancement of the contrast of the light intensity distribution obtained by off-axis exposure in forming small isolated space patterns such as contact patterns, which can not be achieved by the conventional halftone phase-shifting mask.

Next, the dependence of the contrast of a light intensity distribution on light source positions when exposure is performed from various light source positions to the outline enhancement mask in which a plurality of openings corresponding to densely arranged contact patterns are formed will be described.

FIG. 6(a) is a plan view of an exemplary outline enhancement mask in which a plurality of openings are provided. In the outline enhancement mask, the transmittance of a semi-light-shielding portion is 7.5%, and the transmittances of a phase shifter and the openings are both 100%. As shown in FIG. 6(a), in the outline enhancement mask in which the openings are densely arranged with a phase shifter interposed between adjacent ones of the openings, a phase shifter provided in the periphery of one of the openings is joined with another phase shifter provided in the periphery of an adjacent opening to said one opening. Note that the size of each of the openings (size on an exposed wafer) is 200 nm square, the repetition interval for the openings (dimension on an exposed wafer) is 270 nm. Thus, the width of the phase shifter (dimension on an exposed wafer) is 70 nm.

FIG. 6(c) shows the results obtained by calculating, by optical simulations, the light intensity distribution corresponding to the line AA' of FIG. 6(a) when exposure is performed to the outline enhancement mask shown in FIG. 6(a) from a point light source in various positions normalized with the numerical aperture NA, reading from the calculation results (e.g., the light intensity distribution shown in FIG. 6(b)) the light intensity Io in a position corresponding to the center of one of the openings, and then plotting the light intensity Io for each light source position.

Figure 30C:
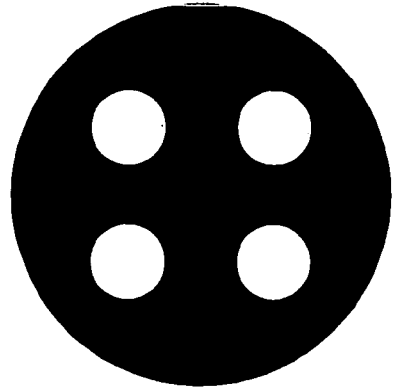
FIG. 30(c) is an illustration showing the shape of a quadrupole exposure light source.

As shown in FIG. 6(c), the distribution of the light intensity Io in the center of said one of the openings for each of light source positions varies not in a concentric configuration but the shape of the distribution of the light intensity Io varies depending on the repetition interval for the openings. Meanwhile, there is a region where the contrast is the largest basically in a light source position on the outer side. In the distribution of the light intensity Io shown in FIG. 6(c), a best contrast can be obtained by light called quadrupole exposure light source shown in FIG. 30(c) which enters in an angle of 45 degree with respect to the direction in which mask patterns align. FIGS. 6(d), 6(e), and 6(f) are graphs obtained by plotting the light intensity distribution corresponding to the line AA' of FIG. 6(a) in sample points P1, P2 and P3 of the point light sources shown in FIG. 6(c), respectively. As shown in FIGS. 6(d), 6(e), and 6(f), as the position of the point light source is closer to the outmost position, in other words, as the light source is in a position that provides larger off-axis light, an image having a higher contrast is formed.

As can be seen from the above-described results, in the outline enhancement mask, even when densely arranged contact patterns are formed, as in forming an isolated contact pattern, it is the light source position on the outer side that the highest contrast can be achieved in the image of each of the intensity distributions. Therefore, if the off-axis exposure is performed to the outline enhancement mask, an isolated contact pattern and densely arranged contact patterns can be formed simultaneously and at the same time the contrasts in the light intensity distributions can be enhanced.

<Depth of Focus in Outline Enhancement Mask>

Next, the fact that the depth of focus (DOF) is increased in the light intensity distribution formed by the outline enhancement mask will be described. In the outline enhancement mask, DOF increasing effects due to using the semi-light-shielding portion and DOF increasing effects due to a support of the phase shifter together makes the DOF markedly increase.

Hereinafter, simulation results for the defocus dependence of a dimension of the finished pattern (CD: Critical Dimension) when contact patterns are formed using the outline enhancement mask of this invention, i.e., simulation results of DOF characteristics will be described by comparing the results to those obtained in the cases where contact patterns are formed using a chromium mask, a half-tone mask and a half-tone phase-shifting mask.

Figure 7A:
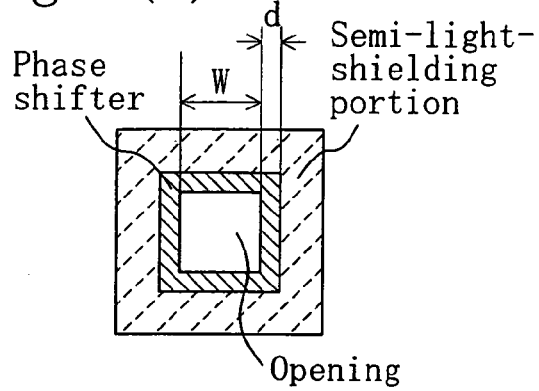
FIGS. 7(a) through 7(e) are plan views and a graph showing DOF improving effects of an outline enhancement mask in accordance with the present invention.
Figure 7B:
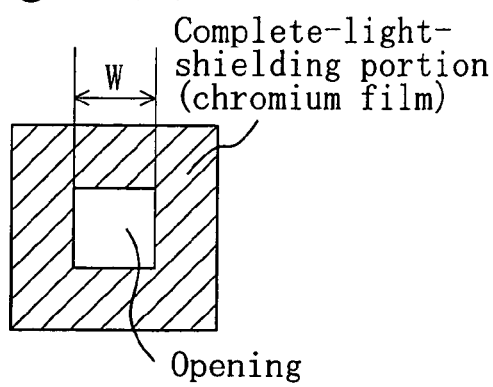
Figure 7C:
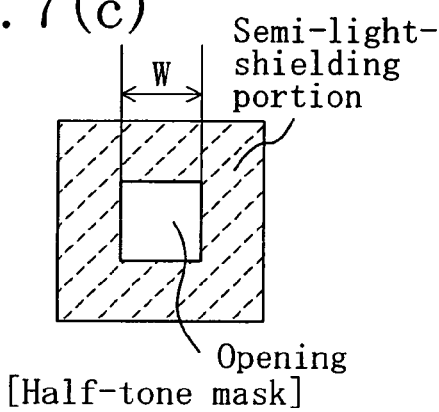
Figure 7D:
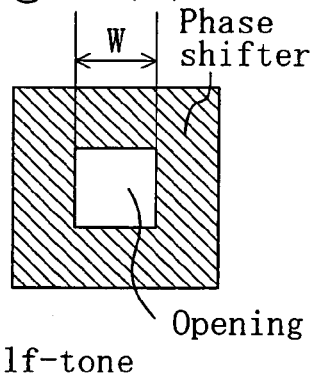

FIG. 7(a) is a plan view of an outline enhancement mask in which an opening (with a width W) corresponding to a contact pattern and a phase shifter (with a width d) located in a region of the mask surrounding the opening are provided in a semi-light-transmitting portion formed on the principal surface of a transparent substrate. Moreover, FIG. 7(b) is a plan view of a chromium mask in which an opening (with a width W) corresponding to a contact pattern is provided in a chromium film which is formed on the principal surface of a transparent substrate and is to be a complete-light-shielding portion. Moreover, FIG. 7(c) is a plan view of a half-tone mask in which an opening (with a width W) corresponding to a contact pattern is provided in a semi-light-transmitting portion formed on the principal surface of a transparent substrate. Furthermore, FIG. 7(d) is a plan view of a half-tone phase shifting mask in which an opening (with a width W) corresponding to a contact pattern is provided in a phase shifter which is formed on the principal surface of the transparent substrate and is to be a light-shielding portion. Note that dimensions for a mask size such as width W and width d are adjusted so that a dimension of the contact pattern to be formed by performing exposure in a best focus state using each of the masks of FIGS. 7(a) through 7(d) is the same with the same amount of exposure light (more specifically, light exposure of 0.12 μm).

Figure 7E:
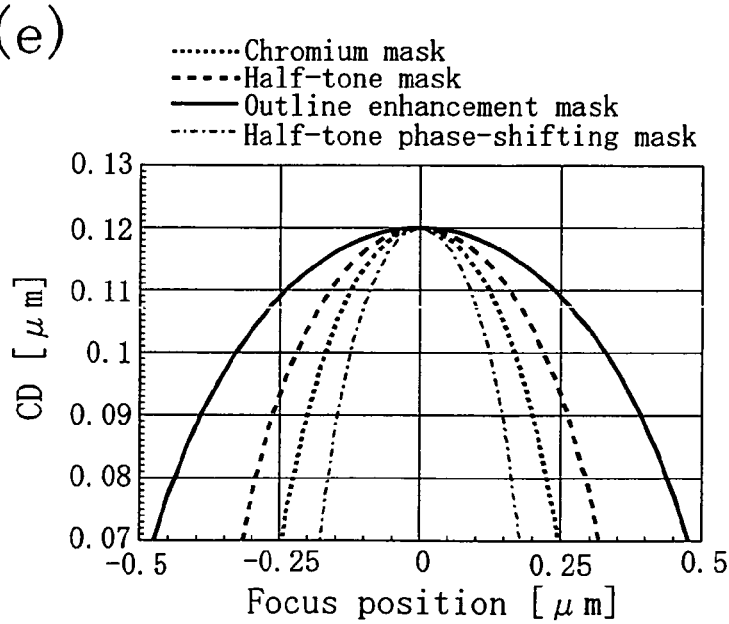

FIG. 7(e) shows the DOF characteristics in exposure using each of the masks of FIGS. 7(a) through 7(d). Note that quadrupole exposure that is a type of off-axis exposure is used in optical simulations. Moreover, the focus position in a best focus state is set as a standard position, i.e., 0 μn. As shown in FIG. 7(e), the DOF characteristics in exposure with the half-tone mask are improved, compared to the exposure with the chromium mask. The DOF characteristics in the exposure with the outline enhancement mask are further improved, compared to exposure with the half-tone mask. The DOF characteristics in exposure with the half-tone phase-shifting mask are worse than those in the exposure with the chromium mask.

As can be seen from the results, the DOF characteristics in the exposure with the outline enhancement mask are further improved, compared to the DOF characteristics in the exposures with the conventional chromium, half-tone, and half-tone phase-shifting masks.

<Transmittance Dependence of Semi-light-shielding Portion in Outline Enhancement Mask>

Figure 8A:
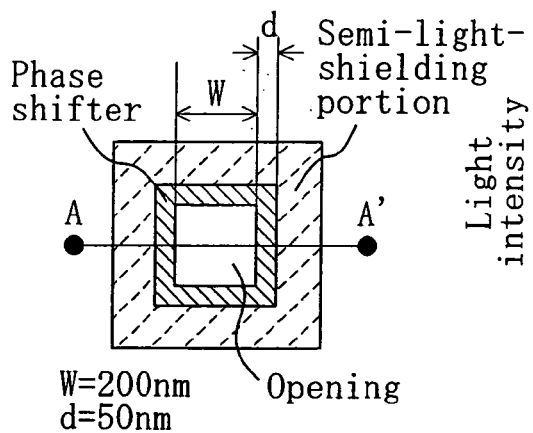
FIGS. 8(a) through 8(f) are a plan view and graphs showing the dependences of a contrast and DOF on the transmittance of a semi-light-shielding portion in an outline enhancement mask in accordance with the present invention.
Figure 8B:
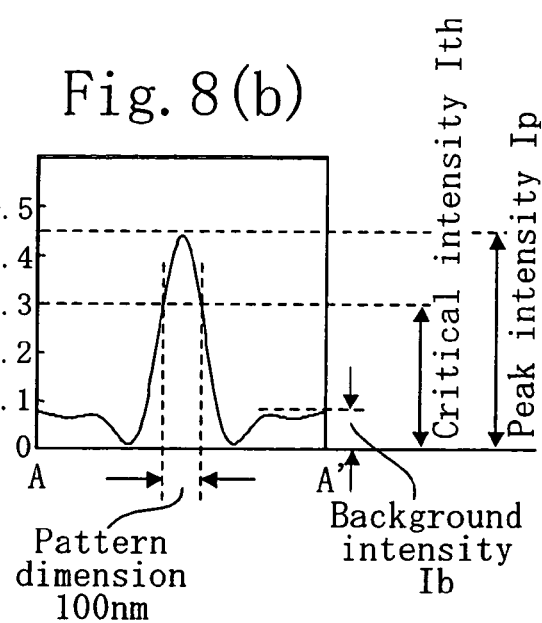

The fact that a contrast and DOF are improved by the outline enhancement mask has been described so far. Next, the dependence of a contrast and DOF on transmittance for the semi-light-shielding portion in the outline enhancement mask will be described. The following description is based on the results (FIGS. 8(b) through 8(f)) obtained from simulations of various margins in pattern formation using the outline enhancement mask shown in FIG. 8(a). FIG. 8(b) shows a light intensity distribution formed when exposure is performed. In FIG. 8(b), values for various margins which are defined when a hole pattern with a width of 100 nm is intended to be formed are also shown. More specifically, a critical intensity Ith is the light intensity at which a resist film is exposed, and the margins are defined with respect to this value. For example, if Ip is assumed to be the peak value of the light intensity distribution, Ip/Ith is proportional to the sensitivity with which a resist film is exposed, and it is more preferable that Ip/Ith is higher. If Ib is assumed to be the background intensity of light transmitted through the semi-light-shielding portion, a higher Ith/Ib means that a reduction in the thickness of the resist film or the like hardly occurs in pattern formation, and it is more preferable that Ith/Ib is higher. In general, it is preferable that a value for Ith/Ib is 2 or larger. With the foregoing in mind, each of the margins will be described.

Figure 8C:
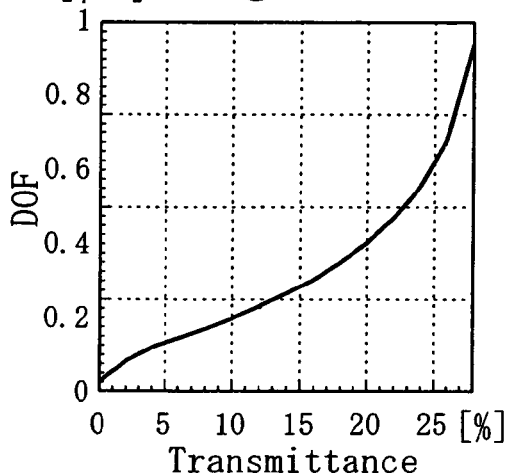
Figure 8D:
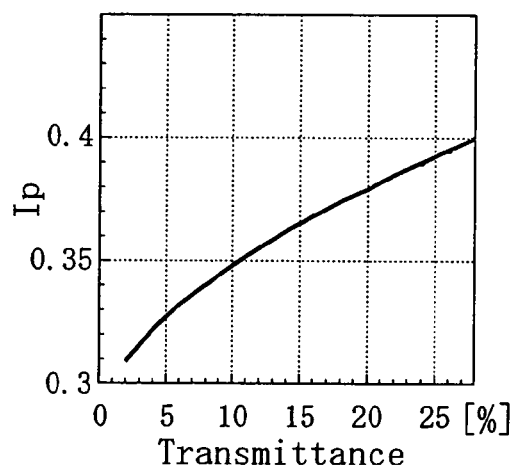

FIG. 8(c) shows the calculation results of the dependence of DOF on the transmittance of a semi-light-shielding portion in pattern formation. Here, DOF is defined as the width of a focus position in which a change in a dimension of a finished pattern is within 10%. As shown in FIG. 8(c), the higher transmittance the semi-light-shielding portion has, the more preferable it is for improvement of the DOF. FIG. 8(d) shows the calculation results of the peak value Ip for the transmittance of the semi-light shielding portion in the pattern formation. As shown in FIG. 8(d), the higher transmittance the semi-light-shielding portion has, the more preferable it is for improvement of the peak value Ip, i.e., improvement of the contrast as well. From the above-described results, in the outline enhancement mask, it is more preferable that the transmittance of the semi-light-shielding portion is higher. More specifically, as shown in FIGS. 8(c) and 8(d), the improvement rate of an exposure margin is increased with an increase of the transmittance from 0% to about 6% and it can be understood that it is preferable to use a semi-light-shielding portion having a transmittance of about 6% or more.

Figure 8E:
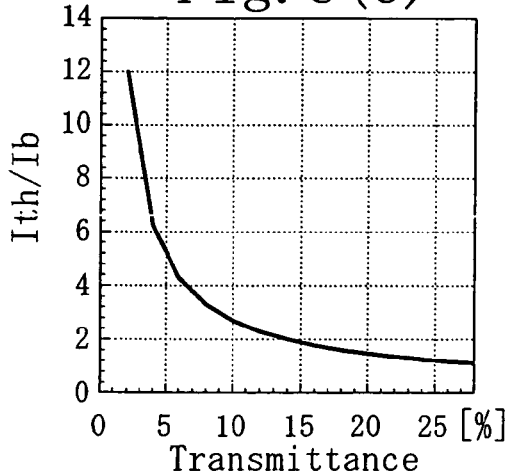
Figure 8F:
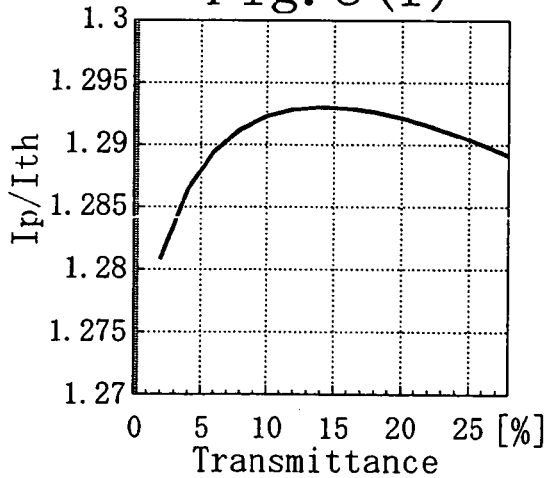

FIG. 8(e) shows the calculation results of the Ith/Ib for the transmittance of the semi-light shielding portion in the pattern formation. As shown in FIG. 8(e), the higher transmittance the semi-light-shielding portion has, the lower Ith/Ib becomes. It is not preferable for improvement of Ith/Ib that the transmittance of the semi-light-shielding portion is too high. More specifically, Ith/Ib is smaller than 2 when the transmittance of the semi-light-shielding portion is about 15%. FIG. 8(f) shows the calculation results of the Ip/Ith for the transmittance of the semi-light shielding portion in the pattern formation. As shown in FIG. 8(f), the Ip/Ith has a peak at a transmittance of about 15% of the semi-light-shielding portion.

As has been described, in the outline enhancement mask, the DOF and the contrast are improved more as the transmittance of the semi-light-shielding portion is higher, and this effect is more significant when the transmittance of the semi-light-shielding portion exceeds 6%. On the other hand, in order to prevent a reduction in the thickness of the resist film during pattern formation or to optimize the resist sensitivity, it is preferable that the maximum of the transmittance of the semi-light-shielding portion is about 15%. Therefore, the optimal value of the transmittance of the semi-light-shielding portion in the outline enhancement mask is 6% or more and 15% or less.

<Variations of Outline Enhancement Mask>

FIGS. 9(a) through 9(f) are plan views showing variations of a light shielding mask pattern constituted by a semi-light shielding portion and a phase shifter in the outline enhancement mask in which an opening corresponding to a contact pattern is provided.

Figure 9A:
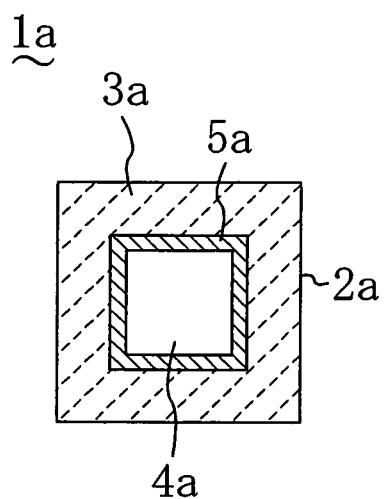
FIGS. 9(a) through 9(f) are plan views showing variations of a light shielding mask pattern constituted by a semi-light shielding portion and a phase shifter in an outline enhancement mask in accordance with the present invention in which an opening corresponding to a contact pattern is provided.

An outline enhancement mask 1a shown in FIG. 9(a) has the same structure as that of the outline enhancement mask shown in FIG. 1. That is, the outline enhancement mask 1a includes a transparent substrate 2a having light-transmitting properties with respect to exposure light, a semi-light-shielding portion 3a formed on the transparent substrate 2a, an opening 4a formed in the semi-light-shielding portion 3a and corresponding to an isolated contact pattern, and a ring-shaped phase shifter 5a formed between the semi-light-shielding portion 3a and the opening 4a so as to surround the opening 4a.

Figure 9B:
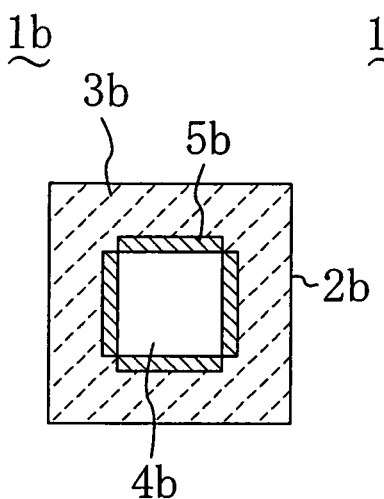
Figure 10:
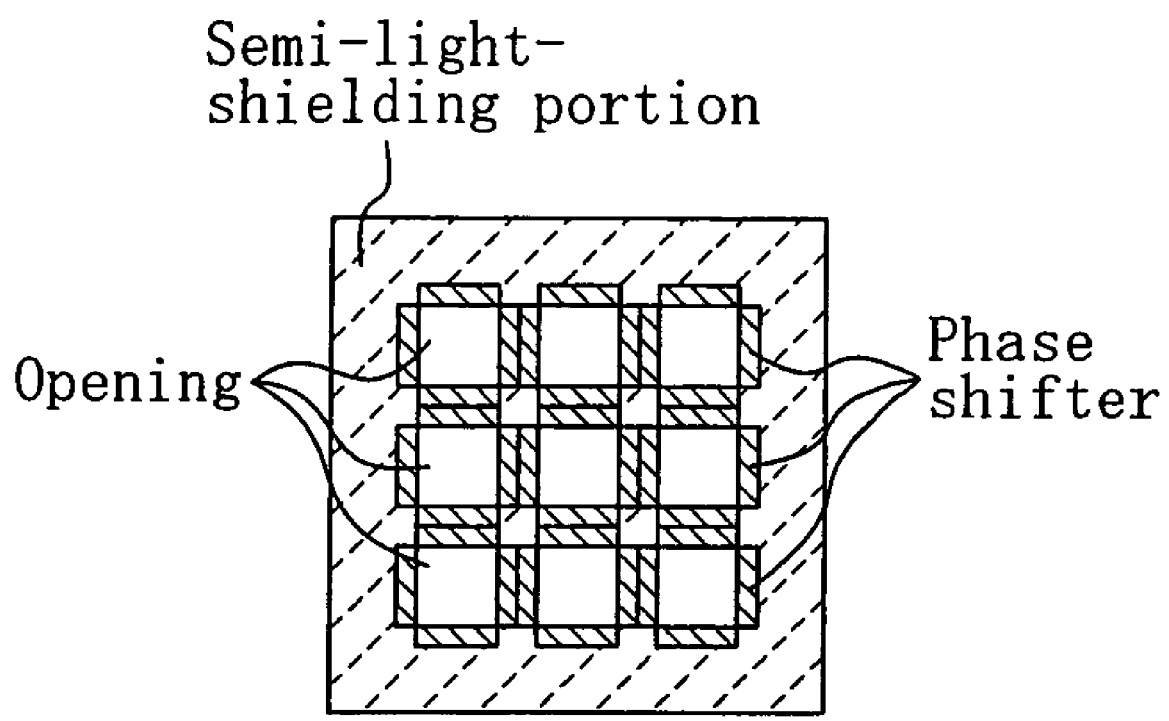
FIG. 10 is a plan view of an outline enhancement mask in accordance with the present invention in which using the mask pattern of the outline enhancement mask of FIG. 9(b) as a basic structure, openings corresponding to contact patterns are densely arranged.

The outline enhancement mask 1b shown in FIG. 9(b) includes a transparent substrate 2b having light-transmitting properties with respect to exposure light, a semi-light-shielding portion 3b formed on the transparent substrate 2b, an opening 4b formed in the semi-light-shielding portion 3b and corresponding to an isolated contact pattern, and a phase shifter 5b constituted by four rectangular phase shifter portions each of which has a side having the same length as that of an associated side of the opening 4b and is in contact with the associated side of the opening 4b. This outline enhancement mask 1b has substantially the same characteristics as those of the outline enhancement mask 1a in formation of an isolated pattern. When openings corresponding to contact patterns are densely arranged using the mask pattern of the outline enhancement mask 1b (including the semi-light-shielding portion 3b and the phase shifter 5b ) as a basic structure, further effects can be achieved. FIG. 10 is a plan view of an outline enhancement mask in which using the mask pattern of the outline enhancement mask 1b of FIG. 9(b) as a basic structure, openings corresponding to contact patterns are densely arranged. In the outline enhancement mask shown in FIG. 10, connections between phase shifters in contact with associated openings are generated in only two or less directions. Thus, it is possible to prevent an excessive light having an opposite phase from being transmitted through a phase shifter at a joint portion of adjacent one of phase shifters. Accordingly, the generation of peaks (i.e., side lobes) of the light intensity in other parts of the outline enhancement mask than the parts thereof corresponding to the openings can be prevented. That is to say, when the outline enhancement mask in which the periphery of each of the openings, except for each of corners on the diagonal line of each of the openings, is surrounded by the phase shifters (i.e., the outline enhancement mask of FIG. 9(b) or FIG. 10) is used, the principle of the outline enhancement method can hold in either case where the openings are isolated from each other or where the openings are densely arranged.

Figure 9C:
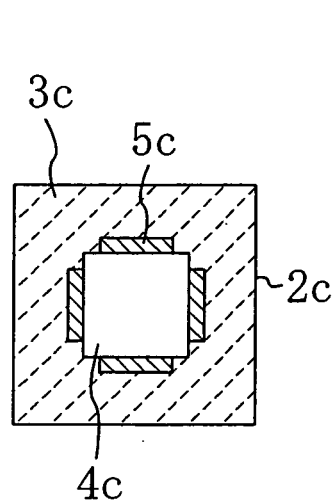

The outline enhancement mask 1c shown in FIG. 9(c) includes a transparent substrate 2c having light-transmitting properties with respect to exposure light, a semi-light-shielding portion 3c formed on the transparent substrate 2c, an opening 4c formed in the semi-light-shielding portion 3c and corresponding to an isolated contact pattern, and a phase shifter 5c constituted by four rectangular phase shifter portions each of which has a side having a length smaller than an associated side of the opening 4c and is in contact with the associated side of the opening 4c. The center of each said phase shifter portion of the phase shifter 5c is aligned with the center of the associated side of the opening 4c. In this outline enhancement mask 1c, the size of the resist pattern to be formed after exposure can be adjusted by changing the length of each said phase shifter portion of the phase shifter 5c with the width (size) of the opening 4c unchanged. For example, as the length of each said phase shifter portion of the phase shifter 5c is smaller, the size of the resist pattern becomes larger. In this case, the lower limit within which the length of each said phase shifter portion of the phase shifter 5c can be changed without losing the effect of outline enhancement is limited to about a half of the wavelength of a light source (exposure light). On the other hand, since the pattern size is changed only to an extent of about a half of the change amount of the mask size, adjusting the length of the phase shifter portion is an excellent approach to adjust the pattern size.

Figure 9D:
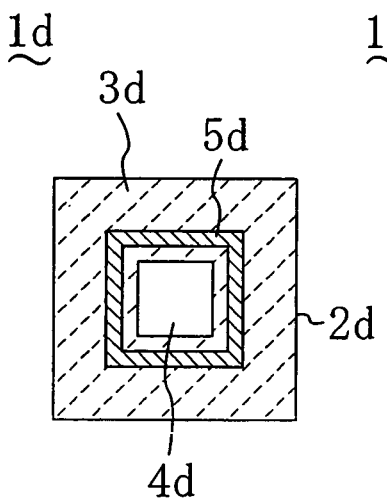

The outline enhancement mask 1d shown in FIG. 9(d) includes a transparent substrate 2d having light-transmitting properties with respect to exposure light, a semi-light-shielding portion 3d formed on the transparent substrate 2d, an opening 4d formed in the semi-light-shielding portion 3d and corresponding to an isolated contact pattern, and a ring-shaped phase shifter 5d formed in a portion of the semi-light-shielding portion 3d extending from the boundary of the semi-light-shielding portion 3d and the opening 4d by a predetermined dimension. That is to say, the ring-shaped phase shifter 5d is formed by forming an ring-shaped opening in the semi-light-shielding portion 3d and a ring-shaped semi-light-shielding portion 3d is present between the phase shifter 5d and the opening 4d.

Figure 9E:
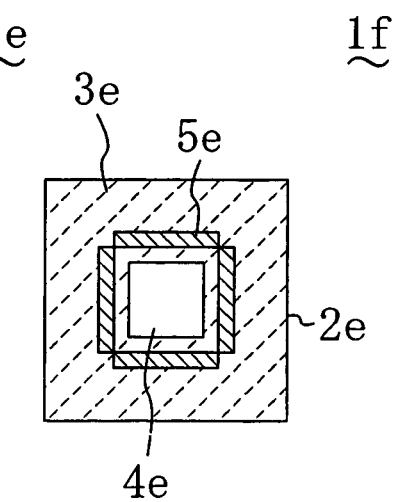

The outline enhancement mask 1e shown in FIG. 9(e) includes a transparent substrate 2e having light-transmitting properties with respect to exposure light, a semi-light-shielding portion 3e formed on the transparent substrate 2e and having a transmittance which allows part of the exposure light to be transmitted, an opening 4e formed in the semi-light-shielding portion 3e and corresponding to an isolated contact pattern, and a phase shifter 5e formed in a portion of the semi-light-shielding portion 3e extending from the boundary of the semi-light-shielding portion 3e and the opening 4e by a predetermined dimension. The phase shifter 5e is constituted by four phase shifter portions each of which has a rectangular shape having a length larger than an associated one of sides of the opening 4e and a corner in contact with an associated one of corners of the phase shifters on the diagonal line of the opening 4e. In this case, a ring-shaped semi-light-shielding portion 3e is present between the phase shifter 5e and the opening 4e. In this outline enhancement mask 1e, the size of the resist pattern to be formed after exposure can be adjusted by changing only the width (size) of the opening 4e with the size and the arrangement of the phase shifter 5e unchanged. For example, as the width of the opening 4e is increased, the size of the resist pattern is increased. According to this approach of adjusting the pattern size by changing only the width of the opening, MEEF (Mask Error Enhancement Factor: the ratio of the change amount of the pattern size with respect to the change amount of the mask size) is reduced to about a half of that obtained by an approach of scaling both the opening and the phase shifter at the same time to adjust the pattern size.

Figure 9F:
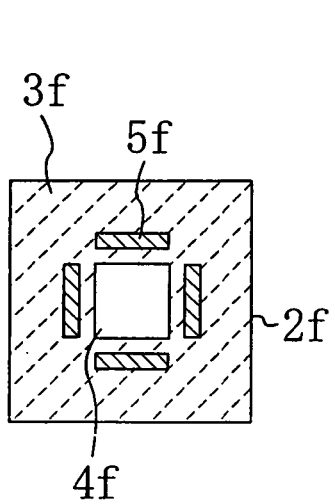

The outline enhancement mask 1f shown in FIG. 9(f) includes a transparent substrate 2f having light-transmitting properties with respect to exposure light, a semi-light-shielding portion 3f formed on the transparent substrate 2f, an opening 4f formed in the semi-light-shielding portion 3f and corresponding to an isolated contact pattern, and a phase shifter 5f located in a portion of the semi-light-shielding portion 3f extending from the boundary of the semi-light-shielding portion 3f and the opening 4f by a predetermined dimension. The phase shifter 5f is constituted by four phase shifter portions, each of which has a rectangular shape with the same length as that of an associated one of sides of the opening 4f and is faced to the associated side of the opening 4f. In this case, the length of each said phase shifter portion of the phase shifter 5f may be larger or smaller than that of the associated side of the opening 4f. According to this outline enhancement mask if, the size adjustment of the resist pattern can be performed in the same manner as in the case of the outline enhancement mask 1c shown in FIG. 9(c).

In the outline enhancement masks shown in FIGS. 9(d) through 9(f), it is preferable that the width of the semi-light-shielding portion between the opening and the phase shifter is a dimension which allows an interference effect of light to be provided by the phase shifter, that is, about $\frac{1}{10}$ of $\lambda/NA$ or less ($\lambda$ is wavelength of exposure light, NA is numerical aperture). In the outline enhancement masks shown in FIGS. 9(a) through 9(f), a square is used as the shape of the opening. However, a polygon such as an octagon, a circle, or other shapes may be used. The shape of the phase shifter is not limited to a continuous ring shape or a plurality of rectangles. For example, the phase shifter can be formed by aligning a plurality of square phase shifter portions.

Figure 11:
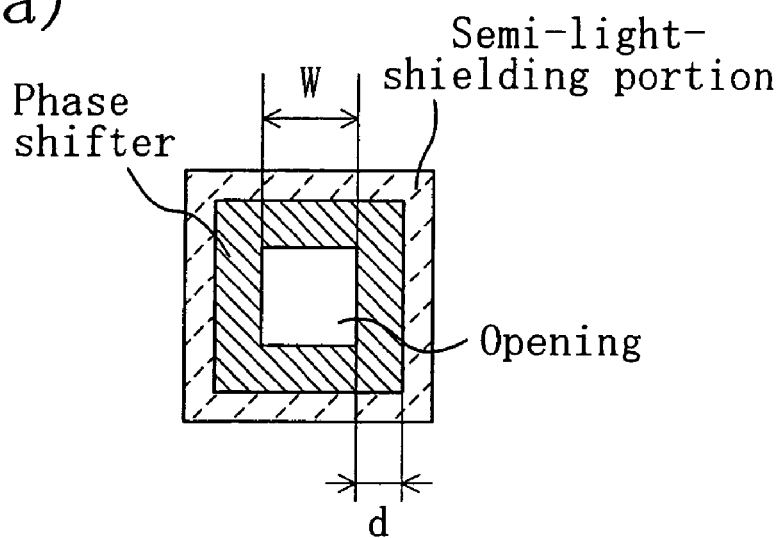
FIGS. 11(a) and 11(b) are a plan view and a graph showing the dependence of DOF on a dimension of an opening in an outline enhancement mask in accordance with the present invention.
Figure 11:
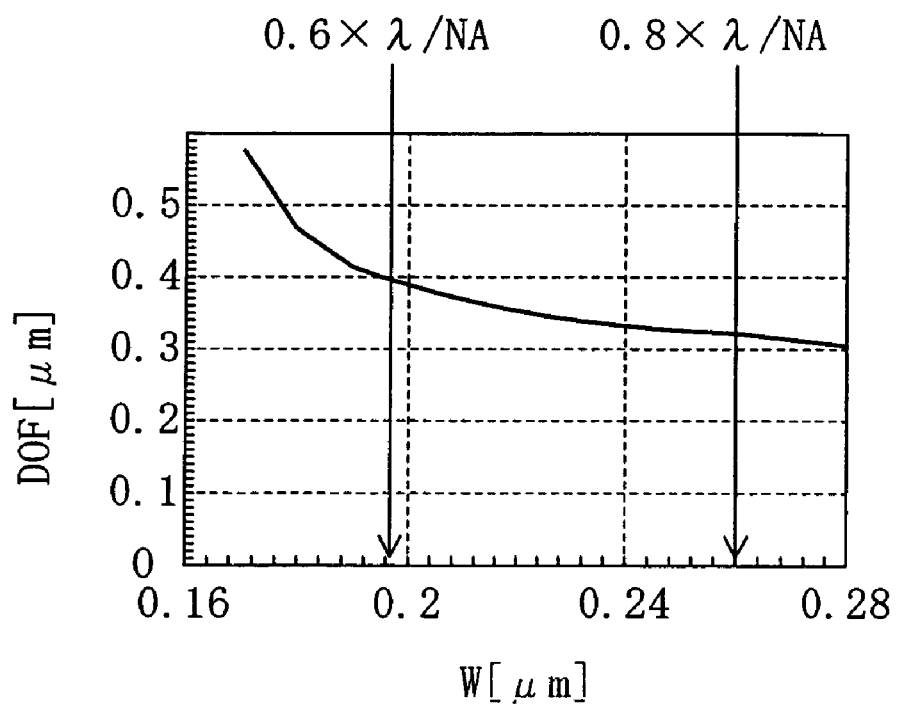

Next, the dependence of DOF improving characteristics on the positional relationship between the opening and the phase shifter in an outline enhancement mask will be described. FIG. 11(a) is a plan view illustrating the structure of an outline enhancement mask used in a simulation for obtaining the relation between a dimension of an opening (opening width) and the DOF. FIG. 11(b) is a graph showing simulation results for the dependence of the DOF on the opening width. More specifically, the outline enhancement mask shown in FIG. 11(a) is defined as a generalized structure in which in a semi-light-shielding portion covering the principal surface of a transparent substrate, an opening with a width W and a ring-shaped phase shifter which is located on the periphery of the opening and has a width d are provided. Also, FIG. 11(b) shows simulation results of the DOF characteristics for the outline enhancement mask of FIG. 11(a) when W is changed within the range from 170 nm to 280 nm with d fixed at 50 nm. In this case, for exposure conditions in the simulation, $\lambda$ is 193 nm, NA is 0.6 and an annular exposure light source is used.

As shown in FIG. 11(b), when the opening width W is 0.8×$\lambda$/NA or less, an interference effect of light by the phase shifter is obtained. Therefore, the DOF becomes a preferable value. More specifically, the opening width W is 0.6×$\lambda$/NA or less, a DOF improving effect markedly appears. Accordingly, the positional relationship in which the phase shifter is provided at the boundary between the opening and the semi-light-shielding portion is the best positional relationship (more precisely, the positional relationship between the opening and the phase shifter in the outline enhance mask) to improve the DOF characteristics. More specifically, the range of influence of the interference function of the phase shifter extends to the center of the opening, and therefore the outline enhancement mask exhibits a special DOF characteristic improving effect. The width W of the opening with which the effect can be reliably achieved, i.e., the interference function of the phase shifter is generated to a higher degree is 0.8×$\lambda$/NA or less.

As has been described, among the shapes of the mask patterns of FIGS. 9(a) through 9(f), ones of FIGS. 9(a) through 9(c) in which a phase shifter is provided between a semi-light-shielding portion and an opening are preferable in view of optimization of the DOF characteristics. On the other hand, when it is intended to perform pattern size adjustment while suppressing MEEF, the shapes of the mask patterns of FIGS. 9(d) through 9(f) in which a phase shifter is located in a portion of the semi-light-shielding portion extending from the boundary of a semi-light-shielding portion and an opening by a predetermined dimension is preferable.

Note that in this embodiment, the case where a space pattern which is to be a contact pattern is formed has been described. However, instead of this, when other space patterns than a contact pattern are formed, the same effects can be achieved.

Moreover, in this embodiment, the case where a space pattern is formed using the outline enhancement mask in which a light-shielding mask pattern surrounds an opening (light-transmitting portion) has been described. However, assume that a line pattern is formed using the outline enhancement mask in which an opening (light-transmitting portion) surrounds a light-shielding mask pattern. If, for example, a phase shifter is disposed in the periphery of a line-shaped semi-light-shielding portion, i.e., in the vicinity of a light-transmitting portion in the mask pattern, the same effects can be achieved. In this case, in view of optimization of the DOF characteristics, it is preferable to adopt the mask pattern shape in which a phase shifter is provided in the boundary of a semi-light-shielding portion and a light-transmitting portion. On the other hand, when it is intended to perform pattern size adjustment while suppressing MEEF, the shape of the mask patterns in which a phase shifter is located in a portion of the semi-light-shielding portion extending from the boundary of a semi-light-shielding portion and an opening by a predetermined dimension is preferable.

SECOND EMBODIMENT

Next, a photomask using a method for improving resolution with a photomask invented by the inventor of the present application to achieve the present invention, and, more specifically, a photomask using a "center line enhancement method" to improve the resolution of isolated line patterns will be described.

Figure 12:
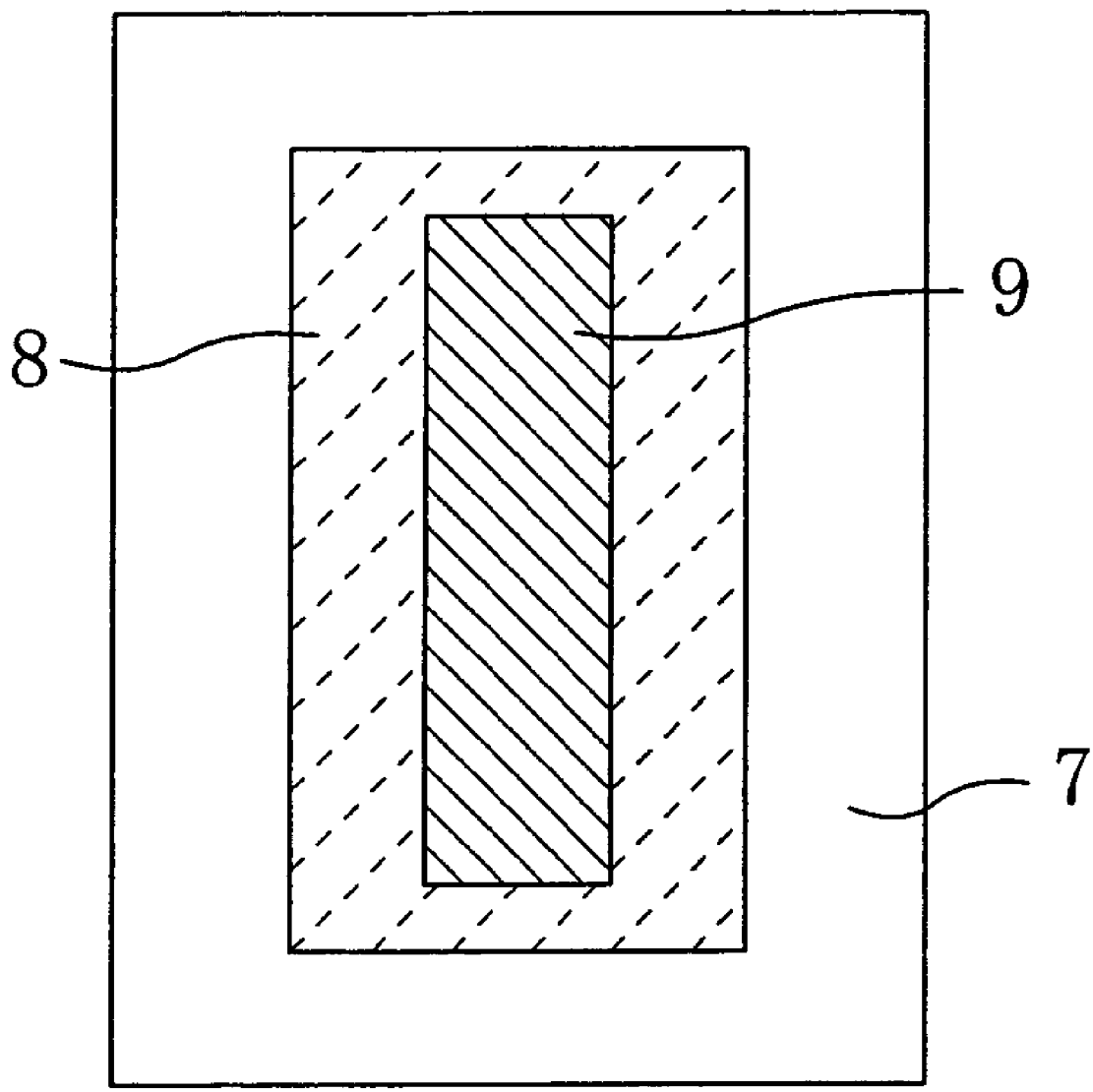
FIG. 12 is a plan view of a photomask using a center line enhancement method in accordance with a second embodiment of the present invention.

FIG. 12 is a plan view of a photomask using a center line enhancement method in accordance with a second embodiment of the present invention (hereinafter, referred to as "image enhancement mask"). More specifically, FIG. 12 is a plan view of an image enhancement mask for forming an isolated line pattern.

As shown in FIG. 12, an image enhancement mask 6 includes a transparent substrate 7 having light-transmitting properties with respect to exposure light, a semi-light-shielding portion 8 formed on the transparent substrate 7, having a transmittance which allows part of exposure light to be transmitted and corresponding to an isolated line pattern, and a phase shifter 9 provided in an opening formed in the semi-light-shielding portion 8. In the image enhancement mask 6, the semi-light-shielding portion 8 which transmits exposure light in the same phase as that of the light-transmitting portion 7 and the phase shifter 9 that transmits exposure light in the phase opposite to that of the light-transmitting portion 7 together form a mask pattern.

Also, the semi-light shielding portion 8 has a transmittance of 15% or less with respect to exposure light. The transmittance of the semi-light shielding portion 8 is preferably 6% or more and 15% or less. As a material for the semi-light shielding portion 8, for example, a thin film (having a thickness of 50 nm or less) made of a metal such as Cr, Ta, Zr and Mo or an alloy including one of these metals can be used. As the alloy, more specifically, Ta—Cr alloy, Zr—Si alloy, Mo—Si alloy or the like can be used. Furthermore, when the thickness of the semi-light-shielding portion 8 is intended to be increased, a material containing an oxide such as ZrSiO, Cr—Al—O, TaSiO and MoSiO may be used.

Moreover, the transmittance of the phase shifter 9 with respect to exposure light is higher than that of the semi-light-shielding portion 8 and equal to or less than that of the light-transmitting portion (i.e., part of the transparent substrate 7 in which mask pattern is not formed).

<Principle of Center Line Enhancement Method>

Next, a "center line enhancement method" to improve the resolution of isolated line patterns will be described by taking formation of small line patterns by a positive resist process as an example. The basic principle of the "center line enhancement method" is that a dark portion in a light intensity distribution is formed by a phase shifter functioning in a similar manner to a non-transparent pattern to improve a contrast, as that of the "outline enhancement method".

First, effects obtained by providing a phase shifter in the semi-light-shielding portion constituting a mask pattern having a line shape will be described with reference to FIGS. 13(a) through 13(c).

FIG. 13(a) shows a plan view of an image enhancement mask in which a phase shifter with a width S (having a transmittance Ts) is provided in a semi-light-shielding portion (having a transmittance Tc) constituting a line-shaped mask pattern with a width L and a graph showing the intensity of light transmitted through the image enhancement mask and transferred onto part of a material to be exposed corresponding to the line AA' together. In this case, the light intensity corresponding to the center of the mask pattern is expressed as Ie (L, S). FIG. 13(b) shows a plan view of a mask in which a semi-light shielding pattern made of the semi-light-shielding portion with a width L (having a transmittance Tc) is provided and a graph showing the intensity of light transmitted through the mask and transferred onto part of a material to be exposed corresponding to the line AA' together. In this case, the light intensity corresponding to the center of the semi-light-shielding pattern is expressed as Ic (L). Note that each of the semi-light-shielding portions shown in FIGS. 13(a) and 13(b) transmits light in the same phase as that of a light-transmitting portion. FIG. 13(c) shows a plan view of a mask in which a phase shifting pattern made of a phase shifter with a width S (having a transmittance of Ts) is provided in a complete-light-shielding-portion covering the surface of the mask and a graph showing the light intensity of light transmitted through the mask and transferred onto part of a material to be exposed corresponding to the line AA' together. In this case, the light intensity corresponding to the center of the phase shift pattern is expressed as Io (S).

The image enhancement mask shown in FIG. 13(a) has a structure in which a mask structure shown in FIG. 13(b) and a mask structure shown in FIG. 13(c) are overlapped each other. Thus, in the relationship between L and S in which Ic (L) and Io (S) are in equilibrium with each other, Ie (L, S) can be minimized. In this manner, enhancement of a contrast with the image enhancement mask of FIG. 13(a) can be achieved. That is to say, by providing the phase shifter in the semi-light-shielding portion constituting a line shaped mask pattern, the contrast of the light intensity distribution can be enhanced. More specifically, based on the principle of the center line enhancement method, the contrast in the center of the mask pattern can be enhanced.

Figure 14A:
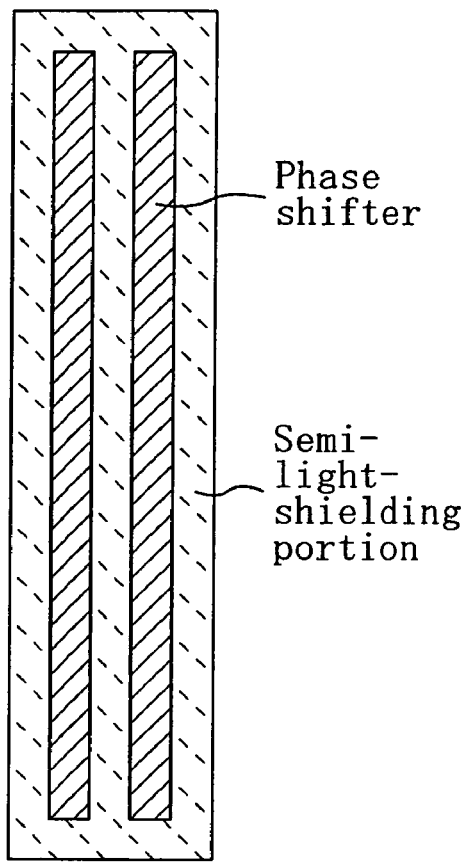
FIGS. 14(a) and 14(b) are plan views showing variations of the shape of a phase shifter in an image enhancement mask in accordance with the present invention.
Figure 14B:
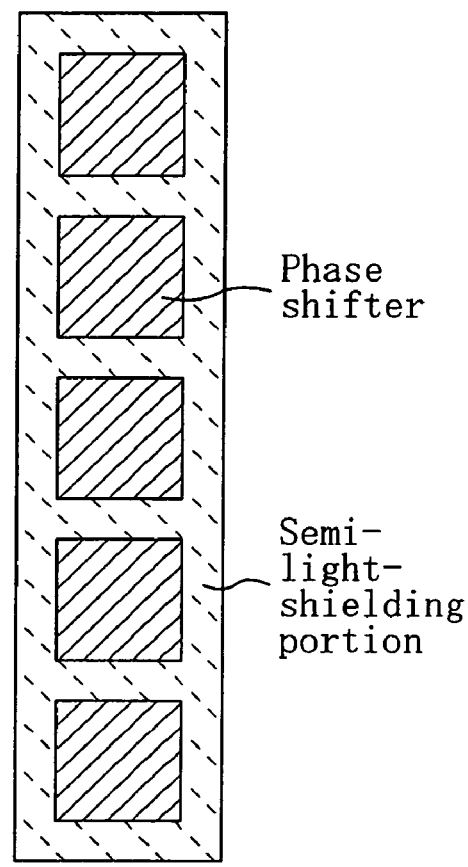

The shape of the phase shifter (an opening provided in the semi-light-shielding portion) for generating the light intensity Io (S) in the image enhancement mask does not necessarily correspond to the shape of the semi-light-shielding portion. FIGS. 14(a) and 14(b) are plan views illustrating other shapes for the phase shifter in the image enhancement mask. More specifically, each of FIGS. 14(a) and 14(b) illustrates a phase shifter provided in a semi-light-shielding portion constituting a line-shaped mask pattern. A shifter shown in FIG. 14(a) includes two rectangular patterns and a shifter shown in FIG. 14(b) includes five square patterns. With an image enhancement mask in which the phase shifter of FIG. 14(a) or FIG. 14(b) is provided, the same effects as those of the image enhancement mask of FIG. 12 can be obtained. Therefore, the shape of the image enhancement mask can be set within a size range in which it can be fit in the semi-light-shielding portion to be an arbitrary shape such as rectangular, square, circular and polygonal shapes. The reason for this is that a small opening optically behaves in the totally same manner without depending on the shape thereof, with the same intensity of light transmitted through the opening.

<DOF Characteristics in Image Enhancement Mask>

Figure 15A:
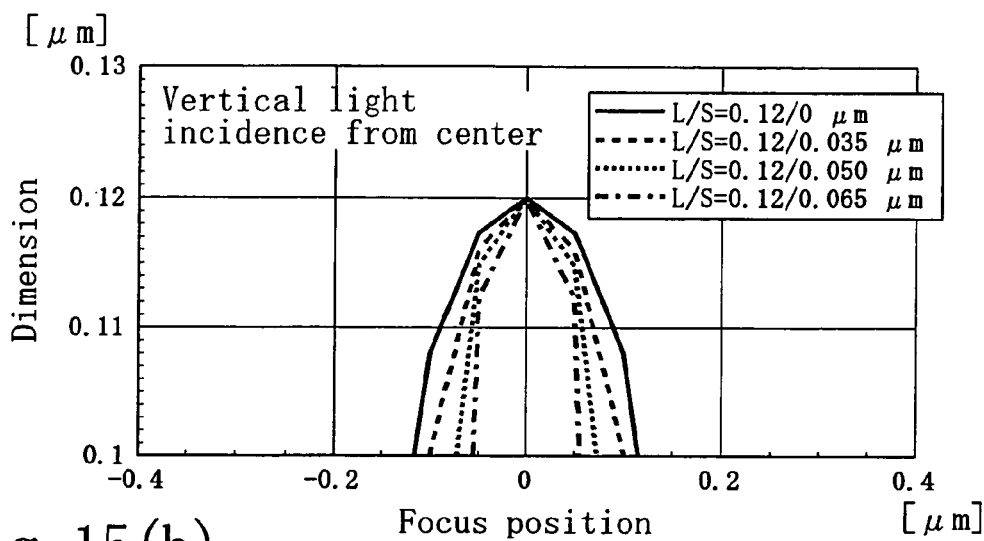
FIGS. 15(a) through 15(c) are graphs showing calculation results, obtained by simulations, for DOF characteristics when exposure is performed from different light incident directions using a plurality of image enhancement masks in accordance with the present invention, each including an opening to be a phase shifter with a different dimension to those of other openings.
Figure 15B:
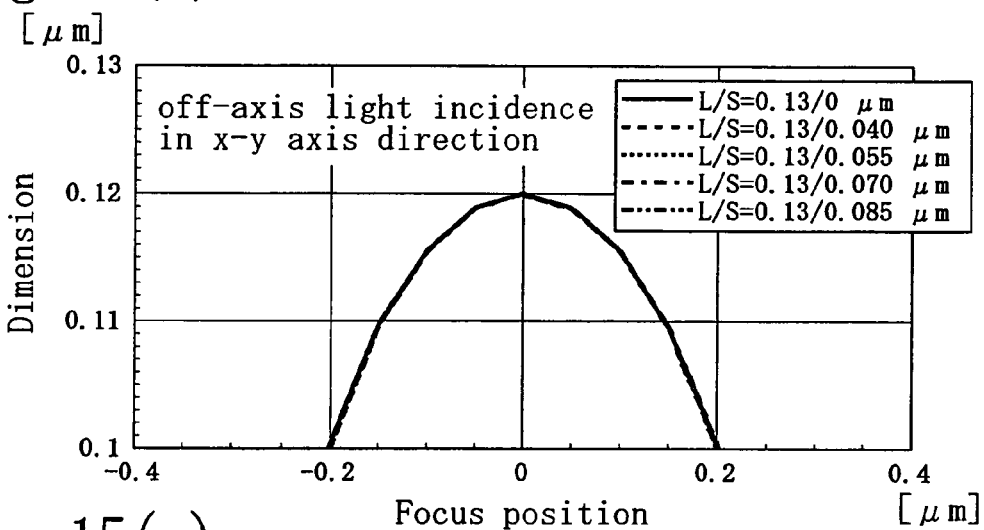
Figure 15C:
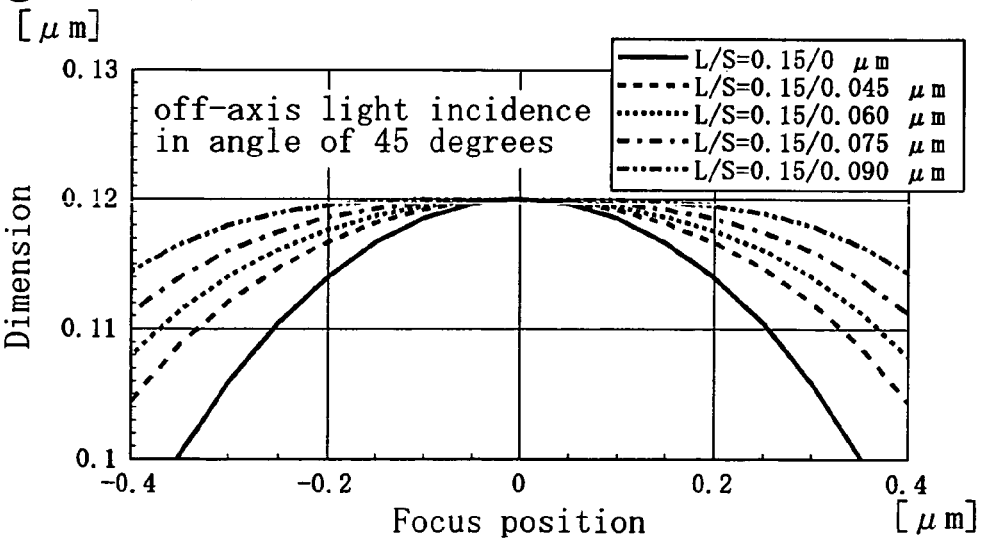

In order to verify the effectiveness of the combination of an image enhancement mask and off-axis exposure, the inventor of the present application has performed simulations to calculate DOF (depth of focus) characteristics obtained when exposure is performed from different light incident directions using a plurality of image enhancement masks, each including an opening to be a phase shifter with a different size to those of other openings. FIGS. 15(a) through 15(c) show results of the simulations. FIG. 15(a) shows simulation results for the case of vertical incident exposure in which the light incident direction was from the center of light source coordinates (i.e., coordinates in a coordinate plane in which the width direction and length direction of a line shaped mask pattern are let be the x-axis and the y-axis, respectively). FIG. 15(b) shows simulation results for the case of off-axis exposure in which the light incident direction was from the x-axis or the y-axis. FIG. 15(c) shows simulation results for the case of off-axis exposure in which the light incident direction was an angle of 45 degree on the light source coordinate plane (i.e., the direction making a 45-degree angle with the x-axis or the y-axis). In this case, as the image enhancement mask, an image enhancement mask with an opening width adjusted so that light-shielding properties become maximum with respect to each of the exposure light incident directions (hereinafter, referred to as "optimal opening width), an image enhancement mask with a smaller opening width than the optimal opening width and an image enhancement mask with a larger opening width than the optimal opening width were used. Moreover, for comparison, the DOF characteristics obtained by performing exposure with a photomask (complete-light-shielding mask) in which in place of the mask pattern of the image enhancement mask, a complete-light-shielding pattern having the same shape as that of the mask pattern is provided were calculated with simulations. Note that the DOF characteristics were evaluated, when an exposure energy was set so that a dimension of a pattern (resist pattern) formed to be corresponding to each of the mask pattern is 0.12 μm in a best focus state, based on how a pattern size was varied by defocus. Moreover, in FIGS. 15(a) through 15(c), the mask pattern width is expressed by L and the opening width is expressed by S. The focus position (the horizontal axis) 0 corresponds to the best focus position.

As shown in FIG. 15(a), assume that the light incident direction is from the center of light source coordinates. As the opening width of the image enhancement mask increased, the DOF characteristics are deteriorated. Thus, the DOF characteristics obtained when the complete-light-shielding mask (L=0.12 μm, S=0 μm) was used (hereinafter, referred to be as L/S=0.12/0 μm) were the best. On the other hand, as shown in FIG. 15(b), when the light incident direction is from the x-axis or the y-axis, the DOF characteristics do not depend on the opening width of the image enhancement mask. Thus, the DOF characteristics obtained when the image enhancement mask was used were the same as those obtained when the complete-light-shielding mask (L/S=0.13/0 μm) was used. However, as shown in FIG. 15(c), when the light incident direction was an angle of 45 degree on the light source coordinate plane, the DOF characteristics are improved with the opening width of the image enhancement mask increased. Thus, the DOF characteristics obtained when the complete-light-shielding mask (L/S=0.15/0 μm) was used were the worst. That is to say, it has been shown that in order to improve the defocus characteristics of a light intensity distribution generated due to interference of light diffracted by a mask pattern and light transmitted through the mask pattern in off-axis exposure at an angle of 45 degrees, light transmitted through the mask pattern (i.e., a region of the mask pattern in which a phase shifter is disposed) may be increased as much as possible within a range in which necessary effective light shielding properties can be achieved.

Figure 16A:
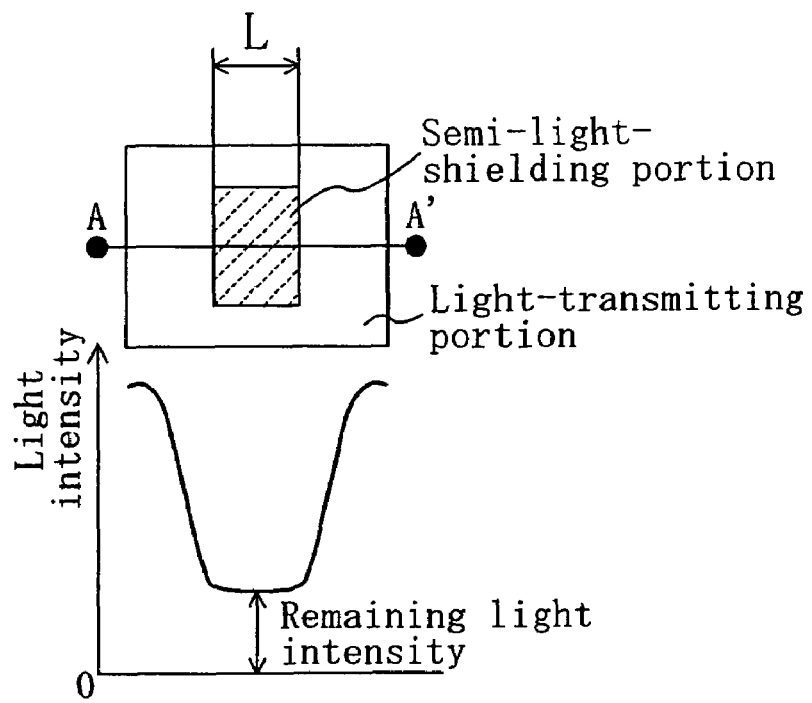
FIGS. 16(a) and 16(b) are plan views and a graph showing advantages obtained by using a semi-light-shielding portion as a light-shielding portion constituting a mask pattern in an image enhancement mask in accordance with the present invention.
Figure 16B:
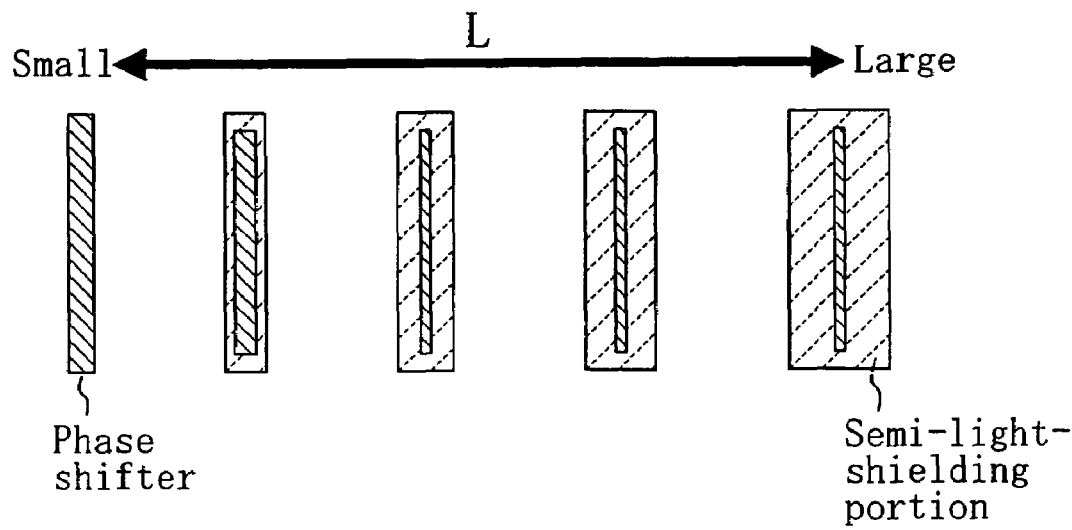

Next, a position where a phase shifter is to be disposed in an image enhancement mask will be described. FIG. 16(a) shows a plan view of a photomask in which a semi-light-shielding pattern formed of a semi-light-shielding portion and having a width L and the light intensity of light transmitted through the mask and transferred to a position of a material to be exposed corresponding to the line AA' together. Assume that an image enhancement mask in which a phase shifter is provided in the semi-light-shielding pattern is formed. As the width L of the semi-light-shielding pattern increased, the width of a phase shifter which allows the maximum contrast becomes smaller. However, as shown in FIG. 16(a), even when the semi-light-shielding pattern has a very large width, the light intensity corresponding to the center of the semi-light-shielding pattern never becomes 0 and remaining light intensity is always present. Accordingly, assume that the semi-light-shielding portion is used as a light-shielding portion constituting a mask pattern in the image enhancement mask. Although the width of the phase shifter is reduced with the width L of the semi-light-shielding portion increased, it is necessary to provide a phase shifter in equilibrium with the remaining light intensity even when the width of the semi-light-shielding portion is very large, as shown in FIG. 16(b). Therefore, by adjusting the minimum size of a phase shifter which can be formed on the mask to the remaining light intensity, it becomes possible to form all of necessary phase shifters for achieving the image enhancement mask. However, it is necessary to determine the transmittance of the semi-light-shielding portion so that the remaining light intensity is a level at which a resist film is not exposed in actual exposure.

THIRD EMBODIMENT

Hereinafter, a photomask in accordance with a third embodiment of the present invention and a method for generating mask data for the photomask will be described with reference to the accompanying drawings.

Figure 17:
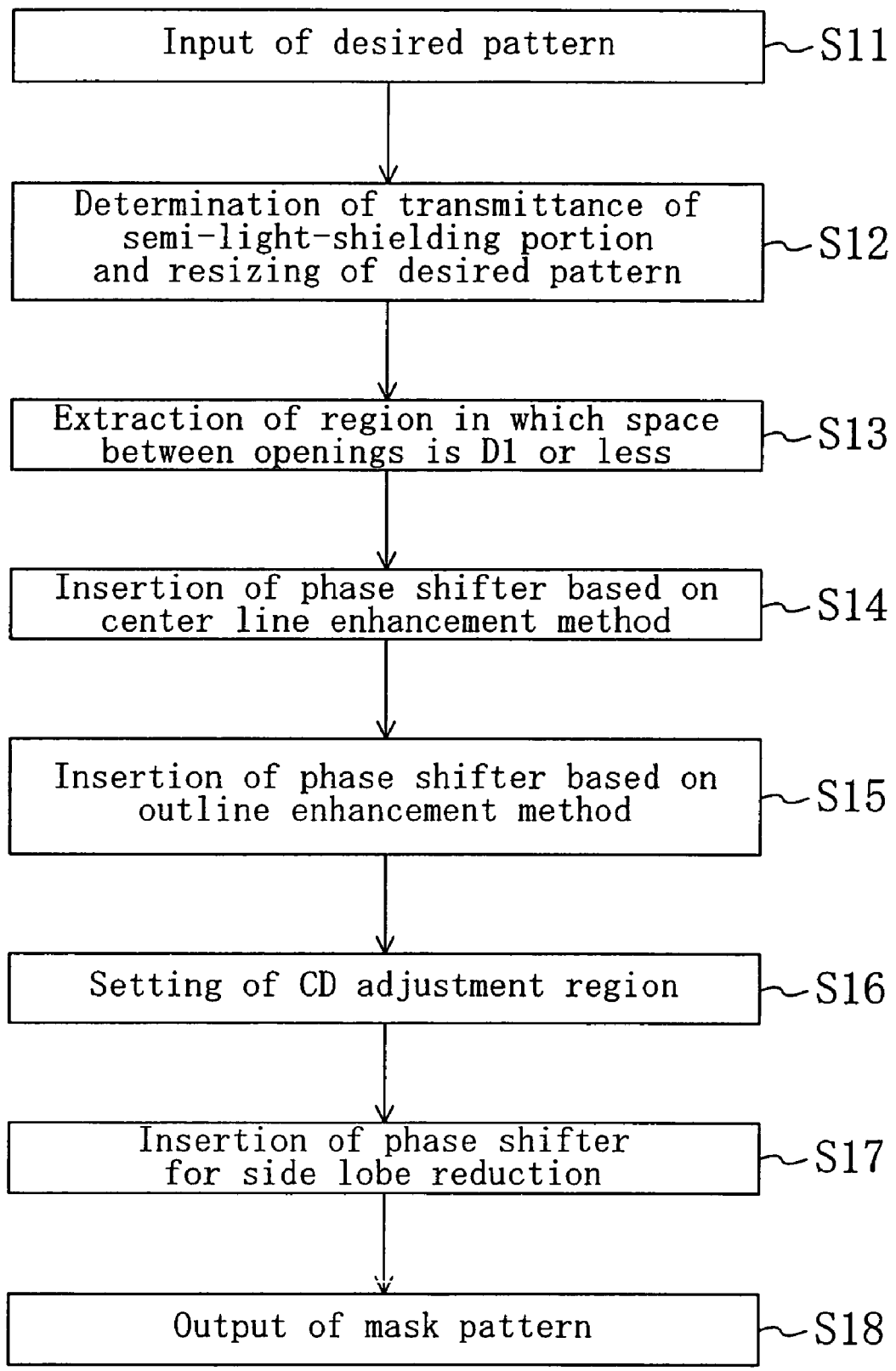
FIG. 17 is a flowchart of a mask data generation method in accordance with a third embodiment of the present invention.

FIG. 17 shows a flow chart of a mask data generation method in accordance with the third embodiment, using the outline enhancement method and the center line enhancement method. More specifically, FIG. 17 is a flowchart of a mask data generation method in which a mask pattern is formed based on a desired pattern which is to be formed using a photomask. Also, FIGS. 18(a) through 18(d) and FIGS. 19(a) and 19(d) are plan views illustrating respective process steps for forming a mask pattern for space pattern formation by using the mask data generation method of FIG. 17. Moreover, FIGS. 20(a) through 20(d) and FIGS. 21(a) through 21(c) are plan views illustrating respective process steps for forming a mask pattern for line pattern formation by using the mask data generation method of FIG. 17.

Figure 18A:
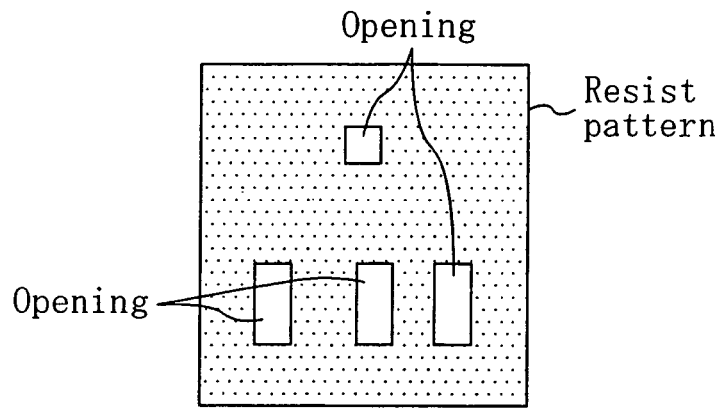
FIGS. 18(a) through 18(d) are plan views illustrating respective process steps for forming a mask pattern for space pattern formation by using the mask data generation method of the third embodiment of the present invention.
Figure 20A:
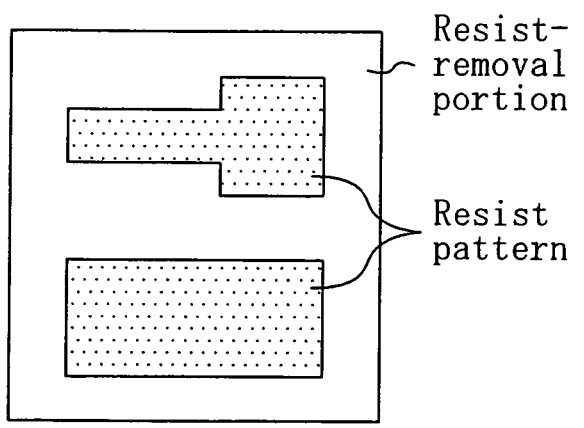
FIGS. 20(a) through 20(d) are plan views illustrating respective process steps for forming a mask pattern for formation of a line pattern by using the mask data generation method of the third embodiment of the present invention.

First, in Step S11, a desired pattern to be formed using a photomask is input. FIGS. 18(a) and 20(a) illustrate examples of desired patterns, respectively. A desired pattern shown FIG. 18(a) is a resist-removed pattern (openings in a resist pattern) and a desired pattern shown in FIG. 20(a) is a resist pattern.

Figure 18B:
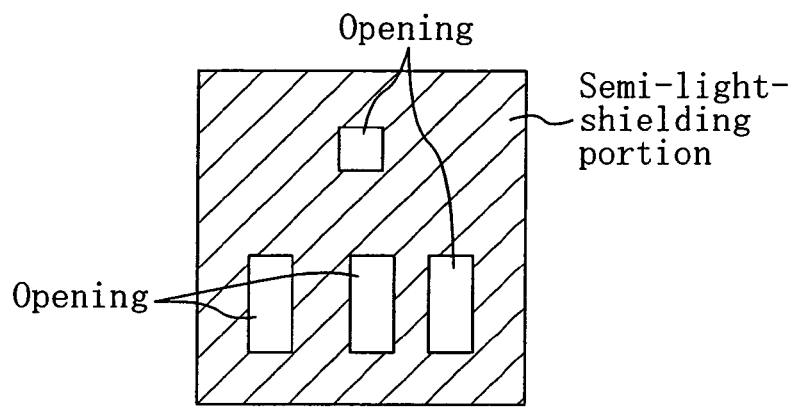
Figure 20B:
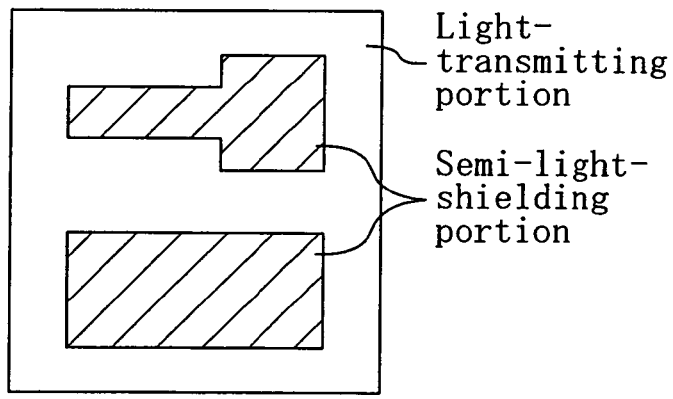

Next, in Step S12, the shape of a mask pattern is determined based on a desired pattern, and the transmittance Tc of a semi-light-shielding portion used in the mask pattern is set. In this step, depending on which over-exposure or under-exposure is selected for exposure conditions, re-sizing is performed to the desired pattern to enlarge or reduce the size of the pattern. FIGS. 18(b) and 20(b) illustrate examples of mask patterns formed based on the re-sized desired patterns, respectively. The mask pattern of FIG. 18(b) includes a semi-light-shielding portion surrounding each of openings (light-transmitting portion) corresponding to the desired pattern. The mask pattern of FIG. 20(b) includes a semi-light-shielding portion surrounded by a light-transmitting portion.

Figure 18C:
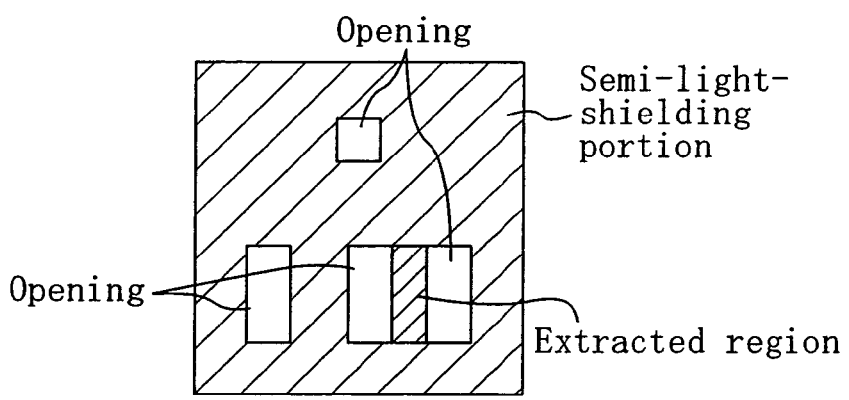
Figure 20C:
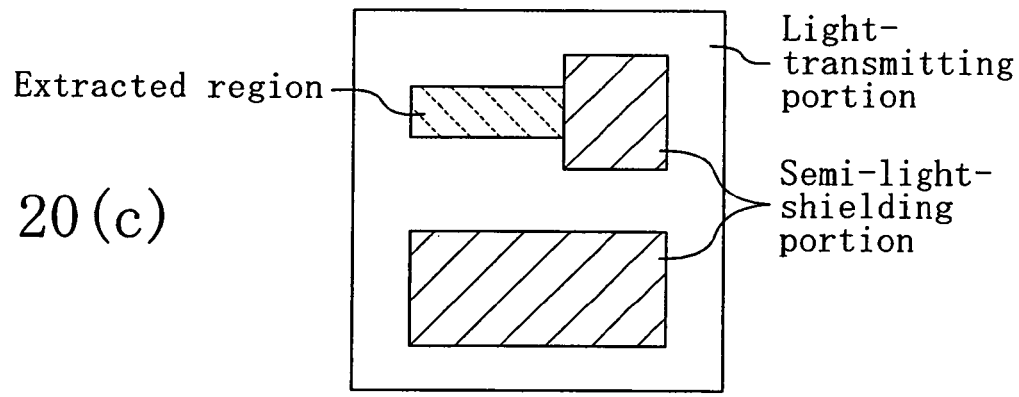

Next, in Step S13, a region of the mask pattern having a predetermined dimension D1 or less and interposed between openings, i.e., a region of the mask pattern having a width equal to or smaller than a predetermined dimension D1 is extracted. In this case, about 0.8×λ/NA is preferable for D1 (λ is light source wavelength, NA is numerical aperture). FIGS. 18(c) and 20(c) illustrate the regions of the mask pattern of FIGS. 18(b) and 20(b) interposed between openings having a predetermined dimension D1 or less, respectively.

Figure 18D:
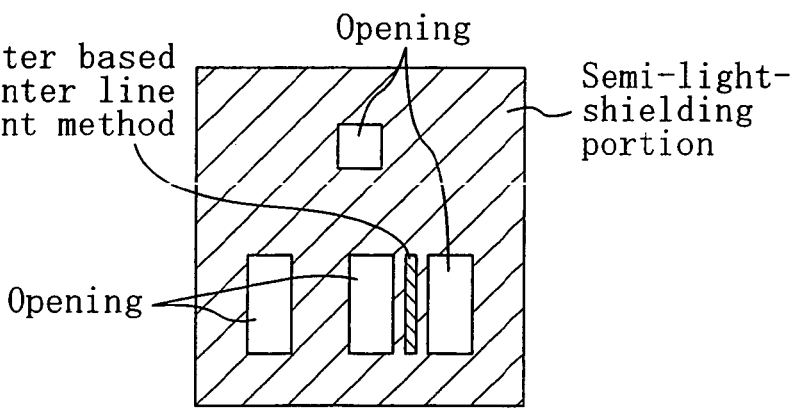
Figure 20D:
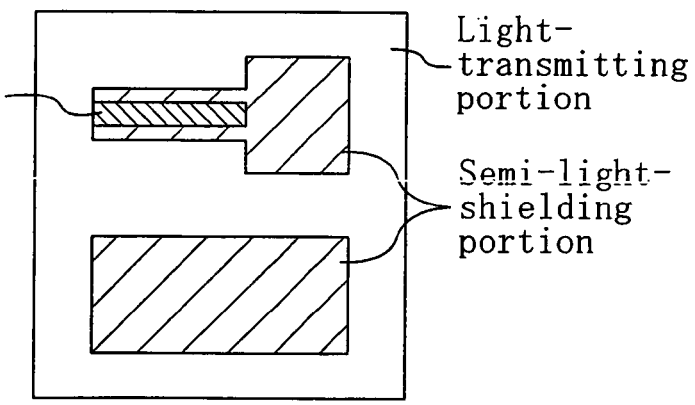

Next, in Step S14, a phase shifter is inserted in a region extracted in Step S13 such that the center line enhancement method is realized. FIGS. 18(d) and 20(d) show how the phase shifter having an appropriate width is inserted in the extracted region such that the center line enhancement method is realized.

Figure 19A:
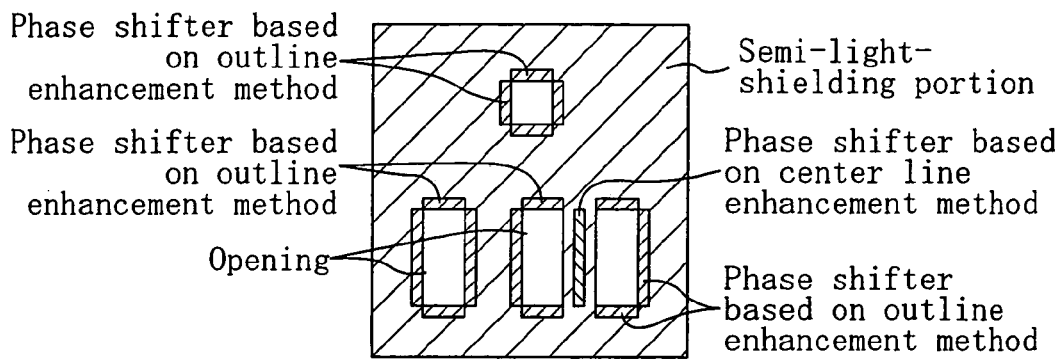
FIGS. 19(a) through 19(d) are plan views illustrating respective process steps for forming a mask pattern for formation of a space pattern by using the mask data generation method of the third embodiment of the present invention.
Figure 21A:
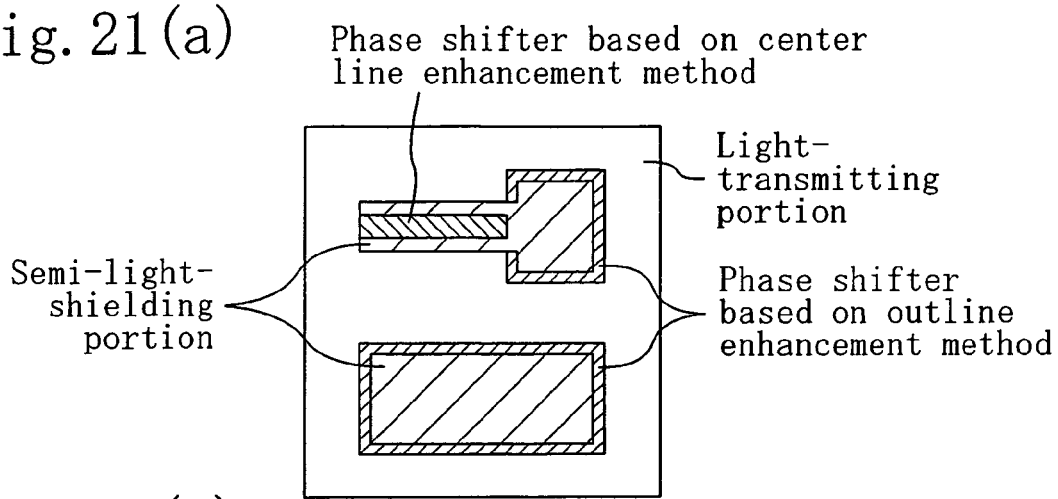
FIGS. 21(a) through 21(c) are plan views illustrating respective process steps for forming a mask pattern for formation of a line pattern by using the mask data generation method of the third embodiment of the present invention.

Next, in Step S15, a phase shifter is inserted such that the outline enhancement method is realized in the mask pattern. More specifically, FIG. 19(a) shows how the phase shifter is inserted in the mask pattern of FIG. FIG. 18(d) such that the outline enhancement method is realized. As shown in FIG. 19(a), the phase shifter having a predetermined dimension is inserted in a region of the mask pattern which is in contact with each of sides of openings (having a rectangular shape). Note that although a type of shifter arrangement shown in FIG. 9(b) is applied to the mask pattern of FIG. 19(a), the shifter arrangement is not limited thereto. FIG. 21(a) shows how the phase shifter is inserted in the mask pattern of FIG. 20(d) such that the outline enhancement method is realized. As shown in FIG. 21(a), the phase shifter is inserted in the periphery of a region of the mask pattern having a larger width than a predetermined dimension D1. Note that although a type of shifter arrangement shown in FIG. 9(a) is applied to the mask pattern of FIG. 21(a), the shifter arrangement is not limited thereto.

In the process steps from Step S11 to Step S15, a mask pattern which allows a small pattern formation can be formed using the center line enhancement method and the outline enhancement method. Then, regular mask data generation process steps such as proximity correction (proximity effect correction) for pattern size adjustment for a pattern formed to correspond to a mask pattern by exposure and mask size calculation based on a reduction ratio of a reduction exposure system are further performed to finish a mask pattern. However, if a MEEF is large in pattern size adjustment, a mask pattern with a large error of pattern size adjustment is obtained because of influences of a mask grid (a minimum width with which a mask dimension can be adjusted). Thus, in the third embodiment, for the purpose of further improving mask patterns, the process step which allows pattern size adjustment at a low MEEF in performing proximity correction and also reduction in the error of pattern size adjustment due to a mask grid is additionally performed.

Figure 19B:
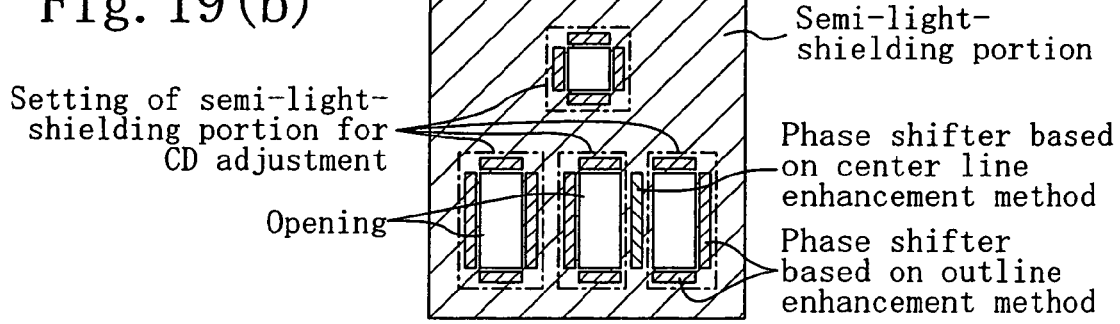
Figure 21B:
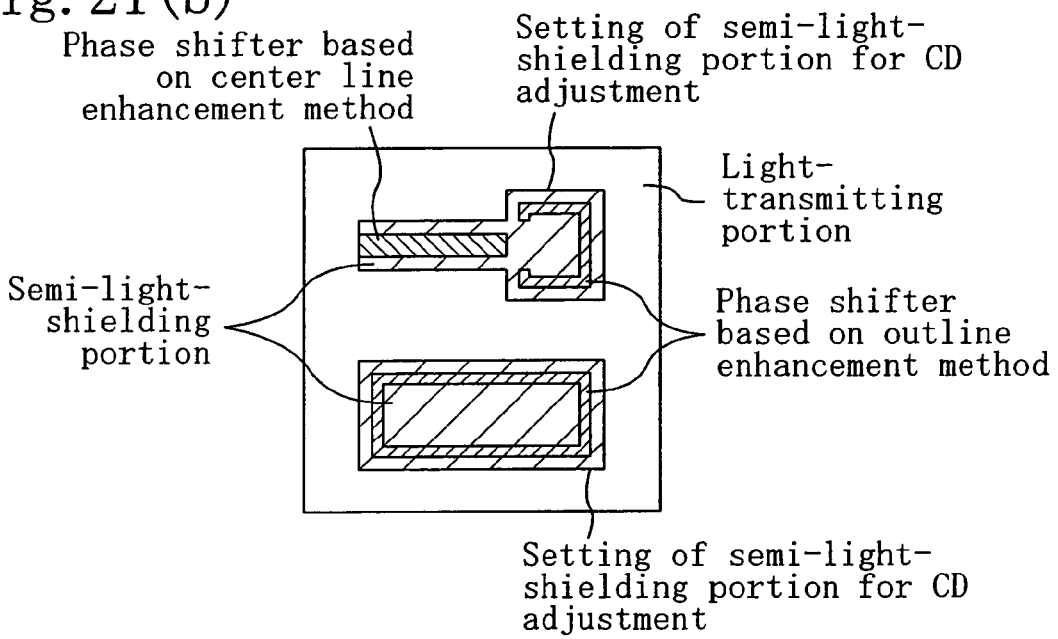

That is to say, in Step S16, a MEEF reduction method is applied to a mask pattern to which the center line enhancement method and the outline enhancement method are applied. As has been described in the principle of the outline enhancement method, there are two methods for pattern size adjustment, i.e., a method in which the arrangement of a phase shifter and a dimension thereof is changed and a method in which a dimension of a semi-light-shielding portion is changed. In general, a phase shifter to be a region which transmits light in a phase opposite to that of a light-transmitting portion has high light-shielding properties. Accordingly, even if a semi-light-shielding portion is additionally provided in the periphery of the phase shifter, the intensity distribution of light transmitted through a photomask is hardly influenced. Therefore, in terms of reduction of a MEEF, the method in which a dimension of a semi-light-shielding portion is changed is better than the method in which the arrangement and a dimension of a phase shifter are changed. Thus, as a CD (pattern size) adjustment region for adjusting the size of a pattern, a semi-light-shielding portion is inserted at the boundary between an opening and a phase shifter. FIGS. 19(b) and 21(b) show how the semi-light-shielding portion for CD adjustment is set in the mask patterns of FIGS. 19(a) and 21(a), respectively. As shown in FIG. 19(b), each of the openings for space pattern formation is made to be surrounded by the semi-light-shielding portion in Step S16 in any case Moreover, as shown in FIG. 21(b), the phase shifter in the mask pattern for line pattern formation is made to be surrounded by the semi-light-shielding portion in Step S16 in any case. Note that the semi-light-shielding portion provided as a CD adjustment region in the periphery of the phase shifter preferably has a size which does not influence light shielding properties of the phase shifter, and therefore in the third embodiment, the width of the CD adjustment region is set to be 0.1×λ/NA or less. More specifically, it is preferable that the width of the CD adjustment region has a dimension which is under light interference effects by the phase shifter, i.e., a dimension of one tenth of λ/NA or less.

A mask pattern formed in the process steps of Step S11 through Step S16 is a mask pattern which allows formation of a small pattern. Also, assume that proximity correction is applied in the process steps for forming the mask pattern. If pattern size adjustment is performed by changing a dimension of the semi-light-shielding portion surrounding the openings or the phase shifter, pattern size adjustment with a small MEEF can be realized. That is to say, an excellent mask pattern forming method in which an error of pattern size adjustment due to an influence of a grid of a mask pattern is small can be achieved.

In general, the light intensity transferred when a mask pattern using a semi-light-shielding portion (i.e., a transparent light-shielding pattern) does not simply decrease but decreases with fluctuation as heading the inner side of the mask pattern. The fluctuation in the light intensity distribution has a peak, i.e., a side lobe at a point located inward from the edge of the mask pattern by a distance of λ/NA or less. Therefore, in the third embodiment, in order to prevent part of a resist film corresponding to a semi-light-shielding portion from being exposed through over-exposure performed in actually forming a pattern, the process step of further enlarging an exposure margin is additionally performed.

Figure 19C:
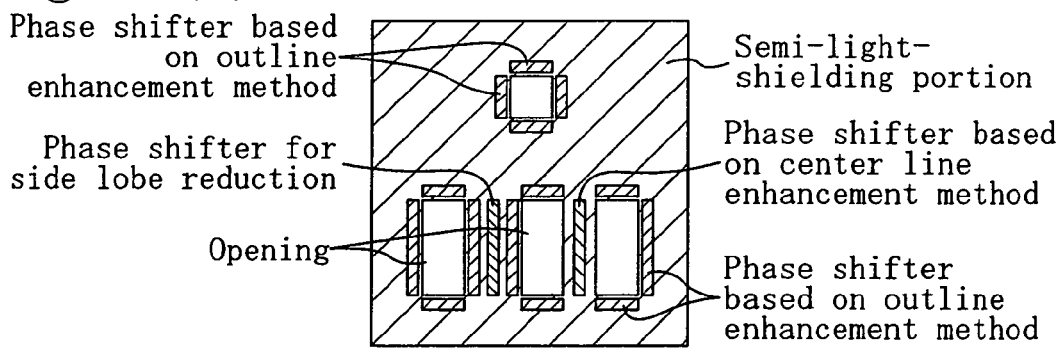
Figure 21C:
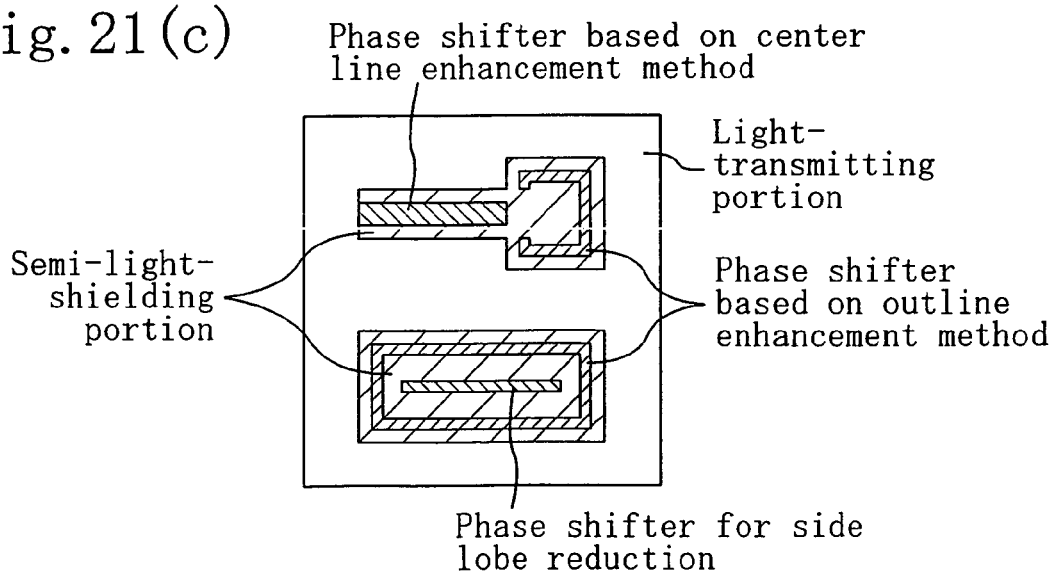

More specifically, in Step S17, a phase shifter for side lobe reduction is inserted in the mask pattern to which the center line enhancement method, the outline enhancement method and the MEEF reduction method are applied. In this case, a side lobe independently generated in the periphery of an isolated opening or a side lobe generated in the inner side of the mask pattern hardly become problems. However, when the openings adjoin each other at intervals of about λ/NA to 2×λ/NA, a region in which peaks of two side lobes overlap with each other is generated. Thus, when over-exposure is performed, the resist film may be exposed because of the light intensity of the region. Moreover, in a portion of the mask pattern having a width of 2×λ/NA or less, peaks of two side lobes from both sides of the portion are overlapped, and thus with over-exposure, the resist film may be exposed because of the light intensity of the portion. However, as has been described in the principle of the outline enhancement method, in a mask pattern using a semi-light-shielding portion, if the space between adjacent openings is 0.8×λ/NA or more, in other words, if the width of the mask pattern is 0.8×λ/NA or more, a phase shifter for canceling light having a remaining light intensity formed by the semi-light-shielding portion can be disposed in an arbitrary position. In the third embodiment, using this principle, a phase shifter in equilibrium with a remaining light intensity formed by the semi-light-shielding portion is disposed in the region of the mask in which a space between adjacent openings is 2×λ/NA or less. Thus, the light intensity in the region in which the peaks of the side lobes overlap each other can be totally cancelled. In the same manner, by disposing a phase shifter in equilibrium with a remaining light intensity formed by the semi-light-shielding portion in the region of the mask pattern which has a width of more than 0.8×λ/NA (even after the phase shifter has been disposed based on the outline enhancement method), the light intensity in the region in which the peaks of the side lobes can be totally cancelled. That is to say, with Step S17, an over-exposure margin when exposure is performed using a mask pattern formed through Step S11 through Step S16 can be enlarged. FIG. 19(c) shows how a phase shifter for side lobe reduction is inserted in a region of the mask pattern of FIG. 19(b) interposed between adjacent openings at intervals of 2×λ/NA or less. Moreover, FIG. 21(c) shows how a phase shifter for side lobe reduction is inserted in a region of the mask pattern of FIG. 21(b) which has a width of more than 0.8×λ/NA (after the outline enhancement method has been applied).

Figure 19D:
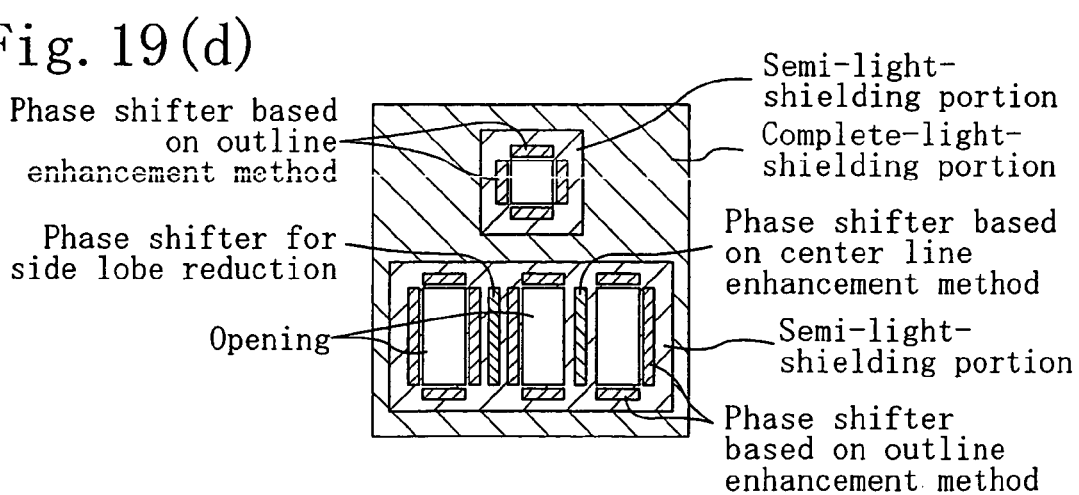

Finally, in Step S18, a mask pattern formed through Step S11 through Step S17 is output. With the process steps of Step S11 through Step S18, a small pattern can be formed with high accuracy and mask pattern formation in which an excellent exposure margin is provided during pattern formation can be performed. Although it has been assumed that all the light-shielding portion constituting a mask pattern is a semi-light-shielding portion so far, it is needless to say that a region of the mask pattern which is apart from each of a phase shifter which has been inserted for the center line enhancement method and an opening to which the outline enhancement method is applied by a sufficient distance (i.e., a larger distance than 2×λ/NA, i.e., a distance with which influences of light interference can be ignored) may be a complete-light-shielding portion. FIG. 19(d) shows how the region of the mask pattern of FIG. 19(c) which is apart from each of the phase shifter and the opening by a sufficient distance is used as a complete-light-shielding portion.

As has been described, according to the third embodiment, a mask pattern is formed using a semi-light-shielding portion transmitting feeble light so that a resist film is not exposed, and thus insertion of a phase shifter which allows enhancement of the contrast of light intensity in an arbitrary region of the mask pattern becomes possible. However, it is necessary to insert phase shifters so as to be spaced apart from each other by a predetermined dimension. Thus, it is possible to apply the center line enhancement method and the outline enhancement method to formation of a resist pattern having an opening with an arbitrary shape. In other words, the contrast of the light intensity distribution in a light-shielding image corresponding to the mask pattern can be enhanced to a high degree by off-axis exposure without depending on the density of the pattern. Thus, an isolated space pattern and an isolated line pattern or a densely arranged pattern can be formed at the same time.

Moreover, according to the third embodiment, a mask pattern which allows formation of a small pattern can be achieved and also a mask pattern which allows pattern size adjustment at a low MEEF to be performed when proximity correction is used can be achieved. Furthermore, a phase shifter can be inserted in an arbitrary region of a mask pattern. Thus, the generation of a side lobe can be suppressed and therefore mask pattern formation in which an excellent exposure margin is provided during pattern formation can be performed.

Moreover, according to the third embodiment, in a mask pattern including a semi-light-shielding portion and a phase shifter, a phase shifter is disposed in a region of the mask pattern with a smaller width than a predetermined dimension according to the center line enhancement method, and a phase shifter is disposed in a portion with a larger width than a predetermined dimension according to the outline enhancement method. Thus, an image having a very high contrast can be formed when exposure is performed using a mask pattern having an arbitrary shape. Accordingly, exposure is performed to a substrate to which a resist is applied using a photomask in which such a mask pattern is provided, thereby forming a small resist pattern. Moreover, if exposure is performed to the photomask using off-axis exposure, a small pattern whose size hardly changes according to focus variation can be formed.

Figure 22:
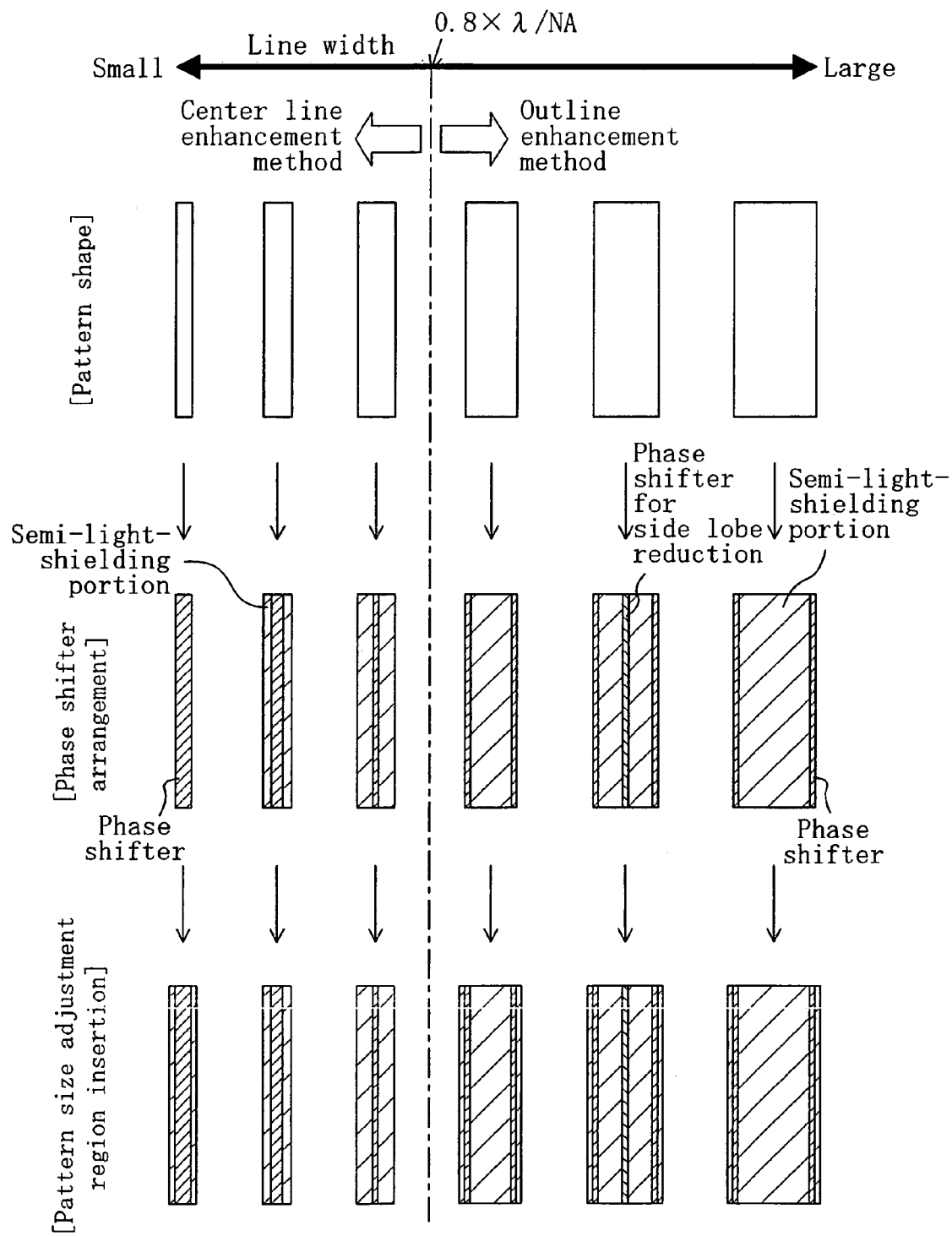
FIG. 22 is an illustration showing a method for inserting a phase shifter according to the line width of a mask pattern in the mask data generation method of the third embodiment of the present invention.

FIG. 22 illustrates a method for inserting a phase shifter to realize the center line enhancement method and the outline enhancement method according to the line width of a mask pattern. As shown in FIG. 22, while the outline enhancement method is applied to a mask pattern with a larger line width than a predetermined line width, the center line enhancement method is applied to a mask pattern with a smaller line width than a predetermined line width. In this case, a predetermined line width is preferably set assuming 0.8×λ/NA as the standard but it may be set to be a lower value than 0.8×λ/NA. Moreover, as shown in FIG. 22, in the center line enhancement method, the larger the line width of a mask pattern is, the smaller the width of a phase shifter inserted in the mask pattern becomes. And, the smaller the line width of a mask pattern is, the larger a phase shifter inserted in the mask pattern becomes. How to obtain an optimal dimension for the line width of the phase shifter is as has been described. Note that when the center line enhancement method is applied, there may be cases where a mask pattern is formed of only a phase shifter.

On the other hand, as shown in FIG. 22, in the outline enhancement method, a phase shifter is inserted in the periphery of a mask pattern with a larger line width than a predetermined line width. In this case, unless excessive light is transmitted through the phase shifter, the line width of the phase shifter may be set not according to each of the line widths of the mask patterns but so as to be the same for all mask patterns. That is to say, which the center line enhancement method or the outline enhancement method should be used can be uniquely determined based on the line width of each of the mask patterns.

In a mask pattern with a predetermined size, the side lobe generation phenomenon markedly appears due to using a semi-light-shielding portion. However, as has been described, in a mask pattern under such conditions, a phase shifter in equilibrium with a remaining light intensity formed by the semi-light-shielding portion can be arbitrarily inserted. Therefore, for example, a phase shifter for side lobe reduction may be inserted in the center of the mask pattern, as shown in FIG. 22. In this case, focusing on only the arrangement of a phase shifter in a mask pattern, the online enhancement method and the center line enhancement method are applied to the same mask pattern at the same time. Moreover, in a mask pattern with a size which is sufficiently larger than a size to cause the side lobe generation phenomenon to appear most markedly, whether or not the phase shifter for side lobe reduction should be inserted in the center of the mask pattern can be arbitrarily determined. Note that in the example shown in FIG. 22, when the size of the mask pattern is sufficiently large, insertion of the phase shifter for side lobe reduction is omitted.

FOURTH EMBODIMENT

Hereinafter, a photomask in accordance with a fourth embodiment of the present invention and a method for forming the same with reference to the accompanying drawings.

Figure 23:
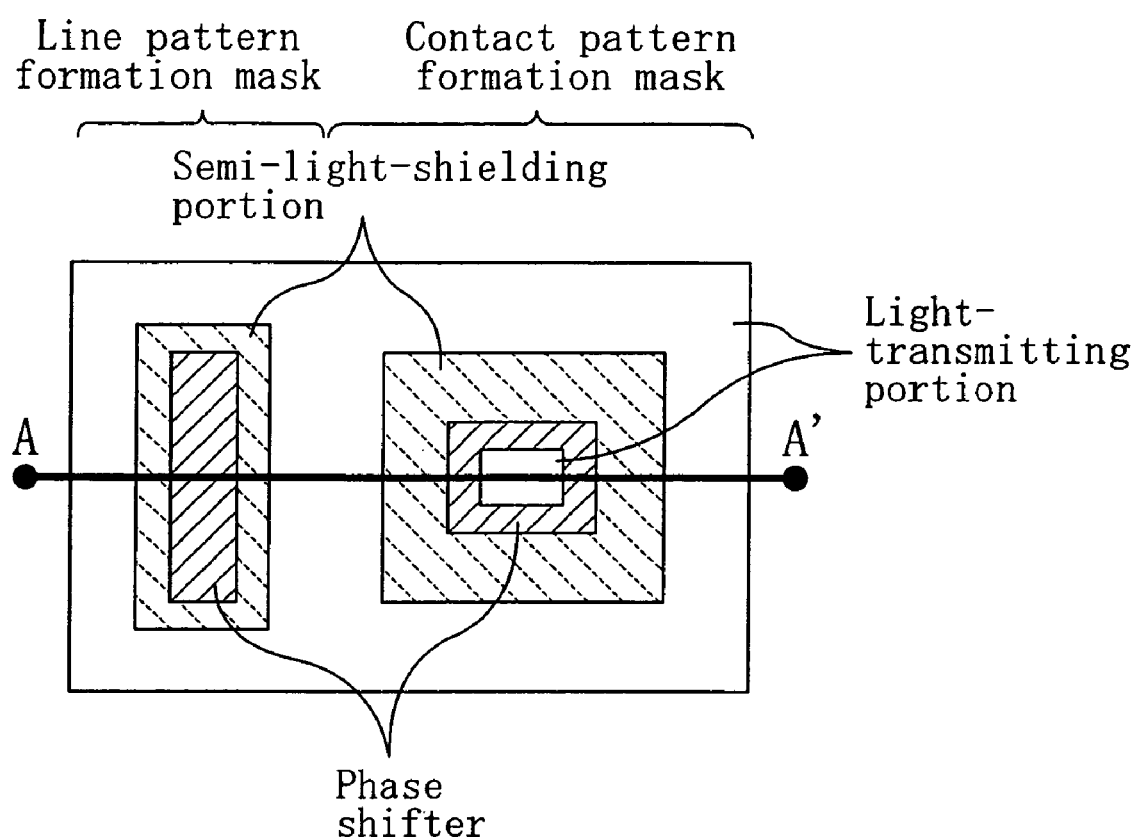
FIG. 23 is a plan view of a photomask in accordance with a fourth embodiment of the present invention.

FIG. 23 is a plan view of a photomask in accordance with the fourth embodiment. More specifically, FIG. 23 is a plan view of a photomask including a line pattern forming mask portion for achieving the center line enhancement method of the present invention and a contact pattern forming mask portion (i.e., a light transmitting portion (opening) surrounded by a mask pattern) for achieving the outline enhancement method of the present invention. Also, FIGS. 24(a) through 24(f) are cross-sectional views taken along the line AA' shown in FIG. 23. That is to say, there are basically six types of cross-sectional structures for achieving a photomask having the planar structure of FIG. 23, as shown in FIGS. 24(a) through 24(f). The respective cross-sectional structures shown in FIGS. 24(a) through 24(f) are basic types and thus it is also possible to form a photo mask having a cross-sectional structure obtained by a combination of these basic types. Hereinafter, methods for forming the basic types of photomasks shown in FIGS. 24(a) through 24(f) will be described.

Figure 24A:
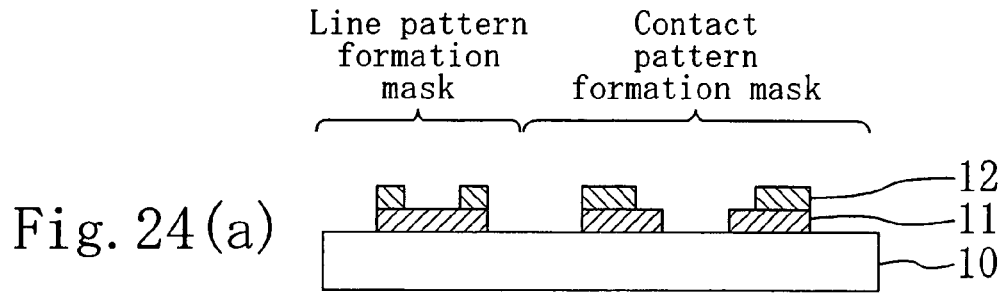
FIGS. 24(a) through 24(f) are cross-sectional views taken along the line AA' shown in FIG. 23.

In the basic type of photomask shown in FIG. 24(a), a first phase shifter film 11 which transmits exposure light in a phase opposite to that of a light-transmitting portion is formed on a mask pattern formation region of a transparent substrate 10. Moreover, a second phase shifter film 12 which transmits exposure light in a phase opposite to that of the first phase shifter film 11 is formed on a semi-light-shielding portion formation region of the first phase shifter film 11. Thus, a semi-light-shielding portion having a multilayer structure including the second phase shifter film 12 and the first phase shifter film 11 is formed and at the same time a phase shifter having a single layer structure formed of the first phase shifter film 11 is formed. The semi-light-shielding portion having a multilayer structure including the second phase shifter film 12 and the first phase shifter film 11 transmits exposure light in the same phase as that of the light-transmitting portion. That is to say, in the type of FIG. 24(a), the stacked phase shifter films each of which inverts the phase of light transmitted therethrough with respect to the phase of light transmitted through the light-transmitting portion is processed, thereby achieving a desired mask pattern made of the phase shifter and the semi-light-shielding portion. Moreover, with the multilayer structure of the phase shifter films, a semi-light-shielding portion having a transmittance which allows part of exposure light to be transmitted is achieved.

Figure 24B:
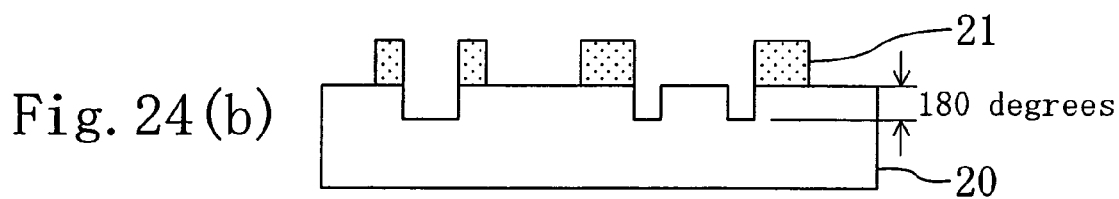

In the basic type of photomask shown in FIG. 24(b), a semi-light-shielding film 21 which has a transmittance allowing part of exposure light to be transmitted and transmits exposure light in the same phase as that of the light-transmitting portion is formed on a semi-light-shielding portion of a transparent substrate 20. That is to say, a semi-light-shielding portion made of the semi-light-shielding film 21 is formed. Moreover, a phase shifter formation region of the transparent substrate 20 is dug to a predetermined depth, thereby forming a phase shifter which transmits exposure light in a phase opposite to that of the light-transmitting portion is formed. That is to say, in the type of FIG. 24(b), the semi-light-shielding film 21 which generates almost no phase difference from the light-transmitting portion and a dug portion in the transparent substrate 20 are combined, thereby achieving a desired mask pattern made of a semi-light-shielding portion and a phase shifter.

Figure 24C:
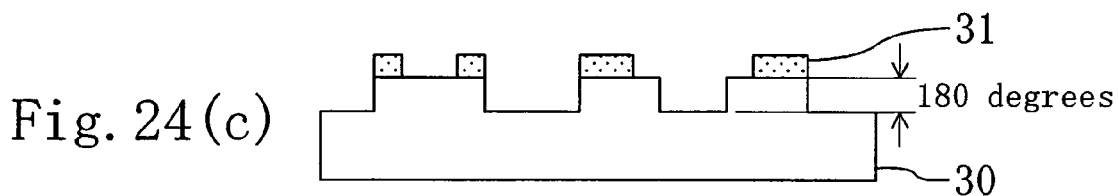

In the basic type of photomask shown in FIG. 24(c), a phase shifter film 31 which transmits exposure light in a phase opposite to that of a phase shifter is formed on a semi-light-shielding portion formation region of a transparent substrate 30. Moreover, a light-transmitting portion formation region of the transparent substrate 30 is dug to a predetermined depth, thereby forming a light-transmitting portion which transmits exposure light in a phase opposite to that of the phase shifter. That is to say, in the type of FIG. 24(c), achieved is a photomask in which the portion defined as a light-transmitting portion is replaced by the phase shifter having a high transmittance, the portion defined as a phase shifter is replaced by the light-transmitting portion and the portion defined as a semi-light-shielding portion is replaced by the phase shifter having a transmittance which allows part of exposure light to be transmitted. In this case, relationships between relative phase differences obtained between elements of the photomask shown in FIG. 24(c) are the same as those in the photomasks of the other types shown in FIG. 24(a), FIG. 24(b) and FIGS. 24(d) through 24(f).

Figure 24D:
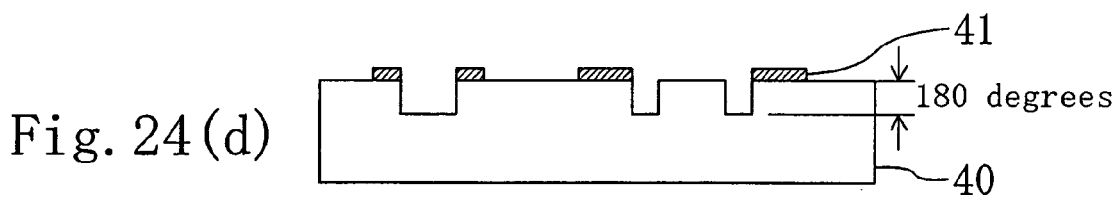

In the basic type of photomask shown in FIG. 24(d), a thinned light-shielding film 41 which has a transmittance allowing part of exposure light to be transmitted and transmits exposure light in the same phase as that of a light-transmitting portion is formed on a semi-light-shielding portion formation region of a transmittance substrate 40. That is to say, a semi-light-shielding portion made of the light-shielding film 41 is formed. Moreover, a phase shifter formation region of the transparent substrate 40 is dug to a predetermined depth, thereby forming a phase shifter which transmits exposure light in a phase opposite to that of the light transmitting portion. In this case, even if a regular metal film is thinned, the light-shielding film 41 having a transmittance allowing part of exposure light to be transmitted can be formed. Since the light-shielding film 41 is thinned, phase change of light transmitted through the light-shielding film 41 is very small. Note that when the phase of light transmitted through the semi-light-shielding portion is different to that of light transmitted through the light transmitting portion, a focus position is slightly shifted in an image of light formed with a mask pattern using a semi-light-shielding portion. However, if the phase difference is up to about 30 degrees, there is almost no influence for the shift of the focus position. Thus, if a thinned metal film or the like is used as the light-shielding film 41, a semi-light-shielding portion which transmits light to a low degree in substantially the same phase as that of the light-transmitting portion can be achieved. That is to say, in the type of FIG. 24(d), the same effects as those of the type of FIG. 24(b) can be obtained. Moreover, a thinned light-shielding film can be used as the semi-light-shielding film which generates almost no phase difference from the light-transmitting portion, and therefore a desired mask pattern made of the phase shifter and the semi-light-shielding portion can be achieved in a simple manner without using a transparent thick film for phase control.

Figure 24E:
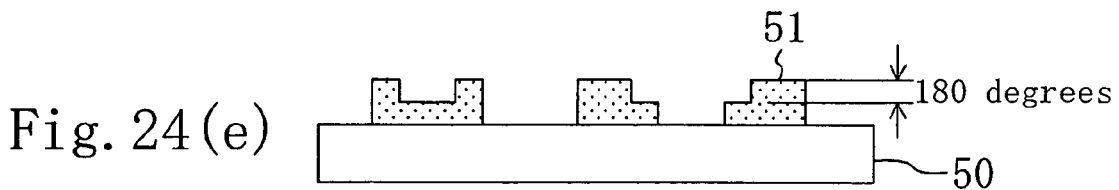

In the type of photomask shown in FIG. 24(e), a semi-light-shielding film 51 which has transmittance allowing part of exposure light to be transmitted and transmits exposure light in the same phase as that of a light-transmitting portion is formed on a mask pattern formation region of a transparent substrate 50. Moreover, a phase shifter formation region of the semi-light-shielding film 51 is dug to a predetermined depth, thereby forming a phase shifter which transmits exposure light in a phase opposite to the light-transmitting portion. In other words, the semi-light-shielding portion, i.e., a portion of the semi-light-shielding film which is not dug out is formed and also a phase shifter, i.e., a dug portion of the semi-shielding film 51 is formed. That is to say, in the type of FIG. 24(e), the phase shifter which inverts the phase of light transmitted therethrough with respect to light transmitted through the light-transmitting portion is formed using the dug portion of the semi-light-shielding film 51. Thus, a desired mask pattern made of the phase shifter and the semi-light-shielding portion can be achieved.

Figure 24F:
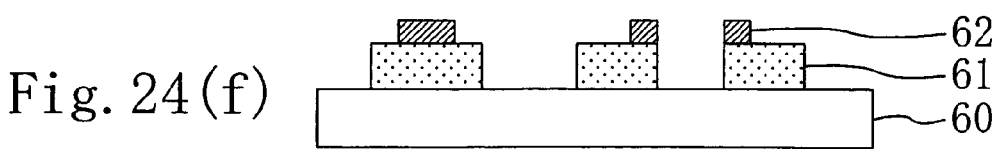
Figure 28A:
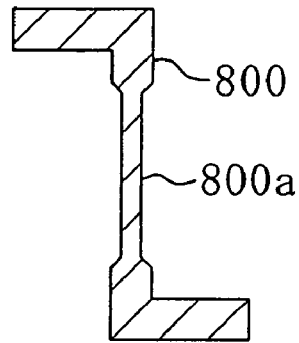
FIG. 28(a) is an illustration showing an exemplary layout for a desired pattern to be formed.
Figure 28B:
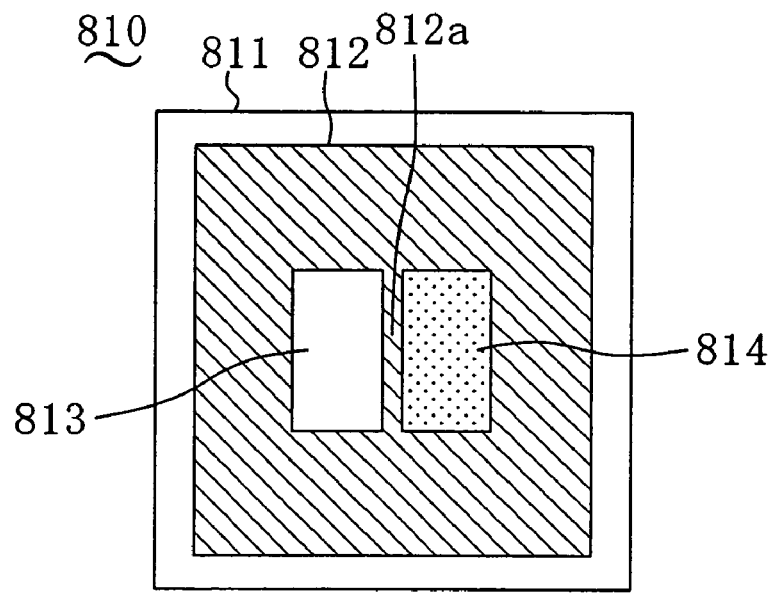
FIGS. 28(b) and 28(c) are plan views of two conventional photomasks used for forming the pattern shown in FIG. 28(a).
Figure 28C:
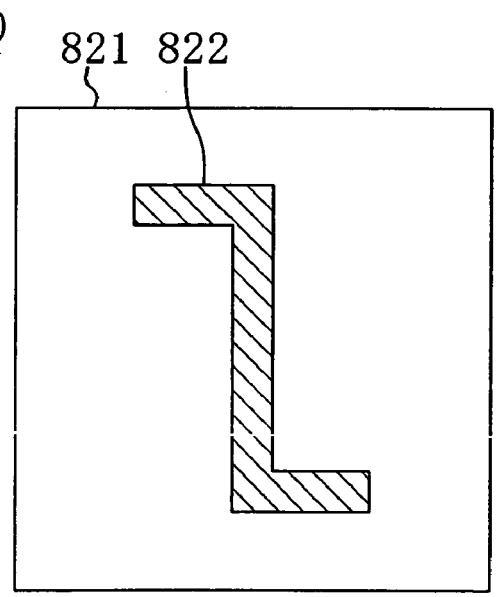

In the type of photomask shown in FIG. 24(f), a semi-light-shielding film 61 which has a transmittance allowing part of exposure light to be transmitted and transmits exposure light in the same phase as that of the light-transmitting portion is formed on a mask pattern formation region of a transparent substrate 60. Moreover, a phase shifter film 62 which transmits exposure light in a phase opposite to that of the light transmitting portion is formed on a phase shifter formation region of the semi-light-shielding film 61. Thus, a semi-light-shielding portion having a single layer structure formed of the semi-light-shielding film 61 is formed and also a phase shifter having a multilayer structure including the semi-light-shielding film 61 and the phase shifter film 62 is formed. That is to say, in the type of FIG. 24(f), the phase shifter film 62 is stacked on the semi-light-shielding film 61, thereby achieving a desired mask pattern including the phase shifter and the semi-light-shielding portion.

FIFTH EMBODIMENT

Hereinafter, a method for forming a pattern in accordance with a fifth embodiment of the present invention will be described with reference to the accompanying drawings. More specifically, a method for forming a pattern using a photomask in accordance with any one of the first through fourth embodiments (hereinafter, referred to as an "inventive photomask") will be described. As has been described, by performing exposure using an inventive photomask, i.e., a photomask formed so that the outline enhancement method or the center line enhancement method is realized, it becomes possible to form a small pattern. Moreover, for example, when a pattern in a reduced size is transferred on a wafer by performing exposure to the photomask shown in FIG. 23, off-axis exposure is performed to a mask portion (i.e., outline enhancement mask) for realizing the outline enhancement method as well as to a mask portion (i.e., image enhancement mask) for realizing the center line enhancement method, as has been described in the principle of the outline enhancement method and the center line enhancement method. Thus, an image having a high contrast can be formed. And therefore, a pattern whose size hardly changes according to focus change can be formed.

FIGS. 25(a) through 25(d) are cross-sectional views illustrating respective process steps for forming a pattern using a photomask in accordance with the present invention.

First, after a film 101 to be processed such as a metal film or an insulating film is formed on a substrate 100 as shown in FIG. 25(a), a positive resist film 102 is formed on the film 101 to be processed as shown in FIG. 25(b).

Next, as shown in FIG. 25(c), the inventive photomask, e.g., the photomask of the type of FIG. 24(a) is irradiated with exposure light 103 to expose the resist film 102 with transmitted light 104 transmitted through the photomask (note that FIG. 25(c) illustrates only a contact pattern forming mask portion). Note that on a transparent substrate 10 of the photomask used in the process step shown in FIG. 25(c), a semi-light-shielding portion having a multilayer structure including a first phase shifter film 11 and a second phase shifter film 12 and a phase shifter having a single layer structure of the first phase shifter film 11 are provided. The mask pattern surrounds an opening (light-transmitting portion) corresponding to a desired pattern (i.e., resist-removed pattern). That is to say, in the exposure process shown in FIG. 25(c), exposure is performed, using the off-axis light source, to the resist film 102 through the photomask for realizing an outline enhancement method. In this case, as the mask pattern, a semi-light-shielding portion having a low transmittance is used, so that the entire resist film 102 is exposed with weak energy. However, as shown in FIG. 25(c), it is only a latent image portion 102a of the resist film 102 corresponding to the opening in the photomask that is irradiated with a sufficient exposure energy to dissolve a resist in a developing process.

Next, as shown in FIG. 25(d), the latent image portion 102a is removed by performing development to the resist film 102, so that a resist pattern 105 is formed. In this case, in the exposure process shown in FIG. 25(c), the contrast of the light intensity distribution between the opening and the periphery of the opening. Accordingly, the energy distribution between the latent portion 102a and the periphery of the latent portion 102a is changed sharply, so that a resist pattern 105 having a sharp shape can be formed.

As has been described, in the fifth embodiment, the inventive photomask having a mask pattern including the semi-light-shielding portion and the phase shifter is used in pattern formation. In this case, a phase shifter is disposed in the vicinity of the light-transmitting portion of the photomask according to the outline enhancement method and another phase shifter is disposed in a region of the mask pattern which has a predetermined dimension or less and interposed between parts of the light-transmitting portion according to the center line enhancement method. Thus, the contrast of the light intensity distribution in the periphery of the light-transmitting portion or a region of the mask pattern having a very small width can be enhanced with off-axis exposure without depending on the density of the pattern. Therefore, by performing exposure to a substrate to which a resist is applied using the photomask of the present invention, a small resist pattern can be formed. Moreover, by performing exposure to the photomask using off-axis exposure, a small pattern whose size hardly changes according to focus change can be formed.

Note that in the fifth embodiment, the case where exposure using a photomask based on the outline enhancement method is performed in a positive resist process has been described. However, needless to say, the present invention is not limited thereto. More specifically, exposure using a photomask based on the center line enhancement method or a photomask based on a combination of the outline enhancement method and the center line enhancement method may be performed in the positive resist process. Alternatively, exposure using a photomask based on at least one of the outline enhancement method and the center line enhancement method may be performed in a negative resist process. In this case, when a positive resist process is used, a positive resist film which has been irradiated with exposure light is developed to remove part of the positive resist film other than part thereof corresponding to a mask pattern. In this manner, a resist pattern having the same shape as that of the mask pattern can be formed. When a negative resist process is used, a negative resist film which has been irradiated with exposure light is developed to remove part of the negative resist film corresponding to a mask pattern. Thus, a resist pattern having an opening with the same shape as that of the mask pattern can be formed.

SIXTH EMBODIMENT

Hereinafter, a photomask in accordance with a sixth embodiment of the present invention and a method for generating mask data for the photomask will be described with reference to the accompanying drawings. Note that in each of mask data generation methods which will be described below, a portion of the mask pattern having a predetermined shape which is easily deformed when the pattern is transferred is extracted from the mask pattern in which a phase shifter is inserted according to the center line enhancement method or the outline enhancement method of the present invention. And then insertion of another shifter, or deformation or elimination of the phase shifter is performed so that the portion has a desired shape. That is to say, by performing a mask data generation method in accordance with this embodiment in a combination with the mask data generation method of the third embodiment, it becomes possible not only to reduce a pattern line width or a pattern space but also to form a pattern having a desired shape.

More specifically, an end portion of a line pattern with a smaller width than a predetermined dimension shown in FIG. 26(a) is an example of the portion of the pattern having a shape which is easily deformed when the pattern is transferred. Normally, an end portion of a mask pattern corresponding to the line pattern has poor light-transmitting properties and thus the length of the line is reduced when the pattern is formed. This is a phenomenon called "line end regression". To deal with the phenomenon in which a line end regresses, the mask pattern can be simply lengthened for deformation compensation. Moreover, as another method for making the line length stable to changes in light exposure and focus during pattern formation, a method in which the line end width of a mask pattern is increased can be used. This method is used in pattern formation using a regular mask pattern made of a complete-light-shielding film, and a shape with an increased line end width is called "hammer head pattern". According to the center line enhancement method of the present invention, a larger phase shifter is inserted in a portion of a mask pattern in which the light-shielding effect is to be weakened, so that the light-shielding effect can be improved. That is to say, in a mask pattern, a phase shifter with an increased width is used at an end of a line where the light-shielding effect is weakened more than at the center of the line, so that high light-shielding properties can be achieved. Therefore, as shown in FIG. 26(a), the line end can be deformed into a hammer head pattern.

As a deformation compensation method with high versatility, the outline enhancement method may be applied to the line end as shown in FIG. 26(b), instead of the deformation compensation method of FIG. 26(a). More specifically, in a mask pattern for forming a line pattern, a phase shifter is disposed in part of the periphery of the mask pattern which extends inward from both ends thereof by a predetermined distance and is parallel to the direction in which the line extends. Thus, when a line pattern is isolated, characteristics of the line end become almost the same as those of a hammer head pattern.

According to the method shown in FIG. 26(b), when the end of a line pattern is located close to another pattern, special effects are exhibited in formation of a space between the patterns, especially, in reduction in the MEEF. Accordingly, great effects in preventing pattern bridging or other fatal pattern deformation can be obtained. Hereinafter, a deformation compensation method used when the end of the line pattern is located close to another pattern will be described.

First, as shown in FIG. 26(c), when an end of a line pattern is located close to an end of another line pattern, each of line ends of a mask pattern for forming each of the line patterns is deformed. In this case, the pattern has to be formed so that the line ends are not bridged and the space between the line ends becomes the smallest. With the deformation compensation method of the present invention shown in FIG. 26(c), the MEEF can be largely reduced with respect to the same target pattern size.

Next, as shown in FIG. 26(d), when an end of one line pattern is located close to an end of another line pattern having such a small width that the center line enhancement method is applied, a method for deforming a line end of a mask pattern for forming said one line pattern is the same as that of FIG. 26(b). On the other hand, for another mask pattern for forming said another line pattern, a phase shifter disposed in part of said another mask pattern which is in the vicinity of the mask pattern and spaced apart from the end of said another mask pattern closer to the mask pattern by a predetermined dimension or less is changed into a semi-light-shielding portion. In this case, in the phase shifter inserted in said another mask pattern so as to be located on its center line of the pattern, only a portion located in the vicinity of the mask pattern may be shifted to the other end which is further from the mask pattern. In the case shown in FIG. 26(d), a predetermined portion of the phase shifter is changed into a semi-light-shielding portion. In this case, the same result as that obtained by reducing the width of the phase shifter can be obtained. With the deformation compensation method of the present invention shown in FIG. 26(d), the MEEF can be largely reduced with respect to the same target pattern size.

Next, as shown in FIG. 26(e), when an end of one line pattern is located close to another line pattern having such a large width that an outline enhancement method is applied, a method for deforming a line end of a mask pattern for forming said one line pattern is the same as that of FIG. 26(b). On the other hand, for another mask pattern for forming said another line pattern, a phase shifter disposed in part of said another mask pattern located in the vicinity of the mask pattern is changed into a semi-light-shielding portion. In this case, in said another mask pattern, the phase shifter located in the vicinity of the mask pattern may be shifted further inward. In the case shown in FIG. 26(e), a predetermined portion of the phase shifter is shifted further inward in said another mask pattern. This case exhibits substantially the same effects as those achieved when the predetermined portion of the phase shifter is changed into a semi-light-shielding portion. With the deformation compensation method shown in FIG. 26(*e*), the MEEF can be largely reduced with respect to the same target pattern size.

As has been described, when a pattern is formed using a mask pattern in which the deformation compensation methods of this embodiment shown in FIGS. 26(*a*) through 26(*e*), the MEEF is largely reduced. Thus, a margin for a size error caused during mask formation can be reduced, and therefore a small pattern can be formed.

Note that besides the above-described end portions of the line patterns, an L-shaped corner pattern shown in FIG. 27(*a*), including a line having such a small width that the center line enhancement method is applied is considered to be a portion of the pattern having a shape which is easily deformed when the pattern is transferred. As a deformation compensation method used for the L-shaped corner pattern, a semi-light-shielding portion, instead of a phase shifter for center line enhancement, is disposed in a region of a mask pattern located extending from a bent point (a point at which an outline of the mask pattern is bent) of an L-shaped corner by a predetermined dimension or less, as shown in FIG. 27(*a*). In this case, a dimension of the phase shifter for center line enhancement located in the region may be reduced. Moreover, a phase shifter for corner enhancement may be disposed in part of the periphery of the mask pattern located in an L-shaped outside corner. Note that although the phase shifter for corner enhancement looks the same as the phase shifter for outline enhancement, the phase shifter for corner enhancement is located slightly further outward than where the phase shifter for outline enhancement is to be disposed. On the other hand, in the case of an L-shaped corner pattern shown in FIG. 27(*b*), including a line having such a large width that the outline enhancement method is applied, a semi-light-shielding portion, instead of a phase shifter for outline enhancement, is disposed in a region of the periphery of a mask pattern extending from the bent point of the inside L-shaped corner by a predetermined dimension or less. In this case, a dimension of the phase shifter for outline enhancement located in the region may be reduced. Moreover, the phase shifter for the above-described corner enhancement, instead of the phase shifter for outline enhancement, may be disposed in a region of the periphery of the mask pattern extending from the bent point of the outside L-shaped corner by a predetermined dimension or less.

Each of the deformation compensation methods of FIGS. 27(*a*) and 27(*b*) is a method in which an enhancement pattern (phase shifter) located at the inside corner which has high light-shielding effects in a mask pattern is eliminated and an enhancement pattern located at the outside corner which has low light-shielding effects is deformed. With the deformation compensation methods of this embodiment shown in FIGS. 27(*a*) and 27(*b*), a pattern shape close to a target pattern shape can be obtained. A reason for this is that the phase shifter is removed from a corner portion of the mask pattern in which light-shielding properties are excessive and therefore a light-shielding balance is improved.

Moreover, a T-shaped corner pattern shown in FIG. 27(*c*), including a line having such a small width that the center line enhancement method is applied is another example of the portion of the pattern having a shape which is easily deformed when the pattern is transferred. As a deformation compensation method used for the T-shaped corner pattern, a semi-light-shielding portion, instead of a phase shifter for center line enhancement, is disposed in a region of a mask pattern extending from a bent point of a T-shaped corner by a predetermined dimension or less, as shown in FIG. 27(*c*). In this case, a dimension of the phase shifter for center line enhancement located in the region may be reduced. Moreover, a phase shifter for outline enhancement may be disposed on the opposite side of the periphery of the mask pattern to the side where portions of the T-shaped corner diverge. On the other hand, in the case of a T-shaped corner pattern shown in FIG. 27(*d*), including a line having such a large width that the outline enhancement method is applied, a semi-light-shielding portion, instead of a phase shifter for outline enhancement, is disposed in a region of the periphery of a mask pattern extending from the bent point of the T-shaped corner by a predetermined dimension or less. In this case, a dimension of the phase shifter for outline enhancement located in the region may be reduced. Moreover, a phase shifter for corner enhancement, instead of the phase shifter for outline enhancement, may be disposed on the opposite side of the periphery of the mask pattern to the side where portions of the T-shaped corner diverge.

Each of the deformation compensation methods of FIGS. 27(*c*) and 27(*d*) is a method in which an enhancement pattern located at the inside corner which has high light-shielding effects in a mask pattern is eliminated and an enhancement pattern located at the outside corner which has low light-shielding effects is deformed. With the deformation compensation methods of this embodiment shown in FIGS. 27(*c*) and 27(*d*), a pattern shape close to a target pattern shape can be obtained. A reason for this is that the phase shifter is removed from a corner portion of the mask pattern in which light-shielding properties are excessive and therefore a light-shielding balance is improved.

Furthermore, a cross-shaped corner pattern shown in FIG. 27(*e*), including a line having such a small width that the center line enhancement method is applied is still another example of the portion of the pattern having a shape which is easily deformed when the pattern is transferred. As a deformation compensation method used for the cross-shaped corner pattern, a semi-light-shielding portion, instead of a phase shifter for center line enhancement, is disposed in a region of a mask pattern extending from a bent point of a cross-shape corner by a predetermined dimension or less, as shown in FIG. 27(*e*). In this case, a dimension of the phase shifter for center line enhancement located in the region may be reduced. On the other hand, in the case of a cross-shaped corner pattern shown in FIG. 27(*f*), including a line having such a large width that the outline enhancement method is applied, a semi-light-shielding portion, instead of a phase shifter for outline enhancement, is disposed in a region of the periphery of a mask pattern extending from the bent point of a cross-shaped corner by a predetermined dimension or less. In this case, a dimension of the phase shifter for outline enhancement located in the region may be reduced.

Each of the deformation compensation methods of FIGS. 27(*e*) and 27(*f*) is a method in which an enhancement pattern located at the inside corner which has high light-shielding effects in a mask pattern is eliminated. With the deformation compensation methods of this embodiment shown in FIGS. 27(*e*) and 27(*f*), a pattern shape close to a target pattern shape can be obtained. A reason for this is that the phase shifter is removed from a corner portion of the mask pattern in which light-shielding properties are excessive and therefore a light-shielding balance is improved.

As has been described, according to the sixth embodiment, in a mask pattern including a semi-light-shielding portion and a phase shifter, a phase shifter is disposed in a region of the mask pattern with a predetermined width or less according to the center line enhancement method and a phase shifter is disposed in a region of the mask pattern with a larger width than a predetermined dimension according to an outline enhancement method. Thus, with a mask pattern having an arbitrary shape, an image having a very high contrast can be formed when exposure is performed. Therefore, by performing exposure to a substrate to which a resist is applied using a photomask in which the mask pattern is provided, a small resist pattern can be formed. Moreover, by performing to the photomask using off-axis exposure, a small pattern whose size hardly changes according to focus change can be formed.

Moreover, according to the sixth embodiment, even in the inside corner or another portion of a mask pattern which should have excessive light-shielding effects when the portion is a part of regular complete-light-shielding pattern, light-shielding effects can be reduced by using a semi-light-shielding portion. More specifically, unless a phase shifter for light-shielding effect enhancement is inserted in a portion of a mask pattern in which a light-shielding effect becomes excessive simply according to the outline enhancement method or the center line enhancement method, the generation of unnecessary light-shielding effects can be prevented. Accordingly, if insertion of the phase shifter is limited by utilizing this effect, it can be facilitated to form a pattern having an arbitrary shape as it is desired.

Note that in the sixth embodiment, the case where exposure using a photomask based on the outline enhancement method or the center line enhancement method is performed in a positive resist process has been described. However, needless to say, the present invention is not limited thereto. More specifically, exposure using a photomask based on at least one of the outline enhancement method and the center line enhancement method may be performed in the positive resist process. Alternatively, exposure using a photomask based on at least one of the outline enhancement method and the center line enhancement method may be performed in a negative resist process. In this case, when the positive resist process is used, a positive resist film which has been irradiated with exposure light is developed to remove part of the positive resist film other than part thereof corresponding to a mask pattern. In this manner, a resist pattern having the same shape as that of the mask pattern can be formed. When a negative resist process is used, a negative resist film which has been irradiated with exposure light is developed to remove part of the negative resist film corresponding to a mask pattern. Thus, a resist pattern having an opening with the same shape as that of the mask pattern can be formed.

The invention claimed is:

1. A method for forming a pattern using a photomask in which, on a transparent substrate having light transmitting properties with respect to exposure light, a mask pattern having a semi-light shielding portion and a phase shifter, and a light-transmitting portion where the mask pattern is not located are provided, characterized by comprising the steps of:
    forming a resist film on a substrate;
    irradiating the resist film with the exposure light through the photomask; and
    developing the resist film which has been irradiated with the exposure light to form a resist pattern,
    wherein in the photomask, the semi-light shielding portion has a transmittance which allows the exposure light to be partially transmitted, and transmits the exposure light in the same phase as that of the light-transmitting portion,
    the phase shifter transmits the exposure light in a phase opposite to that of the light-transmitting portion,
    the mask pattern is provided so as to surround the light-transmitting portion,
    the phase shifter is formed in a ring-shape around the light-transmitting portion, and the outline of the ring-shaped phase shifter is similar to the outline of the light-transmitting portion.

2. The method for forming a pattern of claim 1, characterized in that the phase shifter of the photomask is provided in contact with the light-transmitting portion.

3. The method for forming a pattern of claim 1, characterized in that the phase shifter of the photomask is provided apart from the light-transmitting portion, and
    a ring-shaped part of the semi-light shielding portion is formed between the light-transmitting portion and the phase shifter.

4. A method for forming a pattern using a photomask in which, on a transparent substrate having light transmitting properties with respect to exposure light, a mask pattern having a semi-light shielding portion and a phase shifter, and a light-transmitting portion where the mask pattern is not located are provided, characterized by comprising the steps of:
    forming a resist film on a substrate;
    irradiating the resist film with the exposure light through the photomask; and
    developing the resist film which has been irradiated with the exposure light to form a resist pattern,
    wherein in the photomask, the semi-light shielding portion has a transmittance which allows the exposure light to be partially transmitted, and transmits the exposure light in the same phase as that of the light-transmitting portion,
    the phase shifter transmits the exposure light in a phase opposite to that of the light-transmitting portion,
    the mask pattern is provided so as to surround the light-transmitting portion, and
    the phase shifter is composed of a plurality of phase shifter portions formed in the periphery of the light-transmitting portion.

5. The method for forming a pattern of claim 4, characterized in that
    the light-transmitting portion of the photomask is formed in a quadrangular shape, and
    the phase shifter of the photomask is composed of four quadrangular phase shifter portions respectively formed in the vicinity of an associated side of the light-transmitting portion.

6. The method for forming a pattern of claim 4, characterized in that the each phase shifter portion of the photomask is formed in contact with the associated side of the light-transmitting portion.

7. The method for forming a pattern of claim 4, characterized in that
    the light-transmitting portion of the photomask is formed in a quadrangular shape, and
    the phase shifter of the photomask is composed of four quadrangular phase shifter portions each having the same length as an associated side of the light-transmitting portion, and is formed in contact with each associated side of the light-transmitting portion.

8. The method for forming a pattern of claim 4, characterized in that
    the light-transmitting portion of the photomask is formed in a quadrangular shape, and
    the phase shifter of the photomask is composed of four quadrangular phase shifter portions each having a length shorter than an associated side of the light-transmitting portion, and is formed in contact with each associated side of the light-transmitting portion.

9. The method for forming a pattern of claim 8, characterized in that the center of the associated side of the light-transmitting portion is aligned with the center of the respective phase shifter portion of the phase shifter formed in contact therewith.

10. The method for forming a pattern of claim 4, characterized in that
the each phase shifter portion of the photomask is formed apart from the associated side of the light-transmitting portion, and
a part of the semi-light shielding portion is formed between the each phase shifter portion and the light-transmitting portion.

11. The method for forming a pattern of claim 4, characterized in that
the light-transmitting portion of the photomask is formed in a quadrangular shape, and
the phase shifter of the photomask is composed of four quadrangular phase shifter portions each having a length longer than an associated side of the light-transmitting portion, and is formed apart from each associated side of the light-transmitting portion.

12. The method for forming a pattern of claim 11, characterized in that
the each phase shifter portion of the phase shifter of the photomask is formed such that a corner is in contact with an associated corner of another phase shifter portion on the diagonal line of the light-transmitting portion, and
a part of the semi-light shielding portion is formed between the phase shifter and the light-transmitting portion.

13. The method for forming a pattern of claim 4, characterized in that
the light-transmitting portion of the photomask is formed in a quadrangular shape,
the phase shifter of the photomask is composed of four quadrangular phase shifter portions each having a length shorter than an associated side of the light-transmitting portion, and is formed apart from each associated side of the light-transmitting portion, and
a part of the semi-light shielding portion is formed between the phase shifter and the light-transmitting portion.

14. The method for forming a pattern of claim 4, characterized in that he light-transmitting portion of the photomask includes a first light-transmitting portion and a second light-transmitting portion,
the mask pattern is provided so as to surround the first light-transmitting portion and the second light-transmitting portion, and
the phase shifter is provided in a center portion of the mask pattern located between the first light-transmitting portion and the second light-transmitting portion, and the semi-light shielding portion is provided in each of both sides of the phase shifter.

15. The method for forming a pattern of claim 14, characterized in that, in the photomask, the space between the first light-transmitting portion and the second light-transmitting, portion is $(0.8 \times \lambda/NA) \times M$ or less (where $\lambda$ is the wavelength of the exposure light, and NA and M are the numerical aperture and reduction ratio of a reduction projection optical system of an exposure apparatus, respectively).

16. The method for forming a pattern of claim 1, characterized in that, in the photomask, the width of the phase shifter is $(0.4 \times \lambda/NA) \times M$ or less.

17. The method for forming a pattern of claim 1, characterized in that, in the photomask, the transmittance of the semi-light-transmitting portion with respect to the exposure light is 15% or less.

18. The method for forming a pattern of claim 1, characterized in that, in the photomask, the transmittance of the semi-light-transmitting portion with respect to the exposure light is 6% or more and 15% or less.

19. The method for forming a pattern of claim 1, characterized in that the semi-light-shielding portion of the photomask transmits the exposure light with a phase difference of $(-30+360 \times n)$ degrees or more and $(30+360 \times n)$ degrees or less (where n=an integer) with respect to light transmitted through the light-transmitting portion and the phase shifter of the photomask transmits the exposure light with a phase difference of $(150+360 \times n)$ degrees or more and $(210+360 \times n)$ degrees or less (where n=an integer) with respect to light transmitted through the light-transmitting portion.

20. The method for forming a pattern of claim 1, characterized in that the phase shifter of the photomask is disposed in a region of the mask pattern extending from the boundary with the light-transmitting portion by a distance of $(0.8 \times \lambda/NA) \times M$ or less (where $\lambda$ is the wavelength of the exposure light, and NA and M are the numerical aperture and reduction ratio of a reduction projection optical system of an exposure apparatus, respectively).

21. The method for forming a pattern of claim 1, characterized in that the width of the phase shifter of the photomask is $(0.3 \times \lambda/NA) \times M$ or less (where $\lambda$ is the wavelength of the exposure light, and NA and M are the numerical aperture and reduction ratio of a reduction projection optical system of an exposure apparatus, respectively).

22. The method for forming a pattern of claim 1, characterized in that
the light-transmitting portion of the photomask is an exposed region of the surface of the transparent substrate,
the phase shifter of the photomask is a region in which a first phase shifter, which transmits the exposure light in a phase opposite to that of the light-transmitting portion, is formed on the transparent substrate, and
the semi-light shielding portion of the photomask is a region in which a multilayer film composed of the first phase shifter and a second phase shifter, which transmits the exposure light in a phase opposite to that of the first phase shifter, is formed on the transparent substrate.

23. The method for forming a pattern of claim 1, characterized in that
the light-transmitting portion of the photomask is an exposed region of the surface of the transparent substrate,
the phase shifter of the photomask is a region dug to a predetermined depth in the transparent substrate such that exposure light is transmitted in a phase opposite to that of the light-transmitting portion, and
the semi-light shielding portion of the photomask is a region in which a semi-light shielding film, which transmits the exposure light in the same phase as that of the light-transmitting portion, is formed on the transparent substrate.

24. The method for forming a pattern of claim 1, characterized in that
the phase shifter of the photomask is an exposed region of the surface of the transparent substrate,
the light-transmitting portion of the photomask is a region dug to a predetermined depth in the transparent substrate such that exposure light is transmitted in a phase opposite to that of the phase shifter, and
the semi-light shielding portion of the photomask is a region in which a phase shifter film, which transmits the exposure light a phase opposite to that of the phase shifter, is formed on the transparent substrate.

25. The method for forming a pattern of claim 1, characterized in that the light-transmitting portion of the photomask is an exposed region of the surface of the transparent substrate, the phase shifter of the photomask is a region dug to a predetermined depth in the transparent substrate such that exposure light is transmitted in a phase opposite to that of the light-transmitting portion, and the semi-light shielding portion of the photomask is a region in which a thinned light-shielding film, which transmits the exposure light in the same phase as that of the light-transmitting portion, is formed on the transparent substrate.

26. The method for forming a pattern of claim 1, characterized in that the light-transmitting portion of the photomask is an exposed region of the surface of the transparent substrate, the semi-light shielding portion of the photomask is a region in which a semi-light shielding film, which transmits the exposure light in the same phase as that of the light-transmitting portion, is formed on the transparent substrate, and the phase shifter of the photomask is a region dug to a predetermined depth in the semi-light shielding film such that exposure light is transmitted in a phase opposite to that of the light-transmitting portion.

27. The method for forming a pattern of claim 1, characterized in that the light-transmitting portion of the photomask is an exposed region of the surface of the transparent substrate, the semi-light shielding portion of the photomask is a region in which a semi-light shielding film, which transmits the exposure light in the same phase as that of the light-transmitting portion, is formed on the transparent substrate, and the phase shifter of the photomask is a region in which a multilayer film composed of the semi-light shielding film and a phase shifter film, which transmits the exposure light in a phase opposite to that of the light-transmitting portion, is formed on the transparent substrate.

28. The method for forming a pattern of claim 1, characterized in that in the step of irradiating the exposure light, an off-axis illumination method is used.

29. The method for forming a pattern of claim 4, characterized in that, in the photomask, the transmittance of the semi-light-transmitting portion with respect to the exposure light is 15% or less.

30. The method for forming a pattern of claim 4, characterized in that, in the photomask, the transmittance of the semi-light-transmitting portion with respect to the exposure light is 6% or more and 15% or less.

31. The method for forming a pattern of claim 4, characterized in that the semi-light-shielding portion of the photomask transmits the exposure light with a phase difference of $(-30+360\times n)$ degrees or more and $(30+360\times n)$ degrees or less (where n=an integer) with respect to light transmitted through the light-transmitting portion and the phase shifter of the photomask transmits the exposure light with a phase difference of $(150+360\times n)$ degrees or more and $(210+360\times n)$ degrees or less (where n=an integer) with respect to light transmitted through the light-transmitting portion.

32. The method for forming a pattern of claim 4, characterized in that the phase shifter of the photomask is disposed in a region of the mask pattern extending from the boundary with the light-transmitting portion by a distance of $(0.8\times\lambda/NA)\times M$ or less (where $\lambda$ is the wavelength of the exposure light, and NA and M are the numerical aperture and reduction ratio of a reduction projection optical system of an exposure apparatus, respectively).

33. The method for forming a pattern of claim 4, characterized in that the width of the phase shifter of the photomask is $(0.3\times\lambda/NA)\times M$ or less (where $\lambda$ is the wavelength of the exposure light, and NA and M are the numerical aperture and reduction ratio of a reduction projection optical system of an exposure apparatus, respectively).

34. The method for forming a pattern of claim 4, characterized in that the light-transmitting portion of the photomask is an exposed region of the surface of the transparent substrate, the phase shifter of the photomask is a region in which a first phase shifter, which transmits the exposure light in a phase opposite to that of the light-transmitting portion, is formed on the transparent substrate, and the semi-light shielding portion of the photomask is a region in which a multilayer film composed of the first phase shifter and a second phase shifter, which transmits the exposure light in a phase opposite to that of the first phase shifter, is formed on the transparent substrate.

35. The method for forming a pattern of claim 4, characterized in that the light-transmitting portion of the photomask is an exposed region of the surface of the transparent substrate, the phase shifter of the photomask is a region dug to a predetermined depth in the transparent substrate such that exposure light is transmitted in a phase opposite to that of the light-transmitting portion, and the semi-light shielding portion of the photomask is a region in which a semi-light shielding film, which transmits the exposure light in the same phase as that of the light-transmitting portion, is formed on the transparent substrate.

36. The method for forming a pattern of claim 4, characterized in that the phase shifter of the photomask is an exposed region of the surface of the transparent substrate, the light-transmitting portion of the photomask is a region dug to a predetermined depth in the transparent substrate such that exposure light is transmitted in a phase opposite to that of the phase shifter, and the semi-light shielding portion of the photomask is a region in which a phase shifter film, which transmits the exposure light a phase opposite to that of the phase shifter, is formed on the transparent substrate.

37. The method for forming a pattern of claim 4, characterized in that the light-transmitting portion of the photomask is an exposed region of the surface of the transparent substrate, the phase shifter of the photomask is a region dug to a predetermined depth in the transparent substrate such that exposure light is transmitted in a phase opposite to that of the light-transmitting portion, and the semi-light shielding portion of the photomask is a region in which a thinned light-shielding film, which transmits the exposure light in the same phase as that of the light-transmitting portion, is formed on the transparent substrate.

38. The method for forming a pattern of claim 4, characterized in that
- the light-transmitting portion of the photomask is an exposed region of the surface of the transparent substrate,
- the semi-light shielding portion of the photomask is a region in which a semi-light shielding film, which transmits the exposure light in the same phase as that of the light-transmitting portion, is formed on the transparent substrate, and
- the phase shifter of the photomask is a region dug to a predetermined depth in the semi-light shielding film such that exposure light is transmitted in a phase opposite to that of the light-transmitting portion.

39. The method for forming a pattern of claim 4, characterized in that
- the light-transmitting portion of the photomask is an exposed region of the surface of the transparent substrate,
- the semi-light shielding portion of the photomask is a region in which a semi-light shielding film, which transmits the exposure light in the same phase as that of the light-transmitting portion, is formed on the transparent substrate, and
- the phase shifter of the photomask is a region in which a multilayer film composed of the semi-light shielding film and a phase shifter film, which transmits the exposure light in a phase opposite to that of the light-transmitting portion, is formed on the transparent substrate.

40. The method for forming a pattern of claim 4, characterized in that in the step of irradiating the exposure light, an off-axis illumination method is used.

* * * * *